US008743917B2

(12) United States Patent
Furuya et al.

(10) Patent No.: US 8,743,917 B2
(45) Date of Patent: Jun. 3, 2014

(54) WAVELENGTH CONVERSION LIGHT SOURCE, OPTICAL ELEMENT AND IMAGE DISPLAY DEVICE

(75) Inventors: Hiroyuki Furuya, Fukuoka (JP); Tomoya Sugita, Nara (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 13/201,092

(22) PCT Filed: Dec. 10, 2010

(86) PCT No.: PCT/JP2010/007180
§ 371 (c)(1),
(2), (4) Date: Aug. 11, 2011

(87) PCT Pub. No.: WO2011/074215
PCT Pub. Date: Jun. 23, 2011

(65) Prior Publication Data
US 2011/0317727 A1    Dec. 29, 2011

(30) Foreign Application Priority Data

Dec. 14, 2009 (JP) .................................. 2009-282492
Mar. 16, 2010 (JP) .................................. 2010-59032
Jul. 26, 2010 (JP) .................................. 2010-166750

(51) Int. Cl.
H01S 3/10       (2006.01)
H01S 3/091      (2006.01)
H01S 3/094      (2006.01)

(52) U.S. Cl.
USPC ................................ 372/22; 372/21; 372/75

(58) Field of Classification Search
CPC . H01S 3/0602; H01S 3/0617; H01S 3/09415; H01S 3/109; H01S 3/1611
USPC ................................ 372/21–22; 359/326, 328
See application file for complete search history.

(56) References Cited

U.S. PATENT DOCUMENTS 5,245,618 A * 9/1993 Masuda et al. .................. 372/22
5,321,711 A * 6/1994 Rapoport et al. ............... 372/41
(Continued)

FOREIGN PATENT DOCUMENTS

GB    2 259 603    3/1993
JP    4-30486      2/1992
(Continued)

OTHER PUBLICATIONS

International Search Report issued Mar. 15, 2011 in International (PCT) Application No. PCT/JP2010/007180.
(Continued)

Primary Examiner — Armando Rodriguez
Assistant Examiner — Sean Hagan
(74) Attorney, Agent, or Firm — Wenderoth, Lind & Ponack, L.L.P.

(57) ABSTRACT

A wavelength conversion laser light source, including a solid-state laser medium configured to generate fundamental light; a wavelength conversion element configured to convert the fundamental light into second harmonic light which has a higher frequency than the fundamental light; and a conductive material in contact with the wavelength conversion element, wherein the wavelength conversion element includes a polarization inverted structure formed with a polarization inversion region, and a first lateral surface which perpendicularly intersects with the polarization inversion region, and the conductive material is in contact with the first lateral surface.

3 Claims, 50 Drawing Sheets

(56) References Cited

U.S. PATENT DOCUMENTS

| | | | |
|---|---|---|---|
| 5,365,539 A * | 11/1994 | Mooradian | 372/75 |
| 5,424,867 A * | 6/1995 | Nihei et al. | 359/326 |
| 5,574,740 A | 11/1996 | Hargis et al. | |
| 5,610,934 A * | 3/1997 | Zarrabi | 372/70 |
| 5,981,360 A | 11/1999 | Rabarot et al. | |
| 7,082,150 B2 | 7/2006 | Momiuchi | |
| 7,593,439 B2 | 9/2009 | Georges | |
| 7,769,060 B1 | 8/2010 | Furuya et al. | |
| 2004/0052286 A1 | 3/2004 | Momiuchi | |
| 2007/0014320 A1 | 1/2007 | Georges | |
| 2007/0121689 A1 * | 5/2007 | Brown | 372/39 |
| 2008/0317072 A1 | 12/2008 | Essaian et al. | |
| 2009/0257463 A1 * | 10/2009 | Kusukame et al. | 372/22 |
| 2010/0150186 A1 | 6/2010 | Mizuuchi et al. | |
| 2010/0238959 A1 * | 9/2010 | Yokoyama et al. | 372/22 |
| 2010/0303120 A1 | 12/2010 | Yamamoto et al. | |

FOREIGN PATENT DOCUMENTS

| | | |
|---|---|---|
| JP | 5-67824 | 3/1993 |
| JP | 5-129699 | 5/1993 |
| JP | 6-222229 | 8/1994 |
| JP | 6-242479 | 9/1994 |
| JP | 6-289347 | 10/1994 |
| JP | 2574594 | 10/1996 |
| JP | 2574606 | 10/1996 |
| JP | 9-502054 | 2/1997 |
| JP | 10-31142 | 2/1998 |
| JP | 10-65261 | 3/1998 |
| JP | 11-31860 | 2/1999 |
| JP | 2000-133863 | 5/2000 |
| JP | 2000-357834 | 12/2000 |
| JP | 2001-210895 | 8/2001 |
| JP | 2002-528920 | 9/2002 |
| JP | 2004-111542 | 4/2004 |
| JP | 2007-508686 | 4/2007 |
| JP | 2007-225786 | 9/2007 |
| JP | 2008-16833 | 1/2008 |
| JP | 2008-102228 | 5/2008 |
| JP | 2010-219319 | 9/2010 |
| JP | 2010-267890 | 11/2010 |
| WO | 00/25397 | 5/2000 |
| WO | 2007/013608 | 2/2007 |
| WO | 2007/032402 | 3/2007 |
| WO | 2009/028078 | 3/2009 |

OTHER PUBLICATIONS

Sten Helmfrid et al., "Stable single-mode operation of intracavity-doubled diode-pumped Nd:YVO$_4$ lasers: theoretical study", Journal of Optical Society of America B, vol. 11, No. 3, Mar. 1994, pp. 436-445.

N. MacKinnon et al., "A laser diode array pumped, Nd:YVO$_4$/KTP, composite material microchip laser", Optics Communications 105 (1994), pp. 183-187.

* cited by examiner

FIG. 2
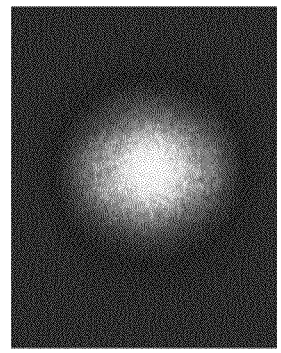
(3)
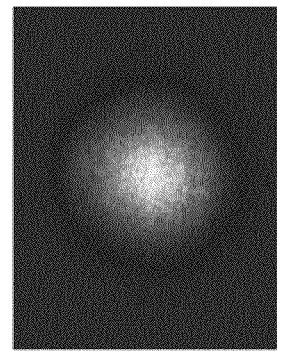
(2)
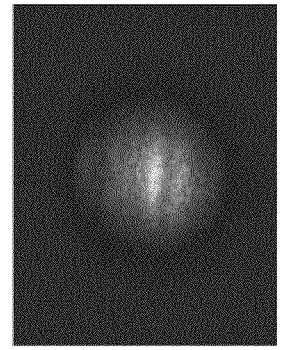
(1)

FIG. 6

RELATIONSHIP BETWEEN RESISTIVITY AND
OUTPUT DETERIORATION INHIBITORY EFFECT

| MATERIAL | RESISTIVITY | OUTPUT DETERIORATION INHIBITORY EFFECT<br>*OUTPUT DETERIORATES BY 1% OR MORE AFTER 100 HOURS: YES: ×  NO: ○ |
|---|---|---|
| SILVER PASTE (DOTITE D-550) | $8.0 \times 10^{-5}$ Ω·cm | × |
| Ta (SPUTTERED FILM) | $13.1 \times 10^{-6}$ Ω·cm | × |
| Pd (SPUTTERED FILM) | $10.6 \times 10^{-6}$ Ω·cm | × |
| In (CONTACT) | $8.75 \times 10^{-6}$ Ω·cm | ○ |
| Al (SPUTTERED FILM) | $2.74 \times 10^{-6}$ Ω·cm | ○ |
| Au (SPUTTERED FILM) | $2.20 \times 10^{-6}$ Ω·cm | ○ |
| Cu (CONTACT) | $1.70 \times 10^{-6}$ Ω·cm | ○ |

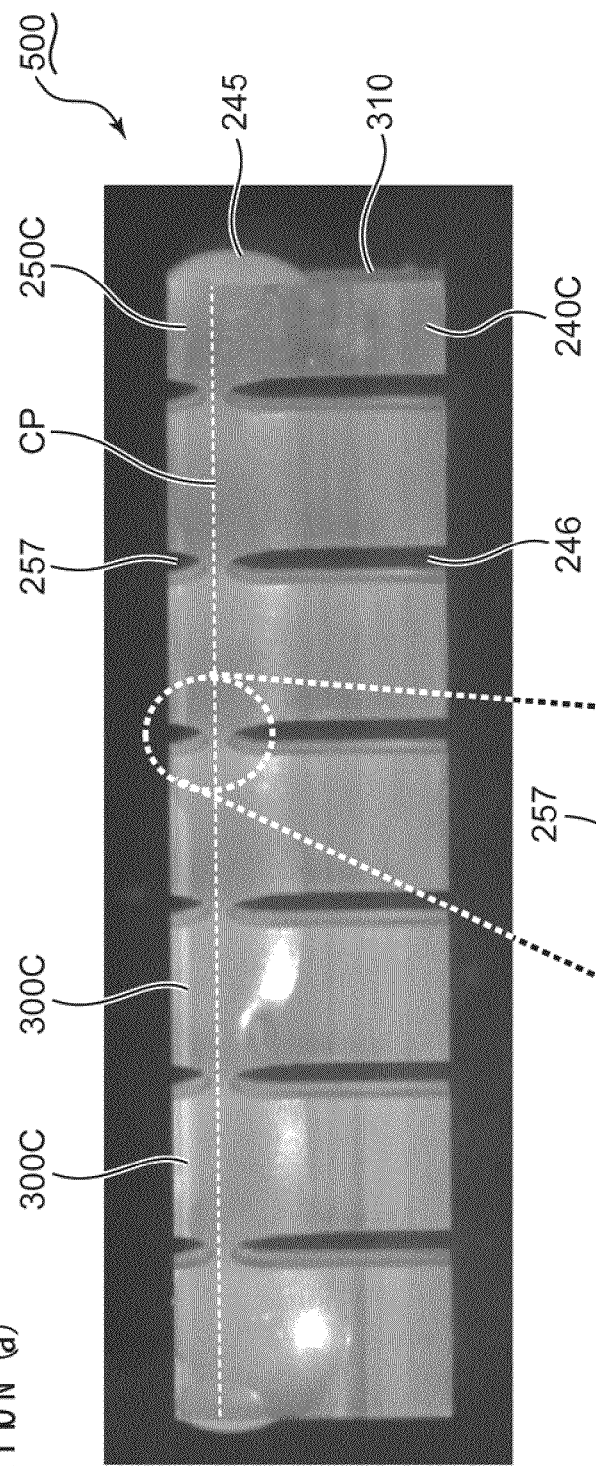
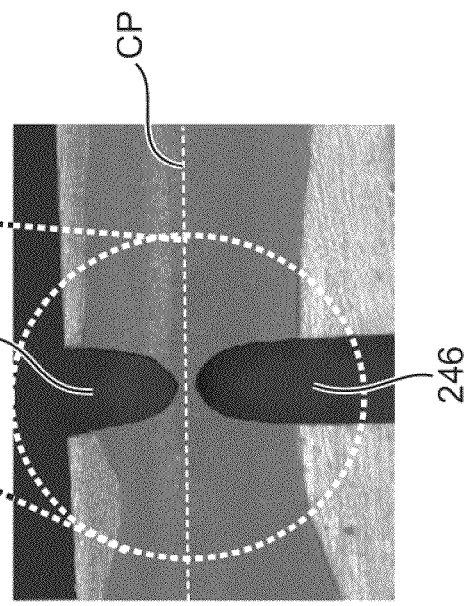
FIG. 22

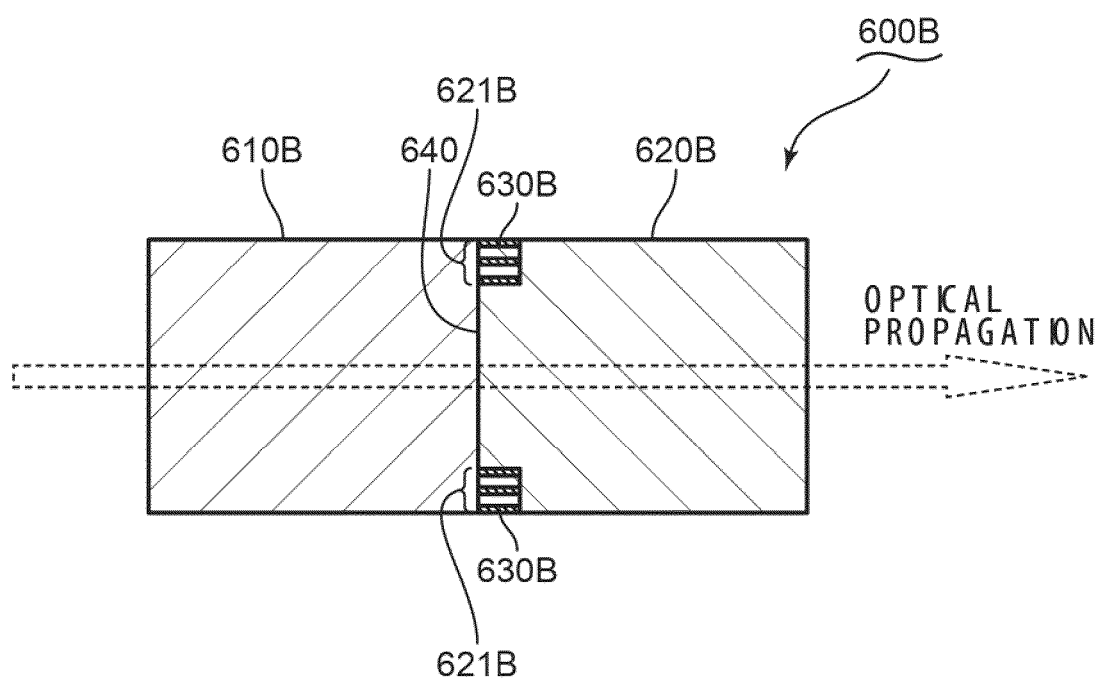

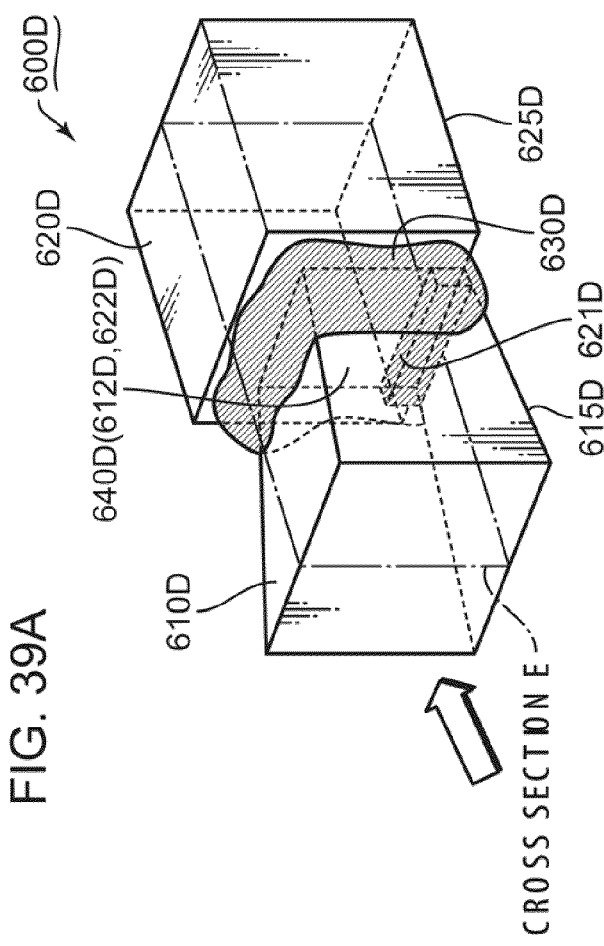
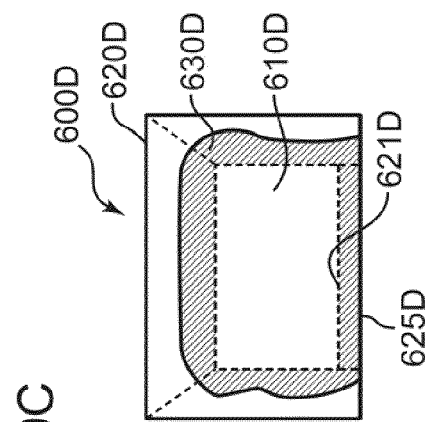
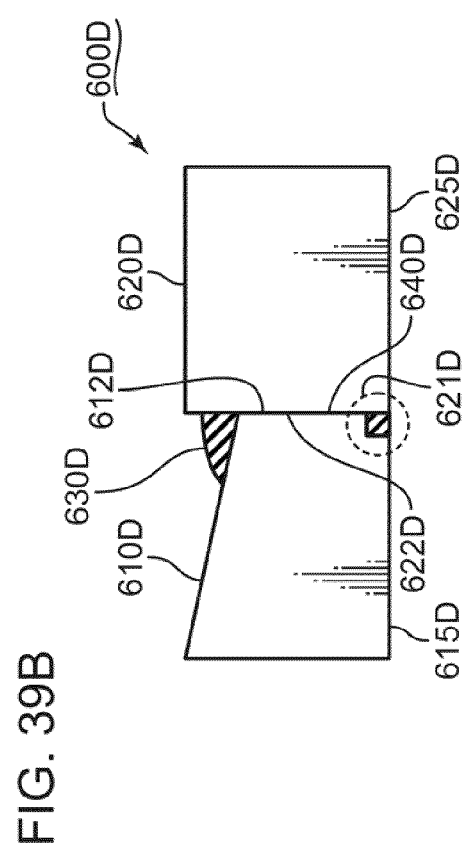
FIG. 39A
FIG. 39C
FIG. 39B

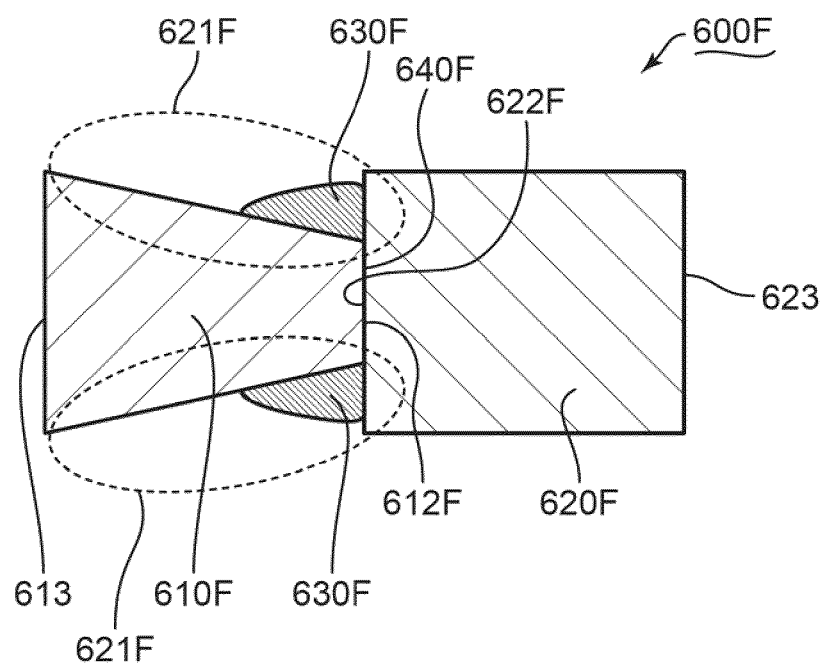

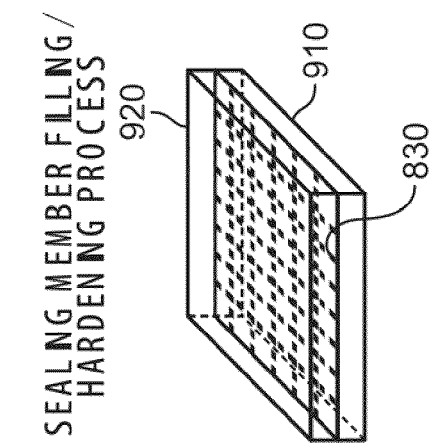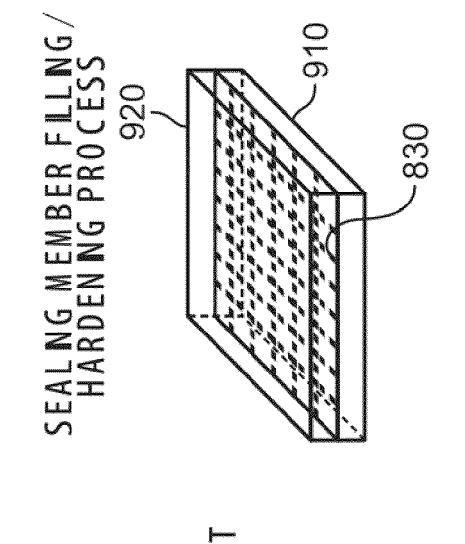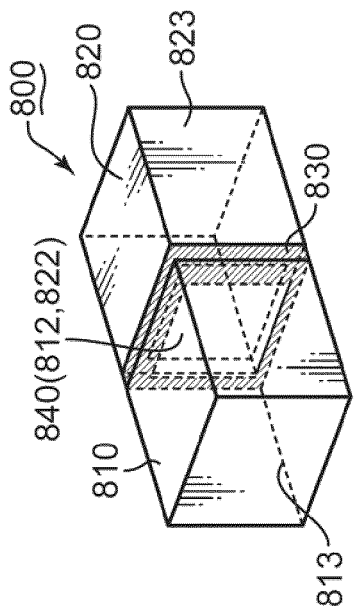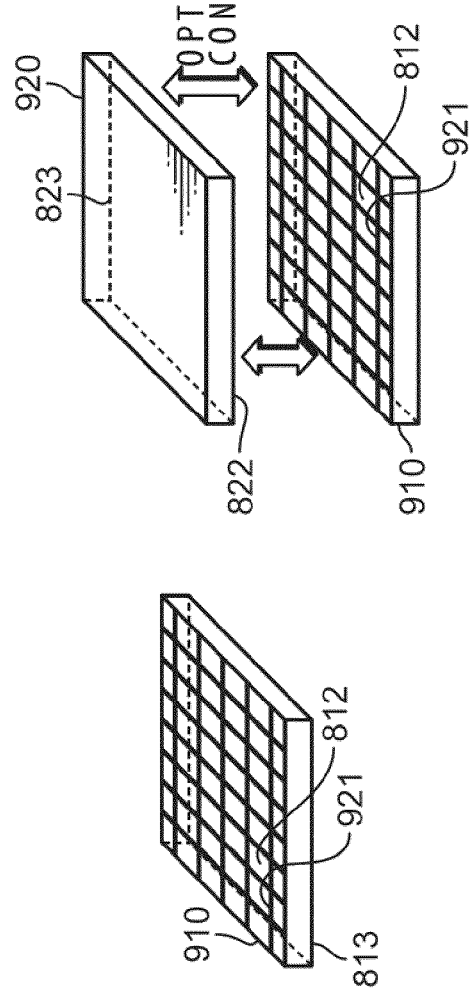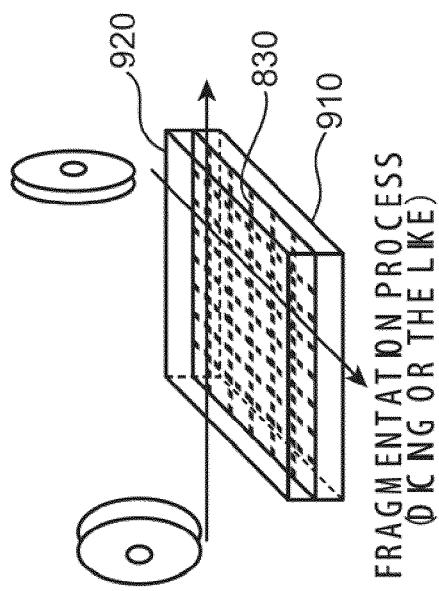

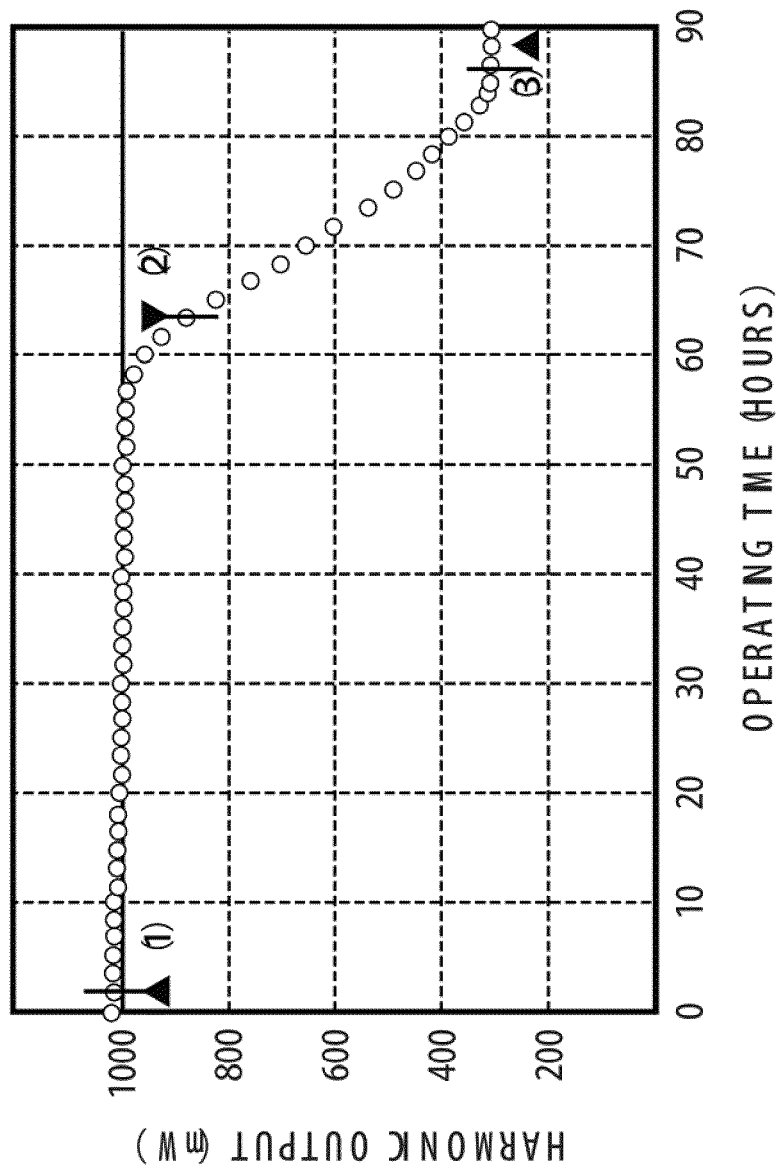

US 8,743,917 B2

WAVELENGTH CONVERSION LIGHT SOURCE, OPTICAL ELEMENT AND IMAGE DISPLAY DEVICE

TECHNICAL FIELD

The present invention is related to a wavelength conversion laser device which performs wavelength conversion on a laser beam emitted from a laser light source on the basis of a nonlinear optical effect.

BACKGROUND ART

Various wavelength conversion laser light sources have been developed and put into practice to obtain visible laser beams and ultraviolet laser beams. This kind of wavelength conversion laser light sources converts light emitted from Nd:YAG laser or Nd:YVO$_4$ laser into visible green light, for example, on the basis of wavelength conversion employing the nonlinear optical effect. Alternatively, the wavelength conversion laser light source further converts the converted green light into ultraviolet light. The aforementioned visible and ultraviolet lasers are used, for example, in laser process for materials or as a light source of a laser display device.

This kind of laser light sources includes a solid-state laser medium such as Nd:YVO$_4$ and a wavelength conversion element such as lithium niobate. Patent Documents 1 to 3 propose a microchip type wavelength conversion laser light source (optical contact-type wavelength conversion laser light source) comprising a solid-state laser medium and a wavelength conversion element, which are optically bonded without adhesive. A microchip type wavelength conversion laser light source outputs approximately 10 mW at maximum. The microchip type wavelength conversion laser light source is used, for example, as a light source of a laser pointer and a collimator.

The microchip type wavelength conversion laser light source of Patent Document 1 aims to improve production yield in optical bonding processes between the solid-state laser medium and the wavelength conversion element. To achieve the objective, Patent Document 1 proposes enlargement of the bonding area between the solid-state laser medium and the wavelength conversion element.

The microchip type wavelength conversion laser light source of Patent Document 2 comprises an optical thin film disposed at the interface between the solid-state laser medium and the wavelength conversion element. Patent Document 2 proposes a method for bonding the solid-state laser medium with the wavelength conversion element to inhibit light scattering. According to the prior art documents, it is necessary to reduce, as much as possible, scattering and losses of light which propagates through the interface (bonding surface) between the solid-state laser medium and the wavelength conversion element.

If a laser beam is incident for long hours to an optical element, which is formed by combining the solid-state laser medium with the wavelength conversion element, output of the laser beam from the optical element goes down over time.

FIG. 50 is a plot diagram showing problems on the output declination of the aforementioned laser beam. The output declination of the laser beam is described with reference to FIG. 50.

The vertical axis of the plot diagram of FIG. 50 shows laser output intensity (harmonic output) from the optical element. The horizontal axis of the plot diagram of FIG. 50 shows driving time of the optical element. FIG. 50 shows characteristics of an optical element comprising a solid-state laser element and a wavelength conversion element in optical contact. The optical element used for obtaining the plot diagram of FIG. 50 converts a wavelength of an externally input excitation laser beam to output a green laser beam.

According to the plot diagram of FIG. 50, the output declination of the green laser occurs several ten hours after the start of green laser beam emission from the optical element. It is less likely that the output declination of the emitted light is observed if the output of the laser beam subjected to the wavelength conversion is approximately 100 mW. If the optical element emits light with a peak output of 500 mW or more (in particular 1000 mW or more), it is confirmed that there is considerable output declination.

Patent Document 1: Japanese Unexamined Patent Application Publication No. 2008-102228
Patent Document 2: Japanese Unexamined Patent Application Publication No. 2008-16833
Patent Document 3: Japanese Unexamined Patent Application Publication No. 2000-357834

SUMMARY OF THE INVENTION

An object of the present invention is to provide an optical element for inhibiting the output declination of a laser beam caused by the prolonged operation of the optical element, a wavelength conversion laser light source with the optical element, and an image display device with the wavelength conversion light source.

A wavelength conversion laser light source according to one aspect of the present invention comprises a solid-state laser medium configured to generate fundamental light; a wavelength conversion element configured to convert the fundamental light into second harmonic light which has a higher frequency than the fundamental light; and a conductive material in contact with the wavelength conversion element, wherein the wavelength conversion element includes a polarization inverted structure formed with a polarization inversion region, and a first lateral surface which perpendicularly intersects with the polarization inversion region, and the conductive material is in contact with the first lateral surface.

An optical element according to another aspect of the present invention comprises a solid-state laser medium configured to generate fundamental light; and a wavelength conversion element configured to convert the fundamental light into second harmonic light which has a higher frequency than the fundamental light, wherein the solid-state laser medium includes a bonding surface in optical contact with the wavelength conversion element, and an opposite surface which is opposite to the bonding surface, and an area S1 of the bonding surface is greater than an area S2 of the opposite surface.

A wavelength conversion laser light source according to yet another aspect of the present invention comprises an excitation light source configured to emit light; the aforementioned optical element; and a condensing optical element configured to condense the light to the optical element, wherein a rib extending in a polarizing direction of the light is formed on the optical element.

A wavelength conversion laser light source according to yet another aspect of the present invention comprises an excitation light source configured to emit light; the aforementioned optical element; and a condensing optical element configured to condense the light to the optical element, wherein the optical element includes an emitting portion configured to emit a laser beam, and concentration of a laser active substance added to the solid-state laser medium decreases from the excitation light source toward the emitting portion.

An optical element according to yet another aspect of the present invention comprises a first optical member including a first principal plane which is at least partially subjected to mirror polishing; a second optical member including a second principal plane which is in optical contact with the first principal plane by means of hydrogen bonding to form an optical contact surface, which allows transmission of a laser beam; and a sealing member configured to seal the optical contact surface, wherein the second principal plane is at least partially subjected to mirror polishing, a concavity or a notch which is adjacent to a periphery of the optical contact surface is formed on at least one of the first optical member and the second optical member which is formed from a different material from the first optical member, and the sealing member disposed in the concavity or the notch covers the periphery of the optical contact surface.

A wavelength conversion laser light source according to yet another aspect of the present invention comprises an excitation light source configured to emit light; and the aforementioned optical element, wherein the optical contact surface of the optical element functions as an optical window configured to control a laser oscillation lateral mode of the light which propagates through the optical element.

A wavelength conversion laser light source according to yet another aspect of the present invention comprises an excitation light source configured to emit light; and the aforementioned optical element, wherein at least one of the first and second optical members is tapered along a propagation direction of the light, and a perpendicular cross section of the optical member to the propagation direction functions as an optical window configured to control a laser oscillation lateral mode of the light which propagates through the optical element.

The image display device according to yet another aspect of the present invention comprises a modulator configured to modulate the light to form an image; a reflective mirror configured to reflect the light emitted from the modulator; and a controller configured to drive the modulator, wherein the laser light source includes the aforementioned wavelength conversion laser light source.

BRIEF DESCRIPTION OF THE DRAWINGS

FIG. 2 shows photographs of a far field beam shape of output light.

FIG. 6 is a table summarizing types of conductive materials, resistances of the conductive materials, and inhibitory effect against output declination of the laser light source.

FIG. 22 shows photographs of the bar-shaped optical element array.

FIG. 37 schematically shows the cross section C shown in FIG. 36.

FIG. 39A is a schematic perspective view of an optical element comprising a tapered optical member and a right rectangular block-like optical member in optical contact.

FIG. 39B schematically shows the cross section E shown in FIG. 39A.

FIG. 39C shows the optical element viewed from the direction of the arrow in FIG. 39A.

FIG. 44 schematically shows the cross section G shown in FIG. 43.

FIG. 45A schematically shows a process for forming a groove in a first optical member.

FIG. 45B schematically shows a process for creating an optical contact condition between the grooved first optical member and the second optical member.

FIG. 45C schematically shows a process for filling and hardening a sealing member in the grooved portion of the optical contact assembly in an adsorbed condition.

FIG. 45D schematically shows a process for cutting out the optical element by means of a dicing process along the grooved portion to which the sealing member is filled.

FIG. 45E is a perspective view of a fragmented optical element.

FIG. 50 is a plot diagram showing problems on output declination of a laser beam.

DESCRIPTION OF INVENTION

Figure 1:
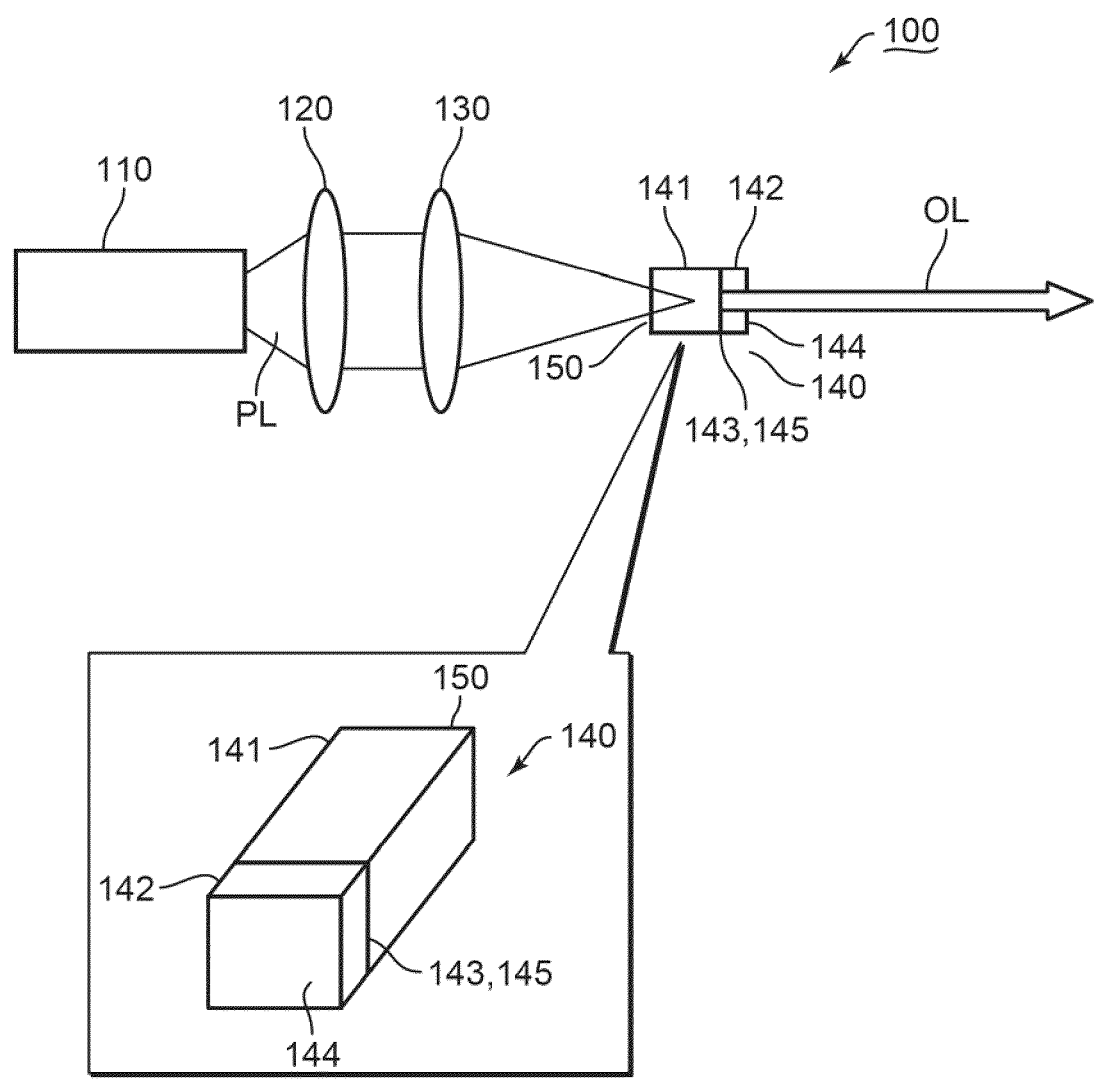
FIG. 1 is a schematic view of a standard optical contact-type wavelength conversion laser light source.

Various embodiments of wavelength conversion laser light sources, optical elements and image display devices are described hereinafter with reference to the accompanying drawings. The same reference numerals are assigned to the same elements in the drawings. Redundant descriptions for the same elements are omitted.

In the ensuing description, a bulk-type wavelength conversion solid-state laser element is exemplified as the wavelength conversion laser light source and/or the optical element. The bulk-type wavelength conversion solid-state laser element is a functional optical element in optical contact. Nd:YVO$_4$ (neodymium-doped yttrium vanadate) crystal and MgO:LiNbO$_3$ (magnesium oxide-doped lithium niobate) crystal (hereinafter referred to as the "MgLN crystal") as a ferroelectric crystal are exemplified as two optical members in optical contact. Nd:YVO$_4$ (neodymium-doped yttrium vanadate) crystal is exemplified as the solid-state laser medium. MgLN crystal is exemplified as the wavelength conversion element. Alternatively, the wavelength conversion laser light source and/or the optical element may be formed from other suitable substances.

FIG. 1 schematically shows a standard optical contact-type wavelength conversion laser light source. Problems on the standard optical contact-type wavelength conversion laser light source are described with reference to FIG. 1.

The optical contact-type wavelength conversion laser light source shown in FIG. 1 is referred to as an end-pumping type (end-pumping type laser). The excitation light is incident to the end surface of a laser medium.

The laser light source 100 shown in FIG. 1 comprises an excitation light source 110, a collimator lens 120, a condenser lens 130, and an optical element 140. The excitation light source 110 irradiates excitation light PL toward the collimator lens 120. The excitation light PL sequentially propagates through the collimator lens 120, the condenser lens 130 and the optical element 140.

The optical element 140 comprises a solid-state laser medium 141 and a wavelength conversion element 142. The optical element to which the excitation light PL is incident emits output light OL.

The laser light source 100 further comprises an optical film 150 formed on the end surface of the solid-state laser medium 141 (end surface to which the excitation light PL is incident). The solid-state laser medium 141 includes a first bonding surface 143 opposite to the end surface on which the optical film 150 is formed. The first bonding surface 143 is bonded to the wavelength conversion element 142.

The wavelength conversion element 142 includes an emitting end surface 144 from which the output light OL is emitted, and a second bonding surface 145 opposite to the emitting end surface 144. The second bonding surface 145 is bonded to the first bonding surface 143. The first bonding surface 143 of the solid-state laser medium 141 is in optical contact with the second bonding surface 145 of the wavelength conversion element 142. The optical element 140 is formed by the first and second bonding surfaces 143, 145, which are in optical contact.

The terminology "optical contact" and alike used in this embodiment and the subsequent various embodiments means "state" which satisfies the following conditions.

(1) A state where the optical elements are mutually bonded directly without interposing an adhesive material such as a resin material.

(2) A state where the optical elements are adsorbed and tightly attached without interposing air space between the optical elements.

If the condition which satisfies the aforementioned states is formed by means of electrical force (van der Waals force), hydrogen bonding or mechanical external pressure between optical elements made of similar materials or dissimilar materials such as optical crystals, ceramics or dielectric films, such condition corresponds to "optical contact".

The description "be in optical contact/been in optical contact" as used hereinafter means a condition under the aforementioned states. The description "create optical contact/optical contact is created" means creating the aforementioned states (means/operation).

The description "optical contact surface" as used hereinafter means an interface between the optical elements under the aforementioned states. The terminology "optical contact assembly" means an assembly which is formed from the optical elements under the aforementioned states.

Functions and operations of the laser light source 100 are described hereinafter.

As described above, the excitation light source 110 emits the excitation light PL. The collimator lens 120 shapes the excitation light PL into parallel light. Subsequently, the condenser lens 130 condenses the light to the solid-state laser medium 141 configuring the optical element 140.

As described above, an optical film 150 is formed on the end surface of the solid-state laser medium 141 to which the excitation light PL is incident. The optical film 150 highly reflects a 1060 nm band of light to function as one resonator mirror. A high-reflection optical film (not shown) is also formed on the emitting end surface 144 of the wavelength conversion element 142. The high-reflection optical film formed on the emitting end surface 144 also highly reflects the 1060 nm band of light to function as the other resonator mirror.

An optical film is not formed at the boundary between the first bonding surface 143 of the solid-state laser medium 141 and the second bonding surface 145 of the wavelength conversion element 142, so that the first and second bonding surfaces 143, 145 are subjected to the optical contact. The optical film 150 (optical reflective film) formed on the end surface of the solid-state laser medium 141 and the optical reflective film formed on the emitting end surface 144 of the wavelength conversion element 142 are used as the resonator mirrors. The 1060 nm band of light is repeatedly reflected and resonated between these high-reflection optical films. Consequently, the optical element 140 functions as the optical resonator to oscillate the 1060 nm band of the laser beam.

As described above, if Nd:YVO$_4$ crystal is used as the solid-state laser medium 141 and MgO:LiNbO$_3$ crystal is used as the wavelength conversion element 142, a difference in refractive index between the solid-state laser medium 141 and the wavelength conversion element 142 becomes no more than 0.1. Consequently, even without an optical thin film between the first and second bonding surfaces 143, 145, the solid-state laser medium 141 and the wavelength conversion element 142 in optical contact may achieve optically low losses. As described above, if the solid-state laser medium 141 and the wavelength conversion element 142 are subjected to optical contact, formation processes for the optical thin films and adjustment processes upon manufacturing the laser light source become simplified.

If the oscillated light of the 1060 nm band passes through the wavelength conversion element 142, the 1060 nm band of light is subjected to wavelength conversion into a 530 nm band of light as a half of the aforementioned wavelength. The 530 nm band of light obtained by the wavelength conversion is emitted as the output light OL from the emitting end surface 144 of the wavelength conversion element 142. It should be noted that the optical element 140 may be held by a laser medium holder (not shown).

The present inventors confirmed that power of the output light OL (laser beam) emitted from the laser light source 100 declined at approximately 80 hours during a continuous lighting test, for example, in which a 530 nm band of light with a peak output of 1 W was continuously emitted by using the laser light source 100 (optical contact-type laser light source) comprising the optical element 140 with the solid-state laser medium 141 and the wavelength conversion element 142 in optical contact.

The aforementioned plot diagram of FIG. 50 shows results of the continuous lighting test. As a result of observing a lateral mode shape of the output light (harmonic) after the wavelength conversion, it was confirmed that the harmonic lateral mode shape, which was approximately circular at the start of lighting the laser light source 100, became distorted over time, and eventually changed into a spindle shape. The output declination of the laser beam was observed after the aforementioned lateral mode change. It may be understood from FIG. 50 showing a relationship between the harmonic output and the operating time that the output declines in response to the change in lateral mode shape.

FIG. 2 shows photographs of a far field beam shape of the output light OL. The photograph corresponding to "(1)" of FIG. 2 shows a harmonic lateral mode shape when the laser light source 100 is started to turn on. The photograph corresponding to "(2)" of FIG. 2 shows a harmonic lateral mode shape 65 hours after the start of lighting the laser light source 100. The photograph corresponding to "(3)" of FIG. 2 shows a harmonic lateral mode shape 85 hours after the start of lighting the laser light source 100. The photographs represented with "(1)", "(2)", "(3)" of FIG. 2 correspond to the operating time shown by symbols "(1)", "(2)", "(3)" in FIG. 50, respectively.

In addition to the optical contact-type laser light source 100 comprising the optical element 140, which included the solid-state laser medium 141 and the wavelength conversion element 142, a similar output declination phenomenon was also observed in a separation or scattered arrangement of optical components (i.e. a laser light source with a resonator formed with a solid-state laser medium, a wavelength conversion element and an output mirror). It should be noted that a declination amount of the laser beam output particularly becomes larger in the optical contact-type laser light source 100. Unless the solid-state laser medium and the wavelength conversion element are in optical contact, the declination amount of the laser beam output becomes approximately ⅓ in comparison to the optical contact-type laser light source 100. Addressing the aforementioned output declination is, however, still required even in a laser light source comprising the solid-state laser medium and the wavelength conversion element, which are not in optical contact.

It is considered that the output declination phenomenon is caused by absorption of the harmonic laser beam (green laser beam of a 530 nm band in the case of the laser light source 100 shown in FIG. 1) into the lithium niobate or lithium tantalite, which is used for the wavelength conversion element 142. Since the absorption of the laser beam into the lithium niobate or lithium tantalate causes local changes in refractive index, it is considered that the wave surface of the fundamental light subjected to laser oscillation is disarranged (beam shape is changed), which in turn, results in declination of output from the laser light source 100. The lithium niobate or lithium tantalite absorbs the laser beam to change power density and beam waist position of the fundamental light in the wavelength conversion element 142. Consequently, the conversion efficiency from the fundamental light to the harmonic light goes down, so that output of the green light also decreases. It is conventionally known that irradiation of visible or ultraviolet light to the lithium niobate or lithium tantalite changes the refractive index ("photoinduced refractive index change"). It is generally known that the "photoinduced refractive index change" may be avoided by adding magnesium oxide (hereinafter referred to as "MgO") as additive to the lithium niobate or lithium tantalate. However it is unknown that prolonged continuous operation at a high output causes the output declination phenomenon. The present inventors figured out the problems that the declination of the laser output was insufficiently inhibited with the method of adding MgO to the wavelength conversion element material, and that high laser output was not maintained for a long period of time.

The optical element, the wavelength conversion laser light source comprising the optical element, and the image display device using the wavelength conversion laser light source described according to the various embodiments hereinafter may appropriately resolve the aforementioned problems. The optical element, the wavelength conversion laser light source comprising the optical element, and the image display device using the wavelength conversion laser light source are described hereinafter.

First Embodiment

Figure 3:
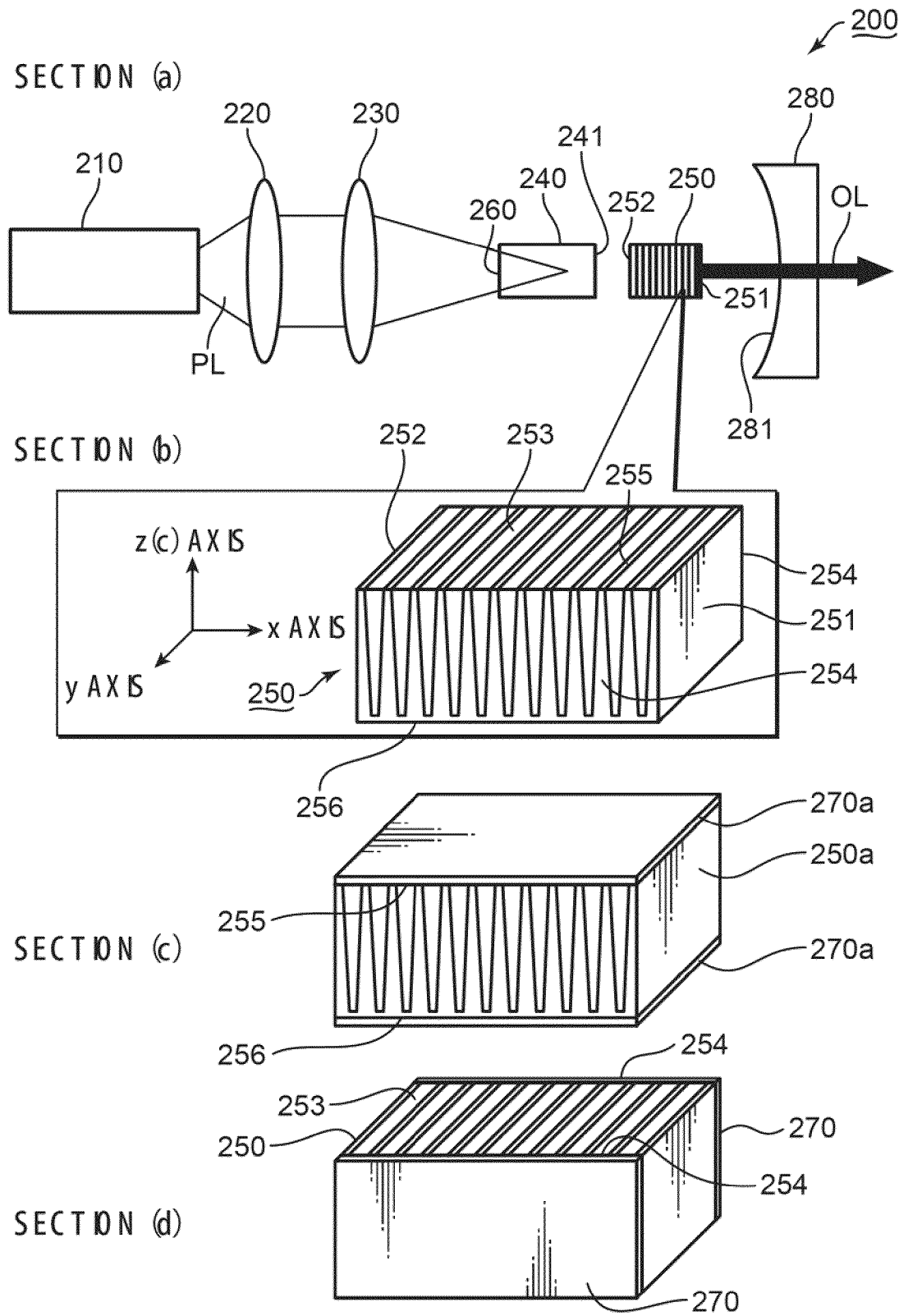
FIG. 3 is a schematic view of a wavelength conversion element and a wavelength conversion laser light source with the wavelength conversion element according to the first embodiment.

FIG. 3 is a schematic view of configurations of a wavelength conversion element and a wavelength conversion laser light source using the wavelength conversion element according to the first embodiment. The wavelength conversion element and the wavelength conversion laser light source are described with reference to FIG. 3.

Section (a) of FIG. 3 schematically shows the laser light source 200. Like the laser light source 100 described with reference to FIG. 1, the excitation light PL is used as an end-pumping laser light source. The excitation light PL is input to the end surface of the solid-state laser medium 240.

The laser light source 200 comprises, an excitation light source 210, a collimator lens 220, a condenser lens 230, a wavelength conversion element 250 and an output mirror 280 in addition to the aforementioned solid-state laser medium 240. The output light OL is emitted from the wavelength conversion element 250 through the output mirror 280. The solid-state laser medium 240 generates fundamental light in response to the incidence of the excitation light PL. The wavelength conversion element 250 converts the fundamental light into second harmonic light which has a higher frequency than the fundamental light.

The laser light source 200 comprises an optical film 260 formed on the incident end surface of the solid-state laser medium 240 to which the excitation light PL is incident. The solid-state laser medium 240 includes a first end surface 241 opposite to the end surface on which the optical film 260 is formed.

The wavelength conversion element 250 includes an emitting end surface 251 from which the second harmonic is emitted, and a second end surface 252 opposite to the emitting end surface 251. The surface (curved surface 281) of the output mirror 280 facing the emitting end surface 251 of the wavelength conversion element 250 is formed in a concave shape.

Section (b) of FIG. 3 is a perspective view schematically showing the wavelength conversion element 250. The wavelength conversion element 250 comprises a periodic polarization inverted structure 253. The polarization inverted structure 253 is formed in the wavelength conversion element 250.

The wavelength conversion element 250 includes a first lateral surface 254 extending between the emitting end surface 251 and the second end surface 252. The polarization inverted structure 253 formed with a polarization inversion region is exposed on the first lateral surface 254, which is parallel to the z axis (c-axis). The first lateral surface 254 perpendicularly intersects with the polarization inversion region. In this embodiment, the polarization inverted structure 253 is exposed on the first lateral surface 254. Alternatively, it may not be necessary that the polarization inverted structure is exposed on the first lateral surface of the wavelength conversion element.

As shown in section (d) of FIG. 3, the laser light source 200 further comprises a conductive material 270. In this embodiment, the conductive material 270 comes in direct contact with the polarization inverted structure 253 exposed on the first lateral surface 254. Alternatively, the conductive material may come in contact with the first lateral surface, on which the polarization inverted structure does not appear.

Functions and operations of the laser light source 200 according to the first embodiment are described.

The excitation light source 210 emits excitation light PL. The collimator lens 220 shapes the excitation light PL into parallel light. The condenser lens 230 condenses the excitation light PL to the solid-state laser medium 240. The processes up to condensing the excitation light PL to the solid-state laser medium 240 are the same as the laser light source 100 described in the context of FIG. 1. The laser light source 200 according to this embodiment, however, comprises a laser resonator formed from separately provided optical components, unlike the laser light source 100 comprising a laser resonator formed with integral optical components.

The optical film 260 formed on the incident end surface of the solid-state laser medium 240 highly reflects the oscillated light of a 1060 nm band and its harmonic light of a 530 nm band. Optical films with antireflection properties are formed on the first end surface 241 (end surface facing the wavelength conversion element 250) of the solid-state laser medium 240, the second end surface 252 of the wavelength conversion element 250, and the emitting end surface 251 of the wavelength conversion element 250. The optical films formed on the first end surface 241, the second end surface 252 and the emitting end surface 251 allow transmission of the oscillated light of 1060 nm band and its harmonic light of a 530 nm band.

An optical film is formed on the curved surface 281 of the output mirror 280 (concave mirror). The optical film formed on the output mirror 280 highly reflects the oscillated light of a 1060 nm band whereas the optical file allows transmission of its harmonic light of a 530 nm band. Consequently, an optical resonator is formed between the optical film 260 formed on the incident end surface of the solid-state laser medium 240 and the output mirror 280. The light of a 1060 nm band is subjected to laser oscillation by means of the aforementioned optical resonator.

Whenever the light of a 1060 nm band subjected to laser oscillation passes through the wavelength conversion element 250, the light of a 1060 nm band is partially subjected to the wavelength conversion to the harmonic light of a 530 nm band. Eventually, the wavelength-converted light is emitted as the output light OL from the output mirror 280 to the outside of the resonator.

As described in the context of FIG. 50, the declination phenomenon of the green output has been confirmed during a long operation of the wavelength conversion laser light source comprising the solid-state laser medium and the wavelength conversion element. It should be noted that charges generated in the wavelength conversion element (for example, lithium niobate) by the photovalic effect are considered to change the lateral mode shape of the laser beam. The generated charges are accumulated around the laser beam to change the refractive index in the wavelength conversion element because of the electro-optic effect, which in turn, changes the lateral mode of the wavelength conversion laser light source.

As shown in section (d) of FIG. 3, the optical element and the laser light source 200 according to this embodiment are characterized by the conductive material 270 which covers the first lateral surface 254 (y plane) perpendicular to the y axis. The conductive material 270 which covers the first lateral surface 254, on which the polarization inverted structure 253 is exposed, efficiently contributes to removal of the accumulated charges in the wavelength conversion element 250.

The wavelength conversion element 250 is further described with reference to FIG. 3.

The wavelength conversion element 250 according to this embodiment includes a periodic polarization inverted structure 253 provided to the lithium niobate. The wavelength conversion element 250 is a quasi phase matching-type wavelength conversion element which generates a second harmonic. It should be noted that magnesium oxide (hereinafter indicated as "MgO") may be added to the material of the wavelength conversion element 250. The addition of magnesium oxide suitably inhibits the aforementioned "photoinduced refractive index change" (change in the refractive index of the wavelength conversion element material).

Section (b) of FIG. 3 is a schematic view of the configuration of the lithium niobate of the periodic polarization inverted structure. The coordinates shown in section (b) of FIG. 3 show the dielectric main axis sensed by the light in the lithium niobate. The z-axis of the dielectric main axis coincides with the c-axis of the crystal axis determined by the crystal structure. The wavelength conversion element 250 with the polarization inverted structure shown in this embodiment is referred to as a "bulk type". The wavelength conversion element 250 comprises a polarization inverted structure 253 in the crystal substrate. During formation of the polarization inverted structure 253, the polarization inverted structure 253 grows in the negative direction of the z-axis coordinates from the plane (z-plane) which is perpendicular to the z-axis (c-axis) to become the structure shown in section (b) of FIG. 3. If the wavelength conversion element 250 is cut at an appropriate perpendicular plane to the y-axis, the periodic polarization inverted structure 253 becomes exposed on the first lateral surface 254 of the wavelength conversion element 250. As described above, the first lateral surface 254 with the polarization inverted structure 253 exposed thereon may be subjected to chemical polishing and/or chemical etching treatment. Consequently, the polarization inverted structure 253 (polarization inverted structure which changes periodically), which becomes visible through a viewing device such as a microscope, is exposed on the plane (y-plane) (first lateral surface 254), which is perpendicular to the y-axis.

Section (c) of FIG. 3 shows a known method for preventing the declination of the laser output caused by the accumulation of electrical charges (pyroelectric effect) on the two surfaces on the z-plane (perpendicular plane to the z-axis (c-axis)). In order to prevent the accumulation of the electrical charges on the two surfaces on the z-plane, a conductive material 270a is disposed along the top and bottom surfaces of the wavelength conversion element 250a.

Unlike the disposition of the conductive material 270a shown in section (c) of FIG. 3, in this embodiment, the conductive material 270 covers the first lateral surface 254 ("y-plane" with the lithium niobate) on which the periodically changing polarization inverted structure 253 is exposed. It should be noted that the "y-plane" on which the conductive material 270 is mounted means a plane that is parallel to the c-axis of the material of the wavelength conversion element 250. The "y-plane" is a plane that is parallel to the polarization inversion axis (polarization direction) of the polarization inverted structure 253. It should be noted that, unless the structure of the wavelength conversion element is a cube (or rectangular block), it is not necessary that the conductive material has to be disposed according to the aforementioned definition. The surface covered by the conductive material merely needs to be substantially perpendicular to the polarization inversion region of the cross section of the polarization inverted structure.

Figure 4:
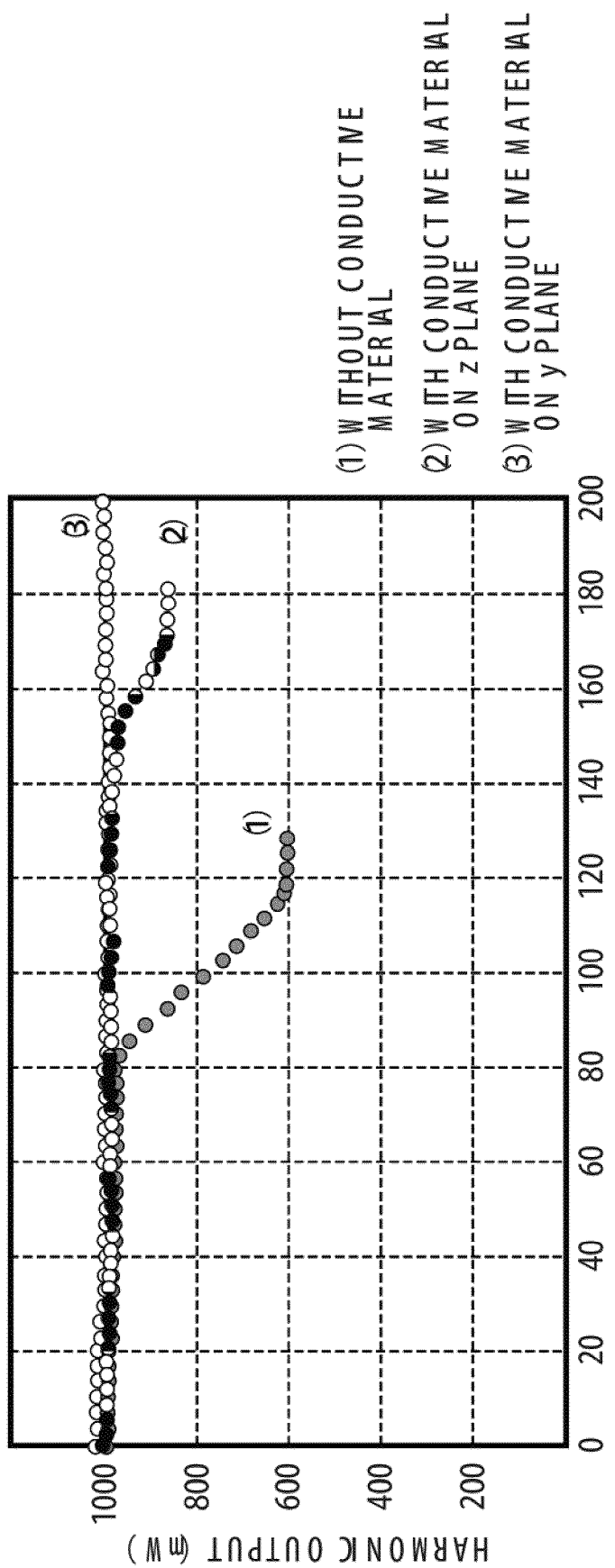
FIG. 4 is a graph showing a relationship between an operating time and a harmonic output of the laser light source.

FIG. 4 is a graph showing a relationship between the operating time and the harmonic output of the laser light source. In FIG. 4, the plot shown with "(1)" shows a relationship between the operating time and the harmonic output of a laser light source without the conductive material. The relationship between the operating time and the harmonic output of the laser light source is described with reference to FIGS. 3 and 4.

In FIG. 4, the plot shown with "(2)" shows a relationship between the operating time and the harmonic output of the laser light source comprising the conductive material 270a (refer to section (c) of FIG. 3) mounted on the "z plane". In FIG. 4, the plot shown with "(3)" shows a relationship between the operating time and the harmonic output of the laser light source 200 comprising the conductive material 270 (refer to section (d) of FIG. 3) mounted on the "y-plane".

<(1) Laser Light Source without Conductive Material>

Unless the conductive material is mounted on the surface of the wavelength conversion element, output from the laser light source starts to decline at approximately 80 hours.

<(2) Laser Light Source with Conductive Material Mounted on "z Plane">

Output from the laser light source comprising the conductive material 270a mounted on the "z-plane" starts to decline at approximately 150 hours. Although improvement is acknowledged in comparison to the laser light source without the conductive material, sufficient improvement may not be obtained with the conductive material 270a mounted on the "z-plane".

<(3) Laser Light Source with Conductive Material Mounted on "y-Plane">

Output from the laser light source 200 comprising the conductive material 270 mounted on the "y-plane" does not decline even after the lapse of 200 hours. Accordingly, it may be understood from the graph shown in FIG. 4 that the conductive material 270 covering the "y-plane" is the most effective to inhibit the output delination.

Figure 5:
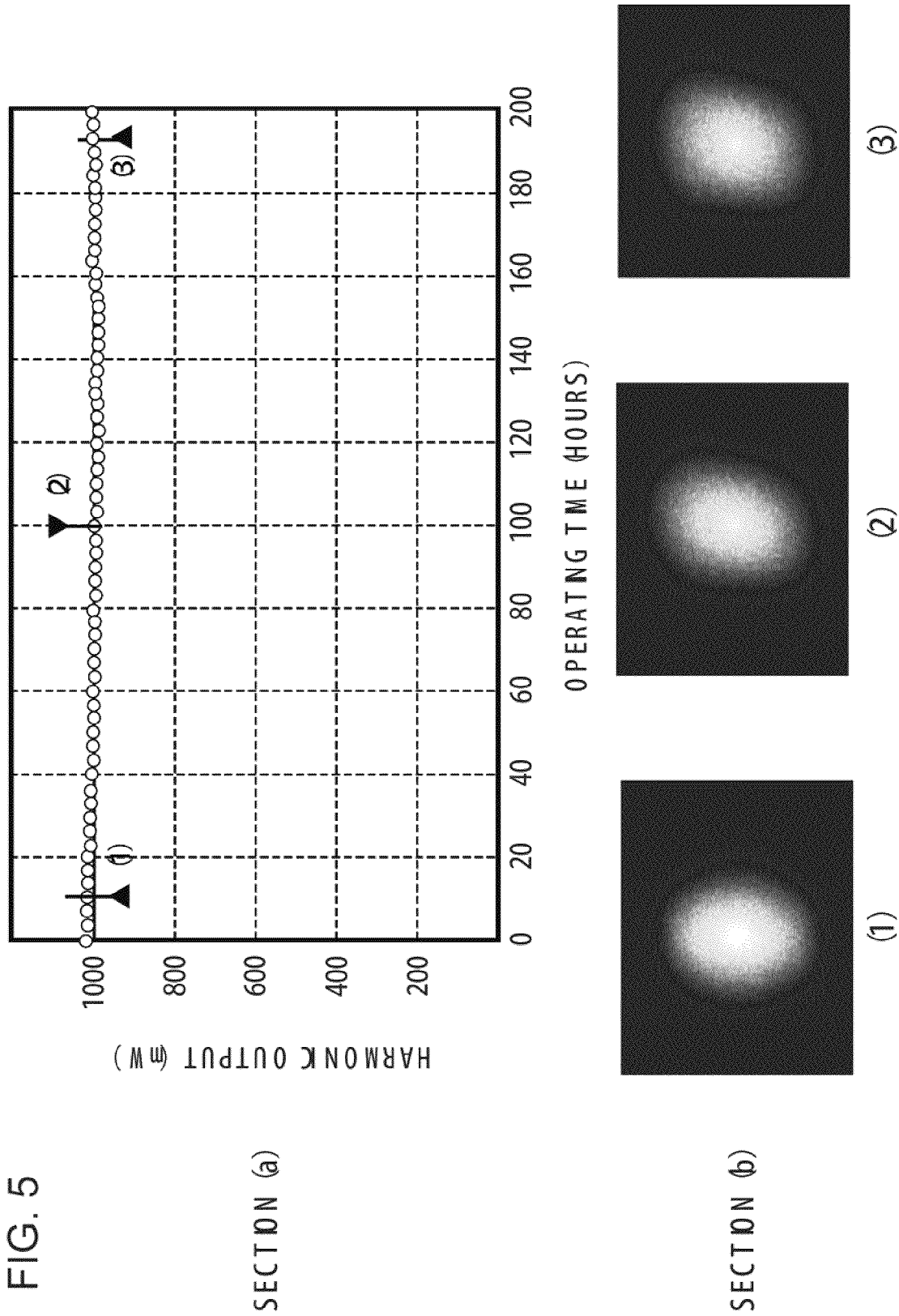
FIG. 5 is a graph representing output change during continuous operation of the laser light source with a conductive material which covers "y plane" of lithium niobate having a polarization inverted structure, and shows photographs representing lateral mode shapes of laser beams emitted from the laser light source during the continuous operation.

FIG. 5 is a graph representing the output change during continuous operation of the laser light source 200 with the conductive material 270 covering the "y-plane" of lithium niobate having the polarization inverted structure 253, and shows photographs representing the lateral mode shape of the laser beam emitted from the laser light source 200 during the continuous operation. Section (a) of FIG. 5 is a graph representing the output change. Section (b) of FIG. 5 is a photograph representing the lateral mode shape of the laser beam. It should be noted that lithium niobate is doped with MgO. The output change of the laser light source 200 and the lateral mode shape of the laser beam are described with reference to FIGS. 3 and 5.

Photograph (1) in section (b) of FIG. 5 corresponding to symbol "(1)" shown in the graph of section (a) of FIG. 5 is a photograph 10 hours after the lighting of the laser light source 200. Photograph (2) in section (b) of FIG. 5 corresponding to symbol "(2)" shown in the graph of section (a) of FIG. 5 is a photograph 100 hours after the lighting of the laser light source 200. Photograph (3) in section (b) of FIG. 5 corresponding to symbol "(3)" shown in the graph of section (a) of FIG. 5 is a photograph 190 hours after the lighting of the laser light source 200.

It may be clear from photographs (1) to (3) of section (b) of FIG. 5 that there is no significant change in the laser shape of the lateral mode. The output change (output declination) from the laser light source 200 during the continuous operation is in 1% after the lapse of 200 hours. Accordingly, it is less likely that the output of the laser light source 200 declines.

The conductive materials which cover the z plane (top and bottom surfaces 255, 256) of the wavelength conversion element 250 are effective against the pyroelectric effect which causes accumulation of the electrical charges on the two surfaces (top and bottom surfaces 255, 256 of the wavelength conversion element 250) along the z-plane. The conductive materials covering the z-plane (top and bottom surfaces 255, 256) of the wavelength conversion element 250 suitably release the electrical charges generated on the z-plane (top and bottom surfaces 255, 256) of the wavelength conversion element 250 to effectively inhibit the output declination of the laser light source 200.

The change in the lateral mode shape of the harmonic light is not caused by the electrical charges generated on the surface of the "z plane" whereas the lateral mode shape of the harmonic light is changed by local electrical charges generated near the polarization inverted boundary (i.e. inside the wavelength conversion element 250) around a beam path passing through the wavelength conversion element 250. Accordingly, the conductive material which merely covers the "z plane" may not sufficiently prevent the change in the lateral mode shape. On the other hand, the conductive material 270 which covers the "y plane" of the wavelength conversion element 250 may sufficiently release the electrical charges in the wavelength conversion element 250 to the outside.

It should be noted that, in this embodiment, the polarization inverted structure 253 does not penetrate from one "z-plane" (top surface 255) to the other "z-plane" (bottom surface 256) of the wavelength conversion element 250. One of the top and bottom surfaces 255, 256 (bottom surface 256 in FIG. 3) along the "z-plane" of the wavelength conversion element 250 is not formed with the polarization inverted structure 253. The surface (bottom surface 256) without the polarization inverted structure 253, and the polarization inverted structure 253 are separated by a given distance.

Since the polarization inverted structure 253 is not penetrated between the "z-planes" (top and bottom surfaces 255, 256), a uniform ratio (duty ratio) of the polarization inversion/non-inversion is maintained during forming the periodic polarization inverted structure 253, so that it becomes more efficient to convert the light of a 1060 nm band to the harmonic light of a 530 nm band. It should be noted that resistance at the interface (inversion wall) of the polarization inversion drops down more than other portions to facilitate flow of charges. Accordingly, unless the polarization inverted structure 253 is penetrated to one z-plane (bottom surface 256 in FIG. 3), the conductive material 270 which covers the "y-plane" may facilitate to draw out the charges accumulated inside the wavelength conversion element 250.

The paired "y planes" (first lateral surfaces 254) covered with the conductive material 270 are parallel to the polarization direction of the polarization inverted structure 253 to intersect with the crystal axis of the wavelength conversion element 250. It is preferable that the paired first lateral surfaces 254 are electrically connected (short-circuited) to appropriately cancel the charges generated inside the wavelength conversion element 250. As long as the "y-plane" (first lateral surface) is covered with the conductive material, the conductive material may have another shape and structure. For example, the conductive material may cover the entire circumferential surface ("z-plane" and "y-plane") of the wavelength conversion element to appropriately cancel the charges generated inside the wavelength conversion element 250. In this embodiment, one of the paired first lateral surfaces 254 is exemplified as the first short-circuiting surface, and the other is exemplified as the second short-circuiting surface.

The present inventors figured out that the inhibitory performance against the output declination of the laser light source 200 depended on the resistance value of the conductive material 270.

FIG. 6 is a table summarizing types of the conductive materials 270, resistances of the conductive materials 270, and inhibitory effect against the output declination of the laser light source 200. A relationship between the type and/or resistivity of the conductive material 270 and the inhibitory effect against the output declination of the laser light source 200 is described with reference to FIGS. 3 and 6. It should be noted that, in the ensuing description, the terminology "output declination" means that the harmonic output decreases by 1% or more during 100 hours of the continuous operation of the laser light source 200.

According to FIG. 6, if the resistance of the conductive material 270 is no more than $10 \times 10^{-5}$ Ω·cm, it becomes less likely that the output of the laser light source 200 declines. Among the conductive materials 270 verified in this embodiment, indium (in contact with the surface (first lateral surface 254) of the wavelength conversion element 250, aluminum (sputtered film), gold (sputtered film) and copper (in contact with the surface (first lateral surface 254) of the wavelength conversion element 250) exhibited preferable inhibitory effects.

If the resistance value of the conductive material 270 is no more than $10 \times 10^{-5}$ Ω·cm, the conductive material 270 may be a metal film formed on the first lateral surface 254 of the wavelength conversion element 250 or a piece of board which is simply in physical contact with the first lateral surface 254 of the wavelength conversion element 250. The conductive material 270 in the form of a metal film attached to the first lateral surface 254 and the conductive material 270 in physical contact with the first lateral surface 254 both exhibit favorable inhibitory effects.

If the wavelength conversion element of the laser light source has a separated/inverted structure, it becomes less likely that the output of the laser light source declines according to the methodologies described in this embodiment. In addition to MgO-doped lithium niobate as the material which may be used for forming a polarization inverted structure, MgO-doped lithium tantalate, MgO-doped lithium niobate of a fixed ratio composition, and MgO-doped lithium tantalate or potassium titanyl phosphate (known as KTP, $KTiOPO_4$) with a fixed ratio composition may be used. The methodologies described in this embodiment may be suitably applied to a wavelength conversion element having the separated/inverted structure which is formed with the aforementioned nonlinear optical materials to obtain preferable inhibitory effects against the aforementioned output declination.

Second Embodiment

Figure 7:
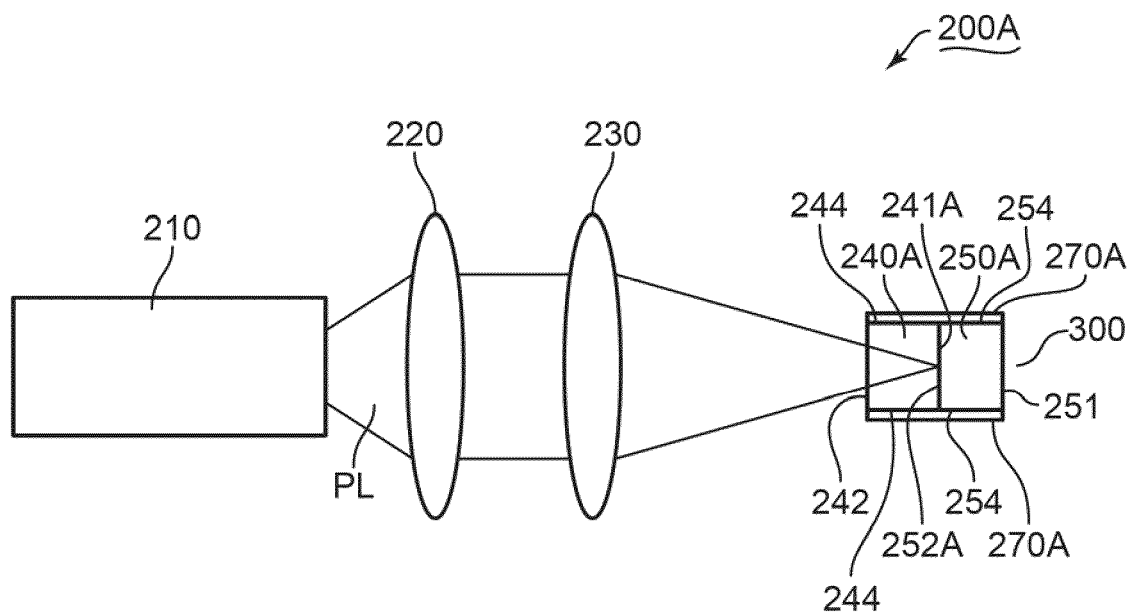
FIG. 7 is a schematic view of configurations of a wavelength conversion element and a wavelength conversion laser light source with the wavelength conversion element according to the second embodiment.
Figure 8:
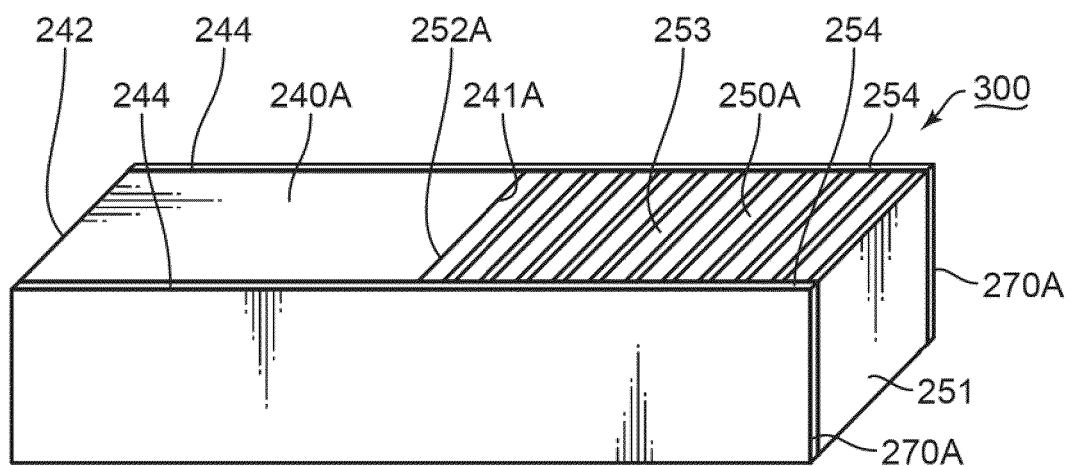
FIG. 8 is a schematic perspective view of a first optical element of the wavelength conversion laser light source shown in FIG. 7.

FIG. 7 is a schematic view of configurations of a wavelength conversion element and a wavelength conversion laser light source with the wavelength conversion element according to the second embodiment. FIG. 8 is a schematic perspective view of the first optical element of the wavelength conversion laser light source shown in FIG. 7. The wavelength conversion element and the wavelength conversion laser light source are described with reference to FIGS. 7 and 8.

Nd:YAG laser and Nd:YVO$_4$ crystal are exemplified as one of materials of the solid-state laser medium of the wavelength conversion laser light source according to this embodiment. Various nonlinear optical materials (for example, MgO-doped lithium niobate, MgO-doped lithium tantalate, MgO-doped lithium niobate of a fixed ratio composition, MgO-doped lithium tantalate of a fixed ratio composition or potassium titanyl phosphate (known as KTP, KTiOPO$_4$) used in the wavelength conversion element of the first embodiment) configured to form the polarization inverted structure may be used as the material of the wavelength conversion element. It should be noted that, in this embodiment, Nd:YVO$_4$ crystal is used as the solid-state laser medium. MgO:LiNbO$_3$ crystal is used as the wavelength conversion element. The wavelength conversion laser light source comprising the solid-state laser medium and the wavelength conversion element, which are formed from the aforementioned materials, is described hereinafter.

FIG. 7 schematically shows a laser light source 200A according to the second embodiment. FIG. 8 schematically shows the first optical element 300 comprising the laser light source 200A. The same elements as the laser light source 200 according to the first embodiment are given the same reference numeral. The descriptions of the first embodiment are incorporated for the same elements.

The laser light source 200A comprises an excitation light source 210, a collimator lens 220, a condenser lens 230 and a first optical element 300. The first optical element 300 comprises a solid-state laser medium 240A and a wavelength conversion element 250A. The laser light source 200A further comprises a conductive material 270A. The conductive material 270A is mounted on the first optical element 300.

As shown in FIG. 8, the solid-state laser medium 240A and the wavelength conversion element 250A in optical contact with the solid-state laser medium 240A form the first optical element 300. The solid-state laser medium 240A includes an incident end surface 242 to which the excitation light PL emitted from the excitation light source 210 is incident, and a first bonding surface 241A opposite to the incident end surface 242. The wavelength conversion element 250A includes an emitting end surface 251 from which the second harmonic is emitted and a second bonding surface 252A opposite to the emitting end surface 251. The first bonding surface 241A of the solid-state laser medium 240A is, for example, tightly attached and integrated with the second bonding surface 252A of the wavelength conversion element 250A to form the first optical element 300 comprising the solid-state laser medium 240A and the wavelength conversion element 250A in optical contact.

Functions and operations of the laser light source 200A according to the second embodiment are described.

The excitation light source 210 emits excitation light PL. The collimator lens 220 shapes the excitation light PL into parallel light. The condenser lens 230 condenses the excitation light PL to the solid-state laser medium 240A.

Like the wavelength conversion element 250 described in the context of the first embodiment, the wavelength conversion element 250A of this embodiment includes a first lateral surface 254 which perpendicularly intersects with the polarization inverted structure 253. The solid-state laser medium 240A includes a second lateral surface 244 which is continuous with the first lateral surface 254. The laser light source 200A of this embodiment is characterized by the conductive material 270A coming in contact with the first and second lateral surfaces 254, 244.

The first optical element 300 comprises, as described above, the solid-state laser medium 240A and the wavelength conversion element 250A. The first bonding surface 241A of the solid-state laser medium 240A is in optical contact with the second bonding surface 252A of the wavelength conversion element 250A. The optical contact between the solid-state laser medium 240A and the wavelength conversion element 250A is maintained by means of force such as the intermolecular force or the van der Waals force which works between the materials of the solid-state laser medium 240A and the wavelength conversion element 250 without interposing adhesive.

The first bonding surface 241A of the solid-state laser medium 240A is the a-c plane of Nd:YVO$_4$ crystal. The second bonding surface 252A of the wavelength conversion element 250A is the z-y plane of MgO:LiNbO$_3$ crystal. The first bonding surface 241A of the solid-state laser medium 240A and the second bonding surface 252A of the wavelength conversion element 250A are bonded so that the z-axis of MgO:LiNbO$_3$ crystal and the c-axis of Nd:YVO$_4$ crystal become parallel.

If the excitation light PL is incident to the incident end surface 242 of the solid-state laser medium 240A, a green laser beam is emitted from the emitting end surface 251 of the wavelength conversion element 250A. An optical film which reflects 99.8% of the laser beam of a 1060 nm band and a harmonic laser beam of a 530 nm band is formed on the incident end surface 242 of the solid-state laser medium 240A. An optical film, which reflects 99.8% of the laser beam of a 1060 nm band and transmits the harmonic laser beam of a 530 nm band, is formed on the emitting end surface 251 of the wavelength conversion element 250A. Therefore the light of a 1060 nm band resonates to laser-oscillate between the incident end surface 242 of the solid-state laser medium 240A and the emitting end surface 251 of the wavelength conversion element 250A. Consequently, only the green light after the wavelength-conversion by the wavelength conversion element 250A is emitted from the emitting end surface 251.

Like the conductive material 270 of the first embodiment, the conductive material 270A of the laser light source 200A of this embodiment covers the first lateral surface 254 ("y-plane") of the wavelength conversion element 250A. The laser light source 200A of this embodiment is characterized in that the conductive material 270A further continuously covers the second lateral surface 244 of the solid-state laser medium 240A.

The solid-state laser medium 240A formed with Nd:YVO$_4$ crystal has a different linear expansion coefficient from the wavelength conversion element 250A formed with MgO:LiNbO$_3$ crystal. The present inventors figured out that, while laser light was oscillated by means of an optical element comprising the solid-state laser medium and the wavelength conversion element, which have different linear expansion coefficients and are formed from different types of materials, the solid-state laser medium generates heat to cause a stress in the wavelength conversion element, which in turn, results in the output declination of the laser light source.

In general, since a highly conductive material has high thermal conductivity, the material efficiently releases the heat generated by the solid-state laser medium. Therefore it becomes less likely to decline the output of the green laser beam. In this embodiment, an effective inhibitory effect against the output declination of green light was confirmed with an aluminum sputtered film (100 to 300 nm in thickness) as the conductive material 270A.

Figure 9:
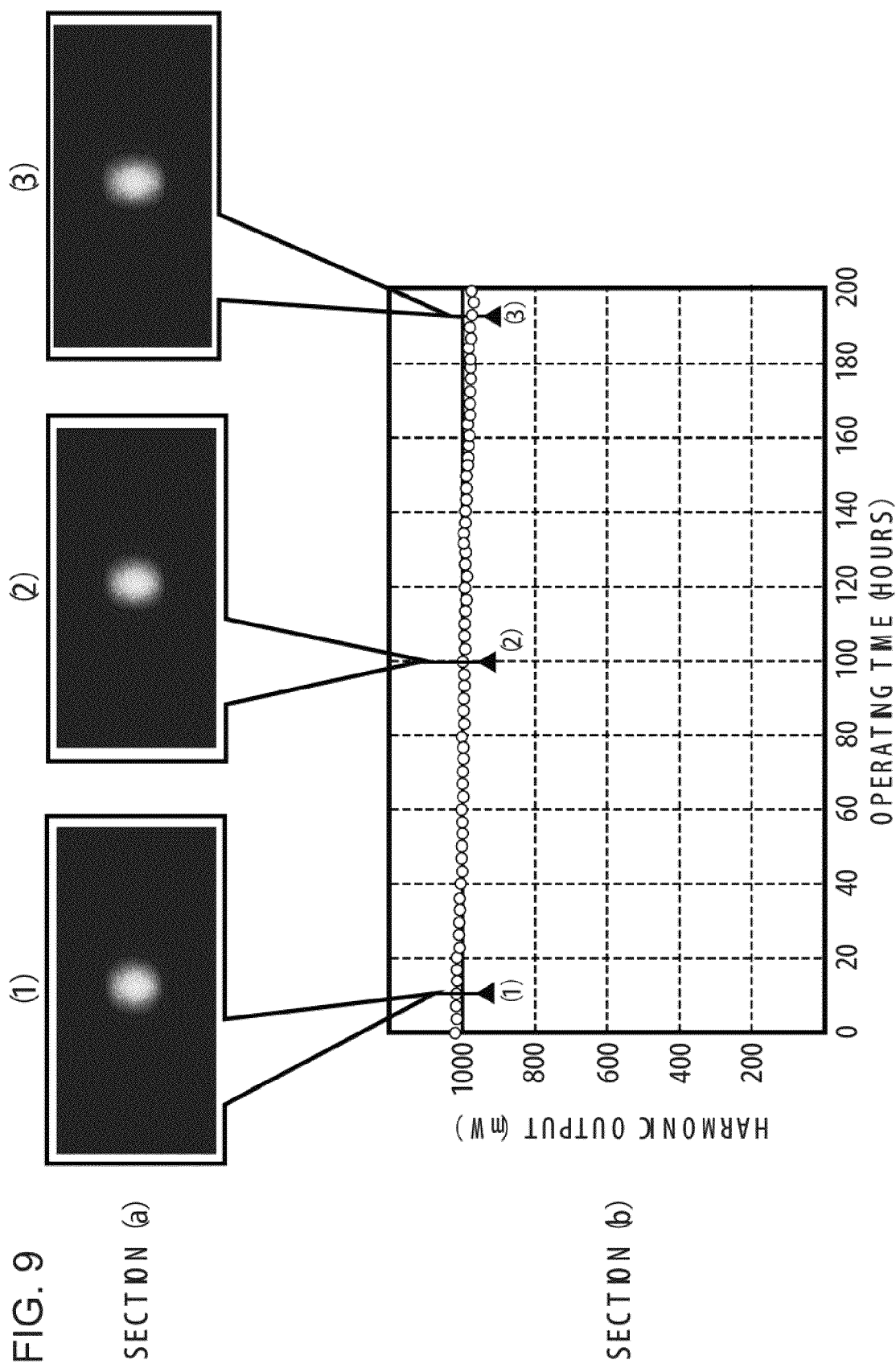
FIG. 9 is a graph representing output fluctuation over an operating time during which the laser light source is subjected to continuous operation such that excitation light with a wavelength of 808 nm is input to the first optical element to output green light of 1000 mV from the first optical element, and shows photographs of lateral mode shapes of the laser light source during the continuous operation.

FIG. 9 is a graph representing output fluctuation over operating time during which the laser light source 200A is continuously operated such that excitation light PL with a wavelength of 808 nm is input to the first optical element 300 to output green light of 1000 mW from the first optical element 300, and shows photographs of the lateral mode shapes of the laser light source 200A during the continuous operation. Section (a) of FIG. 9 is a photograph showing the lateral mode shape of the laser light source 200A during the continuous operation. Section (b) of FIG. 9 is a plot diagram showing the output fluctuation over the operating time during which the laser light source 200A is continuously operated. The output fluctuation and change in lateral mode shape over the operating time are described with reference to FIGS. 7 to 9.

Photograph (1) in section (a) of FIG. 9 corresponding to symbol "(1)" shown in a plot diagram of section (b) of FIG. 9 is a photograph of the lateral mode shape when the lighting of the laser light source 200A is started (initial stage of lighting). Photograph (2) in section (a) of FIG. 9 corresponding to symbol "(2)" shown in the plot diagram of section (b) of FIG. 9 is a photograph of the lateral mode shape 100 hours after the initial stage of lighting. Photograph (3) in section (a) of FIG. 9 corresponding to symbol "(3)" shown in the plot diagram of section (b) of FIG. 9 is a photograph of the lateral mode shape 190 hours after the initial stage of lighting.

Neither output declination nor change in lateral mode is observed during the period from the initial stage of lighting to the lapse of 100 hours. If 190 hours elapse from the initial stage of lighting, a slight change in the lateral mode shape is confirmed, but the amount of output declination is within 1%. It may be understood from FIG. 9 that the conductive material 270A covering the first and second lateral surfaces 254, 244 of the first optical element 300 effectively inhibits the output declination during the continuous operation of the laser light source 200A.

In this embodiment, the first optical element 300 comprises the solid-state laser medium 240A and the wavelength conversion element 250A, which are integrated. The conductive material 270A faces to and comes in contact with "y-plane" (first lateral surface 254) of the wavelength conversion element 250A. Consequently, in accordance with the methodologies described in the context of the first embodiment, the charges generated in the wavelength conversion element 250A are appropriately cancelled. In addition, the conductive material 270A extends up to the second lateral surface 244 of the solid-state laser medium 240A. Consequently, the heat generated in the solid-state laser medium 240A is efficiently released. Therefore it becomes less likely that the output of the laser beam declines even during a prolonged operation of the first optical element 300.

Third Embodiment

The wavelength conversion laser light source according to the present embodiment inhibits lateral mode change of the first optical element 300 (an integrated element of the solid-state laser medium 240A and wavelength conversion element 250A in optical contact) which is described in the context of the aforementioned second embodiment. Consequently, it becomes less likely that the output declines during a prolonged operation of the wavelength conversion laser light source according to this embodiment.

Figure 10:
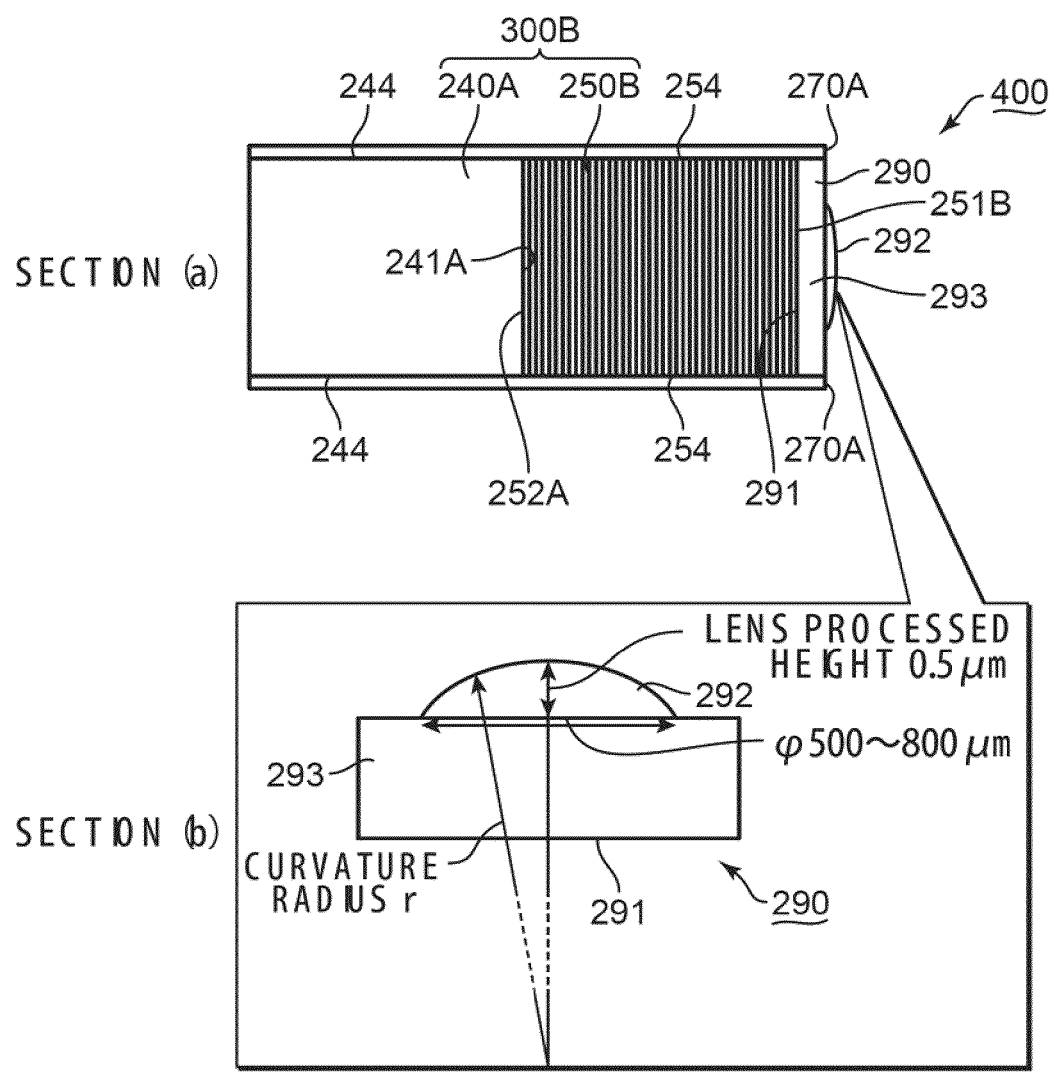
FIG. 10 is a view schematically showing configurations of an optical element used in a wavelength conversion laser light source according to the third embodiment.

FIG. 10 is a view schematically showing the configurations of an optical element used in a wavelength conversion laser light source according to the third embodiment. Section (a) of FIG. 10 shows the configurations of the optical element comprising an integrated structure among the solid-state laser medium, the wavelength conversion element and a maintenance mechanism configured to maintain the lateral mode. Section (b) of FIG. 10 shows a shape of the maintenance mechanism. The same elements as the laser light source 200, 200A according to the first and/or second embodiments are given the same reference numeral. The descriptions of the first and/or second embodiments are incorporated for such same elements.

The optical element 400 shown in FIG. 10 comprises a solid-state laser medium 240A and a wavelength conversion element 250B. The solid-state laser medium 240A and the wavelength conversion element 250B are integrated to form a first optical element 300B comprising the solid-state laser medium 240A and the wavelength conversion element 250B in optical contact.

Like the laser light source 200A of the second embodiment, the conductive material 270A comes in contact with the first lateral surface 254 of the wavelength conversion element 250B and the second lateral surface 244 of the solid-state laser medium 240A. The conductive material 270A cancels charges in the wavelength conversion element 250B and facilitates thermal radiation from the solid-state laser medium 240A.

The optical element 400 comprises a maintenance mechanism 290 configured to maintain the lateral mode. The maintenance mechanism 290 includes a third bonding surface 291, which is bonded to the wavelength conversion element 250B. The wavelength conversion element 250B includes a fourth bonding surface 251B which is bonded to the third bonding surface 291, and a second bonding surface 252A which is bonded to the solid-state laser medium 240A. The solid-state laser medium 240A includes a first bonding surface 241A, which is bonded to the second bonding surface 252A.

The maintenance mechanism 290 comprises a base 293 including the third bonding surface 291, and a lens portion 292 opposite to the third bonding surface 291. A laser beam is emitted from the lens portion 292. The lens portion 292 is processed into a lens shape. In this embodiment, the maintenance mechanism 290 is exemplified as the second optical element. The lens portion 292 is exemplified as the emitting portion.

Functions and operations of the optical element 400 according to the third embodiment are described.

The optical element 400 according to this embodiment is common with the first optical element 300 described in the context of the second embodiment in terms of bonding between the first bonding surface 241A of the solid-state laser medium 240A and the second bonding surface 252A of the wavelength conversion element 250B to integrate the solid-state laser medium 240A with the wavelength conversion element 250B. On the other hand, unlike the second embodiment, the optical element 400 includes the maintenance mechanism 290.

The lens portion 292 of the maintenance mechanism 290 is formed with a material having a substantially equivalent refractive index to the wavelength conversion element 250B. The optical element 400 described in this embodiment is characterized in that the third bonding surface 291 of the maintenance mechanism 290 and the fourth bonding surface 251B of the wavelength conversion element 250B are in optical contact to integrate the maintenance mechanism 290 with the wavelength conversion element 250B.

The lens portion 292 of the maintenance mechanism 290 is formed in a spherical convex lens shape, which is, for example, 500 to 800 μm (micrometers) in diameter. The lens portion 292 has an outer surface of a curvature radius "r". The lens portion 292 protrudes from the base 293 by 0.1 to 0.5 μm (micrometers) in height.

If the optical element 400 is used in the wavelength conversion laser light source, it is preferable to set the curvature radius "r" within a range from 100 to 1000 mm (millimeters). Less than 100 mm of curvature radius "r" decreases an overlapping integration between the excitation light and the light of a 1060 nm band in the solid-state laser medium 240A to excessively weaken emitted green light. Curvature radius "r" exceeding 1000 mm makes it ineffective to maintain the lateral mode to diminish the inhibitory function against the output declination during continuous operation.

The lens portion 292 may be processed by means of various processing methods such as a method based on transcription of a resist mask shape by means of dry etching, a method based on optical polishing, or a method based on pressure-bonding glass materials, which have equivalent refractive indexes.

Figure 11:
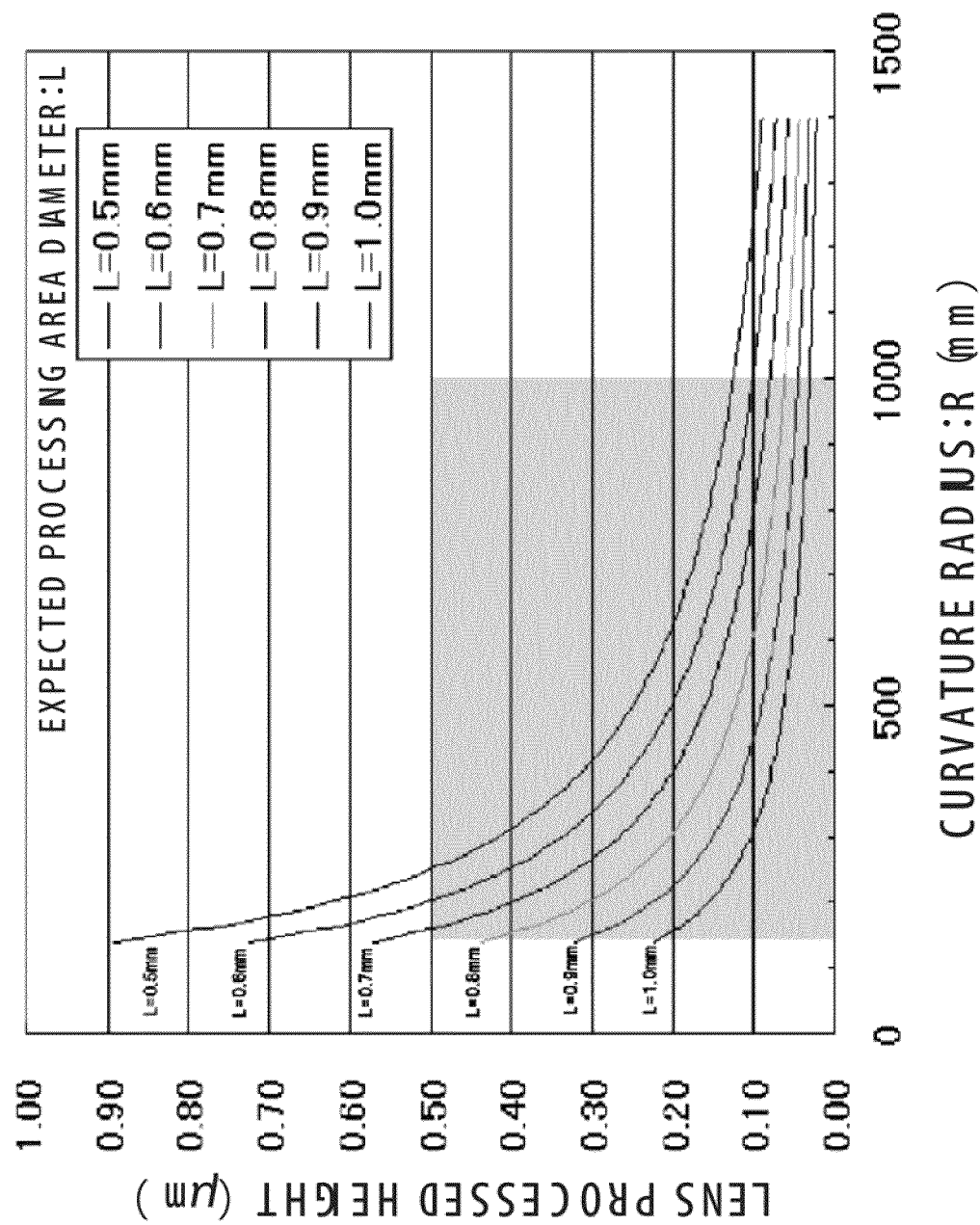
FIG. 11 is a plot diagram showing a relationship between a curvature radius "r" and a processed height of a lens portion.

FIG. 11 is a plot diagram showing a relationship between the curvature radius "r" of the lens portion 292 and the processed height of the lens portion 292. In the plot diagram shown in FIG. 11, the diameter "L" of the lens portion 292 is used as a parameter.

According to the plot diagram shown in FIG. 11, the processed height of the lens portion 292 is preferably no more than 0.5 μm. It should be noted that, if the lens portion is created by dry etching, the processed height of the lens portion 292 depends on selection of a material and a resist mask, which are used to shape the lens portion 292.

Figure 12:
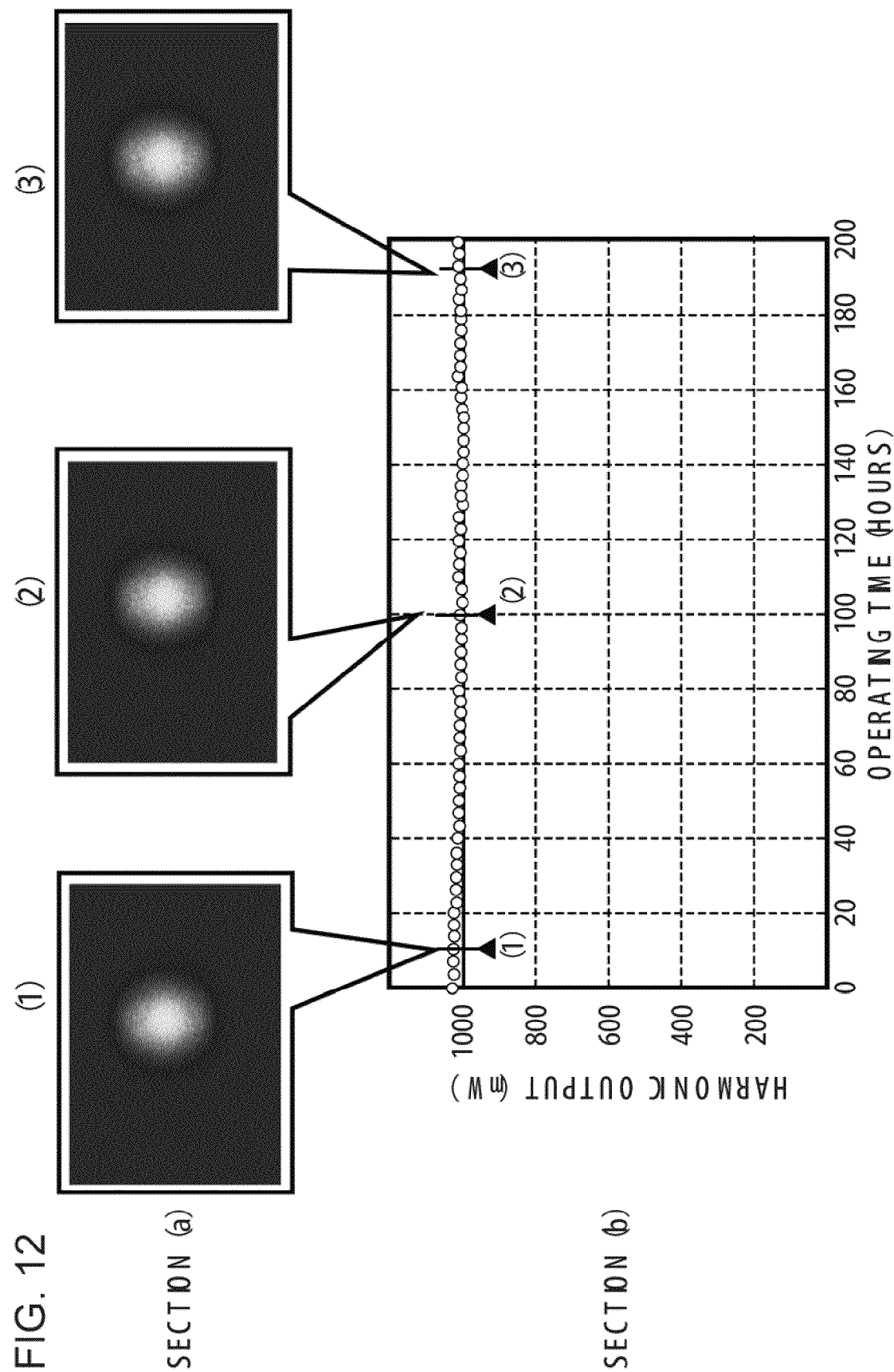
FIG. 12 shows photographs of lateral mode shapes of the laser light source during continuous operation and is a plot diagram showing output fluctuation over the operating time during which the laser light source is subjected to the continuous operation.

FIG. 12 is a diagram showing an output change during a continuous operation of the wavelength conversion laser light source comprising the optical element 400 described in this embodiment. Section (a) of FIG. 12 is a photograph of the lateral mode shape of the laser light source during the continuous operation. Section (b) of FIG. 12 is a plot diagram showing an output fluctuation over the operating time during which the laser light source is continuously operated. The output change during the continuous operation of the wavelength conversion laser light source is described with reference to FIGS. 9, 10 and 12.

As shown in FIG. 9, the lateral mode shape of the laser light source 200A according to the second embodiment slightly changed after the lapse of 190 hours. On the other hand, the wavelength conversion laser light source comprising the optical element 400 with the maintenance mechanism 290 according to this embodiment did not cause a change in the lateral mode shape and the output declination. A high output of wavelength-converted light was obtained from the laser light source according to this embodiment.

In this embodiment, as shown in FIG. 10, the maintenance mechanism 290 is situated so that the third bonding surface 291 of the maintenance mechanism 290 is bonded to the fourth bonding surface 251B of the wavelength conversion element 250B. Alternatively, the maintenance mechanism may be situated between the wavelength conversion element and the solid-state laser medium. Further alternatively, the incident end surface of the solid-state laser medium may be formed in a curved surface configured to maintain the lateral mode. Depending on design (for example, shape dimension) or placement of the maintenance mechanism, for example, a beam diameter in the solid-state laser medium may be lengthened or a beam diameter in the wavelength conversion element may be reduced. Since the power density becomes greater in the wavelength conversion element than the power density in the solid-state medium, a 1060 nm band of light is preferably condensed in the wavelength conversion element to make the wavelength conversion more efficient. Accordingly, it is more preferable to bond the lens structure configured to maintain the lateral mode with the incident end surface of the solid-state laser medium.

The methodologies described in the context of the third embodiment may be suitably applied to the first and/or second embodiments.

Fourth Embodiment

The laser light source 100 (optical contact-type wavelength conversion laser light source) described with reference to FIG. 1 entails problems concerning other error modes, which cause output halt in addition to the aforementioned output declination. The wavelength conversion laser light source and the optical element described in this embodiment appropriately resolve the problems concerning the output halt.

Upon conducting the test of continuously lighting the laser light source 100 described with reference to FIG. 1 so as to output 1 W of light with a 500 nm band, the present inventors figured out a failure mode in which the laser light source 100 halted the output at approximately 80 hours.

Figure 13:
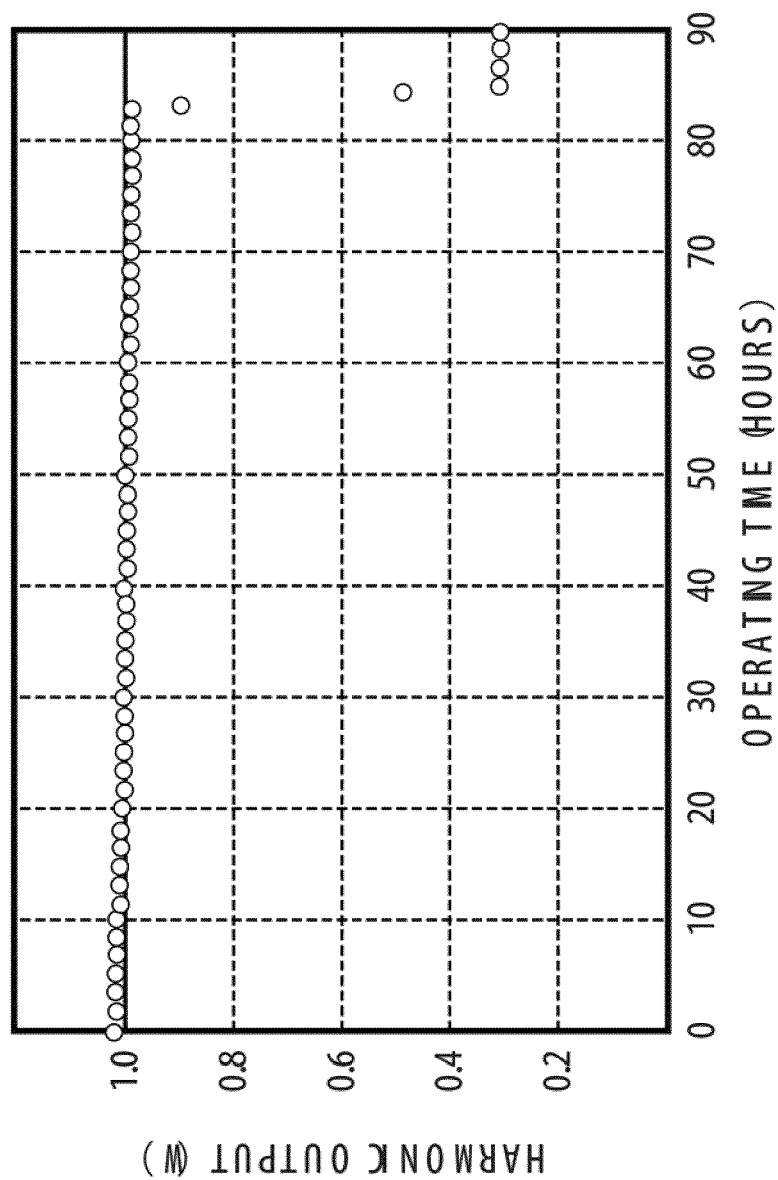
FIG. 13 is a plot diagram showing results of the continuous lighting test.

FIG. 13 is a plot diagram showing results of the aforementioned continuous lighting test. Problems of the output halt are described with reference to FIGS. 1 and 13.

Unlike the conversion efficiency declination (output declination) caused by the change in the refractive index of the wavelength conversion element described in the context of the first embodiment, the output halt shown in FIG. 13 means a sudden and rapid output declination or stop, which is caused by collapse of the resonating condition. The present inventors also confirmed that it was likely that the rapid declination or the output halt happened if an output from the laser light source 100 was no less than 500 mW. As a result of intensive studies by the present inventors, it was figured out that the sudden and rapid output declination or halt of the laser light source 100 was likely to happen if a temperature of the optical element 140 during operation of the laser light source 100 exceeded 40° C.

Figure 14:
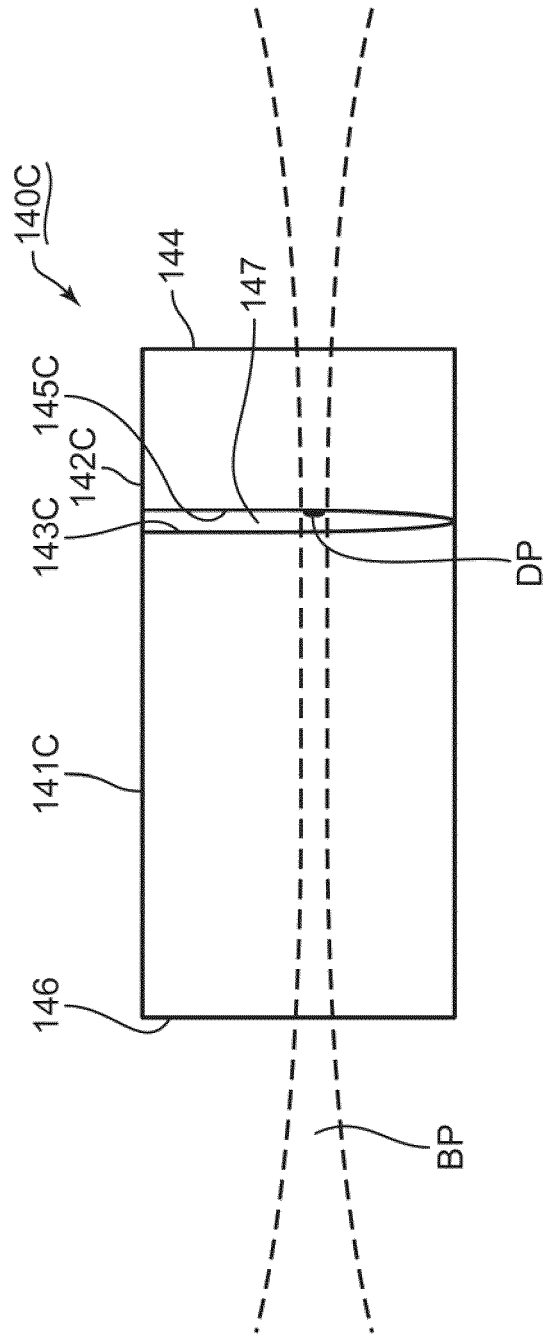
FIG. 14 is a schematic view of the optical element, which causes output declination or output halt due to the continuous lighting at high output.

FIG. 14 is a schematic view of an optical element, which is subjected to the output declination or halt because of the aforementioned continuous lighting with a high output. The same elements as the elements described with reference to FIG. 1 are given the same reference numeral, and the descriptions in the context of FIG. 1 is incorporated for such same elements. Causes of the output declination or halt are described with reference to FIGS. 1 and 14.

Like the optical element 140 described with reference to FIG. 1, the optical element 140C comprises a solid-state laser medium 141C and a wavelength conversion element 142C. The solid-state laser medium 141C is in optical contact with the wavelength conversion element 142C.

The solid-state laser medium 141C includes an incident end surface 146 to which the excitation light is incident, and a first bonding surface 143C opposite to the incident end surface 146. The wavelength conversion element 142C includes an emitting end surface 144 from which the output light is emitted, and a second bonding surface 145C opposite to the emitting end surface 144.

The first and second bonding surfaces 143C, 145C were tightly attached before the continuous lighting test. After the continuous lighting test, however, an air gap 147 was formed between the first and second bonding surfaces 143C, 145C.

FIG. 14 shows a beam path (laser beam path; hereinafter referred to as the "beam path BP"), which passes through the optical element 140C. FIG. 14 also shows deposition DP, which was observed after the continuous lighting test. The deposition DP was observed in the air gap 147 between the first and second bonding surfaces 143C, 145C.

As a result of analyzing the optical element 140C which caused the output halt, it was figured out that the air gap 147 was formed between the first and second bonding surfaces 143C, 145C by some causes such as a surface accuracy of the first and second bonding surfaces 143C, 145C, which had been optically bonded. It was also figured out that the deposition DP between the first and second bonding surfaces 143C, 145C was adhered across the beam path BP, along which the laser beam passed. The deposition DP contained carbon-containing components, which floated in the air and entered the interface (boundary between the first and second bonding surfaces 143C, 145C) through the air gap 147. It was figured out that, as a result of the carbon-containing components, which was accumulated due to laser trapping, they were adhered as the deposition DP on the bonding surface (first and/or second bonding surface 143C, 145C) with which the beam path BP intersected. It was figured out that, due to the air gap 147 and the deposition DP, propagation losses of the fundamental light at the optical contact surface (boundary between the first and second bonding surfaces 143C, 145C) went up, which in turn increased internal losses of the optical element 140C used as the laser resonator. It is considered that the increase in internal losses of the optical element 140C causes the aforementioned output halt.

The present inventors conducted additional research and figured out that narrow bonding area between the first and second bonding surfaces 143C, 145C caused the air gap 147. It was confirmed that the second bonding surface 145C of the wavelength conversion element 142C separated from the first bonding surface 143C of the solid-state laser medium 141C because of heat generation from and thermal expansion of the solid-state laser medium 141C. It was experimentally confirmed that it was likely that there was no air gap 147 if the bonding area between the first and second bonding surfaces 143C, 145C was increased.

The present inventors, however, figured out another issue that if a simple increase in bonding area between the first and second bonding surfaces 143C, 145C was likely to worsen the output characteristics. The new problem concerning the deterioration in the output characteristics is caused by insufficient heat radiation from the beam path BP in the solid-state laser medium 141C, which absorbs the excitation light. For example, if powerful excitation light is incident to the solid-state laser medium 141C in order to obtain a harmonic output of 500 mW or more, the output characteristics become significantly worsened so that the required output may not be achieved.

In general, the solid-state laser medium 141C has low thermal conductivity. Accordingly, it is preferable to set a short distance between a portion where the excitation light passes through and a holder configured to hold the solid-state laser medium 141C, because heat due to absorption of the excitation light by the solid-state laser medium 141C is efficiently released. Approximately 80% of excitation light is absorbed nearby the incident end surface 146 of the solid-state laser medium 141C. Accordingly, it is preferable to efficiently transfer and release the heat generated nearby the incident end surface 146 of the solid-state laser medium 141C.

In this embodiment, an optical element for resolving the aforementioned conflicting problems is described.

Figure 15:
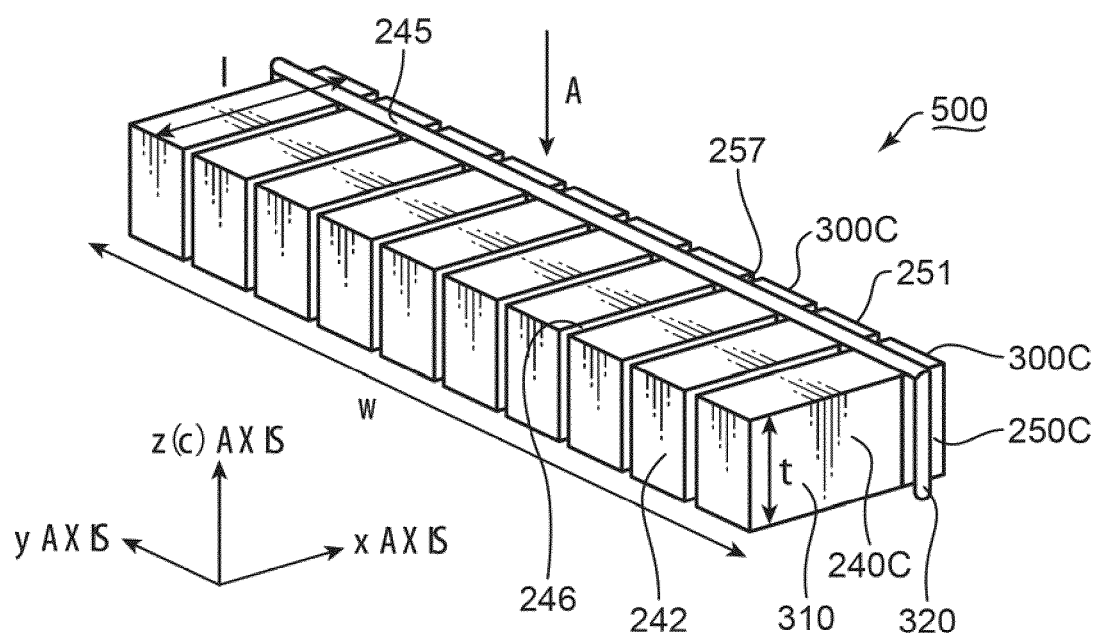
FIG. 15 is a perspective view of an optical element array including several aligned optical elements.
Figure 16:
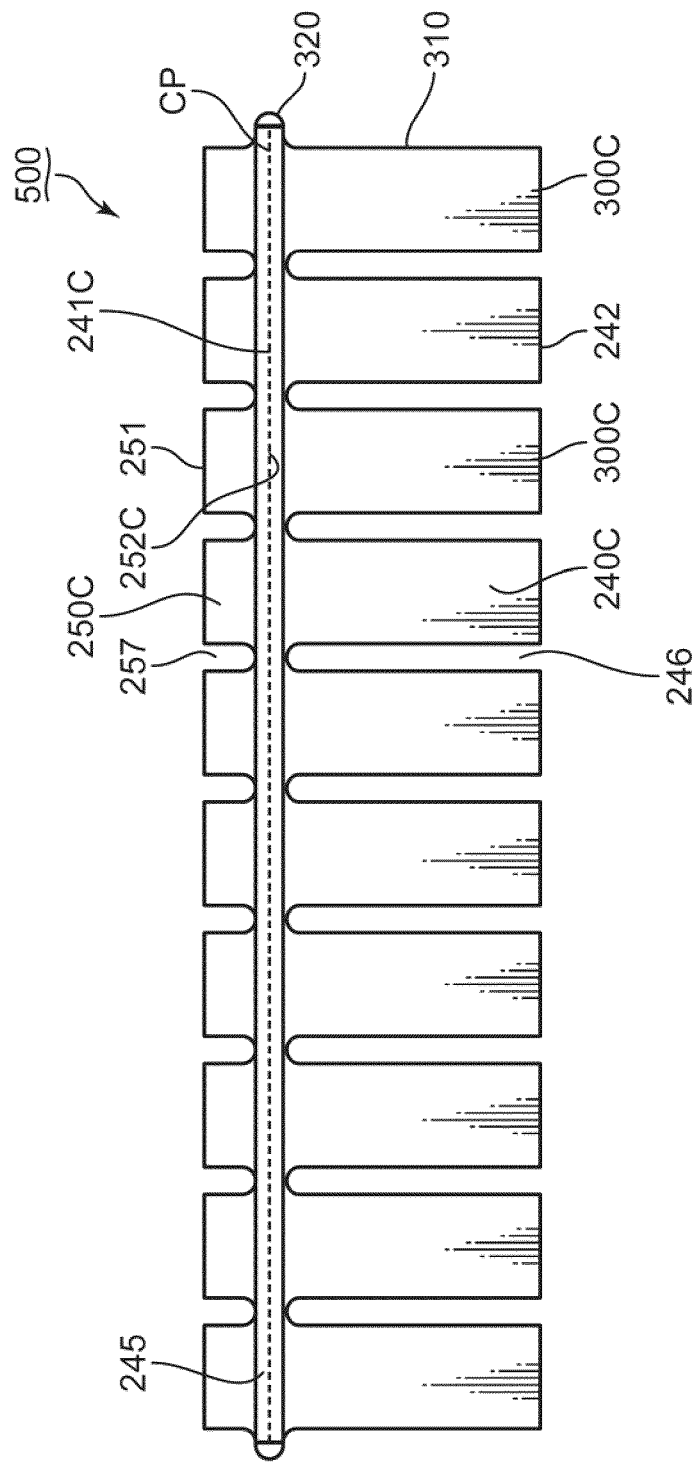
FIG. 16 is a plan view of the optical element array shown in FIG. 15.
Figure 17:
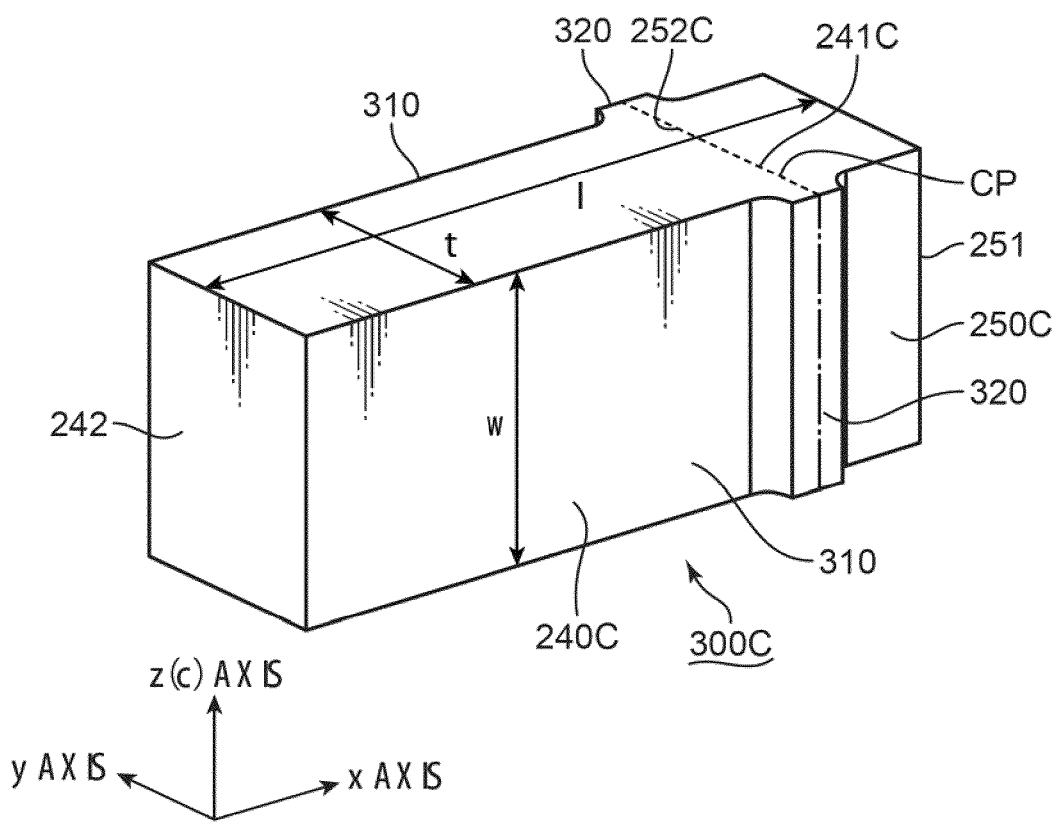
FIG. 17 is a perspective view of an optical element separated from the optical element array shown in FIG. 15.

FIG. 15 is a perspective view of an optical element array including several aligned optical elements. FIG. 16 is a plan view of the optical element array shown in FIG. 15 (diagram viewed from the arrow A in FIG. 15). FIG. 17 is a perspective view of the optical element which is separated from the optical element array shown in FIG. 15. The optical element is described with reference to FIGS. 15 to 17. It should be noted that, in FIG. 17, the sealing member (described later) shown in FIG. 15 is not depicted. The same elements as the elements described in the context of the first to third embodiments are given the same reference numeral. The descriptions of the first to third embodiments are incorporated for such same elements.

The bar-shaped optical element array 500 includes several aligned optical elements 300C. The bar-shaped optical element 300C is formed, for example, by partially cutting or separating the optical element array 500.

Each optical element 300C includes a solid-state laser medium 240C configured to generate fundamental light, and a wavelength conversion element 250C configured to convert the fundamental light into second harmonic, which has a higher frequency than the fundamental light. The solid-state laser medium 240C includes an incident end surface 242 to which the excitation light is incident, and a first bonding surface 241C opposite to the incident end surface 242. The wavelength conversion element 250C includes an emitting end surface 251 from which the output light is emitted, and a second bonding surface 252C opposite to the emitting end surface 251. For example, optical contact between the first bonding surface 241C of the solid-state laser medium 240C and the second bonding surface 252C of the wavelength conversion element 250C is created to integrate the solid-state laser medium 240C with the wavelength conversion element 250C. In FIGS. 16 and 17, the boundary between the first and second bonding surfaces 241C, 252C is shown as the bonding position CP.

As shown in FIGS. 15 and 16, the optical element array 500 further comprises sealant 245 configured to seal the boundary between the first and second bonding surfaces 241C, 252C. The sealant 245 is situated along the bonding position CP. In this embodiment, the sealant 245 is exemplified as the sealing member. The sealant 245 is likely to prevent ambient air and moisture from infiltrating in between the first and second bonding surfaces 241C, 252C.

A first notch 246 is formed between the solid-state laser mediums 240C of the optical elements 300C in the optical element array 500. A second notch 257 is formed between the wavelength conversion elements 250C of the optical elements 300C in the optical element array 500.

Functions and operations of the optical element 300C according to the fourth embodiment are described.

As described above, the first bonding surface 241C of the solid-state laser medium 240C and the second bonding surface 252C of the wavelength conversion element 250C are in optical contact. The bar-shaped optical element 300C (and bar-shaped optical element array 500) according to this embodiment is characterized in that the bonding area between the first and second bonding surfaces 241C, 252C is greater than the area of the incident end surface 242 of the solid-state laser medium 240C. In this embodiment, the first bonding surface 241 is exemplified as the bonding surface. The incident end surface 242 opposite to the first bonding surface 241 is exemplified as the opposite surface.

<Configuration of Optical Element>

The configuration of the optical element 300C comprising the solid-state laser medium 240C and the wavelength conversion element 250C is described hereinafter. A method for forming the optical element 300C is described later.

As described above, the optical element 300C comprises a solid-state laser medium 240C and a wavelength conversion element 250C. Various materials such as Nd:YAG laser and Nd:YVO$_4$ crystal are exemplified as materials for the solid-state laser medium 240C. Various materials such as LiNbO$_3$, LiTaO$_3$, and KTP are exemplified as materials of the wavelength conversion element 250C. The solid-state laser medium 240C of the optical element 300C according to this embodiment is formed, for example, from Nd:YVO$_4$ crystal. The wavelength conversion element 250C of the optical element 300C according to this embodiment is formed, for example, from MgO:LiNbO$_3$ crystal. The optical element 300C comprising the solid-state laser medium 240C and the wavelength conversion element 250C formed from the aforementioned materials are described.

As described above, the first bonding surface 241C of the solid-state laser medium 240C and the second bonding surface 252C of the wavelength conversion element 250C are in optical contact. The optical contact between the solid-state laser medium 240C and the wavelength conversion element 250C is maintained by a force such as intermolecular force or van der Waals force which works between the materials of the solid-state laser medium 240C and the wavelength conversion element 250C without interposing adhesive.

The first bonding surface 241C of the solid-state laser medium 240c is the a-c plane of Nd:YVO$_4$ crystal. The second bonding surface 252C of the wavelength conversion element 250C is the z-x plane of MgO:LiNbO$_3$ crystal. The optical contact between the first bonding surface 241C of the solid-state laser medium 240C and the second bonding surface 252C of the wavelength conversion element 250C is created so that the z-axis of MgO:LiNbO$_3$ crystal and the c-axis of Nd:YVO$_4$ crystal become parallel. The area of the first bonding surface 241C (and second bonding surface 252C) is greater than the area of the incident end surface 242 (end surface opposite to the first bonding surface 241C) of the solid-state laser medium 240C.

Since the bonding area between the solid-state laser medium 240C and the wavelength conversion element 250C becomes relatively large, high bonding strength is achieved between the solid-state laser medium 240C and the wavelength conversion element 250C. Since the area of the incident end surface 242 of the solid-state laser medium 240C is smaller than the bonding area between the solid-state laser medium 240C and the wavelength conversion element 250C, the heat due to the absorption of the excitation light by the solid-state laser medium 240C is effectively released. Accordingly, the relatively high bonding strength of the optical element 300C and preferable output characteristics of the outgoing light may coexist.

The optical element 300C according to this embodiment is "2.5 mm" in length (l), "1.0 mm" in thickness (t), and "1.0 mm" in width (w). The length (l) of "2.5 mm" of the optical element 300C includes the length of "0.5 mm" of the wavelength conversion element 250C and the length of "2.0 mm" of the solid-state laser medium 240C. The first and second bonding surfaces 241C, 252C, which form the bonding surface, are "1.5 mm" in thicknesses (l), respectively.

In this embodiment, the area of the emitting end surface 251 of the wavelength conversion element 250C is smaller than the bonding area between the solid-state laser medium 240C and the wavelength conversion element 250C. Alternatively, the area of the emitting end surface of the wavelength conversion element may be equal to the bonding area between the solid-state laser medium and the wavelength conversion element.

<Laser Light Source>

Figure 18:
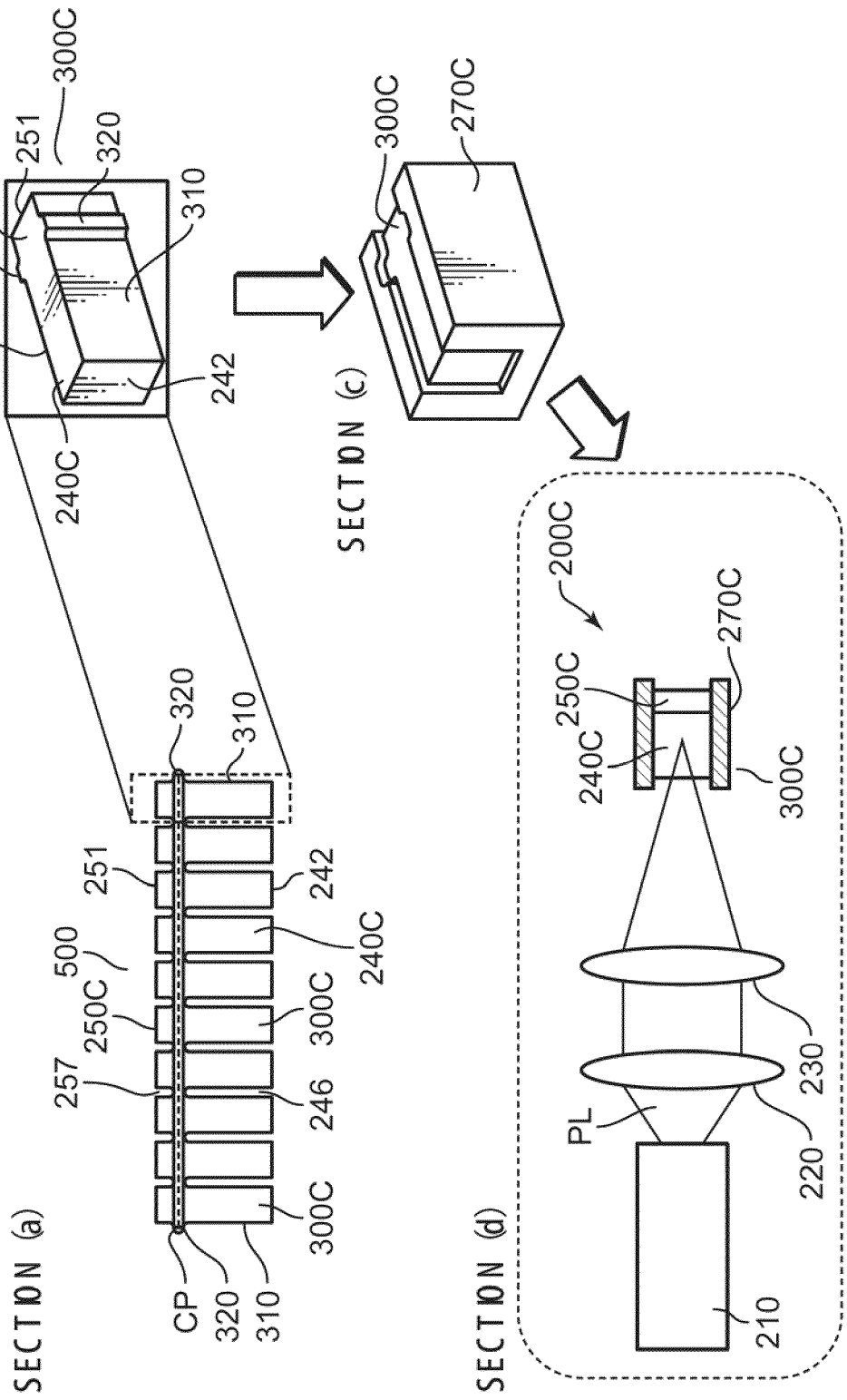
FIG. 18 is a diagram showing configurations of a bar-shaped optical element array and the wavelength conversion laser using the optical element.

FIG. 18 is a diagram showing configurations of the bar-shaped optical element array 500 and the wavelength conversion laser with the optical element 300C. Section (a) of FIG. 18 is a schematic plan view of the optical element array 500. Section (b) of FIG. 18 is a schematic perspective view of the optical element 300C. Section (c) of FIG. 18 shows the optical element 300C stored in an element holder. Section (d) of FIG. 18 is a schematic diagram of the wavelength conversion laser. The wavelength conversion laser is described with reference to FIGS. 15 to 18. In FIG. 18, the same elements as the elements described in the context of the first to third embodiments are given the same reference numeral. The descriptions of the first to third embodiments are incorporated for such same elements.

As shown in section (d) of FIG. 18, the laser light source 200C comprises an excitation light source 210 which generates excitation light PL, a collimator lens 220, a condenser lens 230 and an optical element 300C. As described above, the optical element 300C comprises a solid-state laser medium 240C and a wavelength conversion element 250C. The solid-state laser medium 240C and the wavelength conversion element 250C are, for example, tightly attached and integrated as described above to form the optical element 300C comprising the solid-state laser medium 240C and the wavelength conversion element 250C in optical contact.

As shown in section (a) of FIG. 18, the optical element array 500 comprises several aligned optical elements 300C. As shown in sections (a) and (b) of FIG. 18, the optical element 300C forms a part of the bar-shaped optical element array 500. The optical element 300C is, for example, cut and separated from the optical element array 500, and then built into the laser light source 200C.

As shown in FIG. 17, the optical element 300C includes a lateral surface 310 orthogonal to the first and/or second bonding surfaces 241C, 252C (orthogonal plane to the y axis), and a rib 320 which protrudes from the lateral surface 310. The rib 320 extends along the bonding position CP, which appears on the lateral surface 310.

As shown in sections (c) and (d) of FIG. 18, the laser light source 200C further comprises an element holder 270C configured to store the optical element 300C, which is separated from the optical element array 500. The element holder 270C may have equivalent conductive properties to the conductive materials 270, 270A described in the context of the first and second embodiments.

As shown in section (c) of FIG. 18, the optical element 300C is fixed in the element holder 270C. Subsequently, as shown in section (d) of FIG. 18, the optical element 300C is situated in the laser light source 200C to function as a part of the laser light source 200C.

Functions and operations of the laser light source 200C according to the fourth embodiment are described.

The excitation light source 210 generates excitation light PL. The collimator lens 220 shapes the excitation light PL into parallel light. Subsequently, the condenser lens 230 condenses the excitation light PL into the solid-state laser medium 240C. When the excitation light PL is condensed in the solid-state laser medium 240C, laser oscillation of a 1060 nm band happens in the optical element 300C. The wavelength conversion element 250C thereafter performs wavelength conversion. The wavelength-converted light of a 530 nm band is emitted from the optical element 300C. In this embodiment, the condenser lens 230 is exemplified as the condensing optical element.

Figure 19:
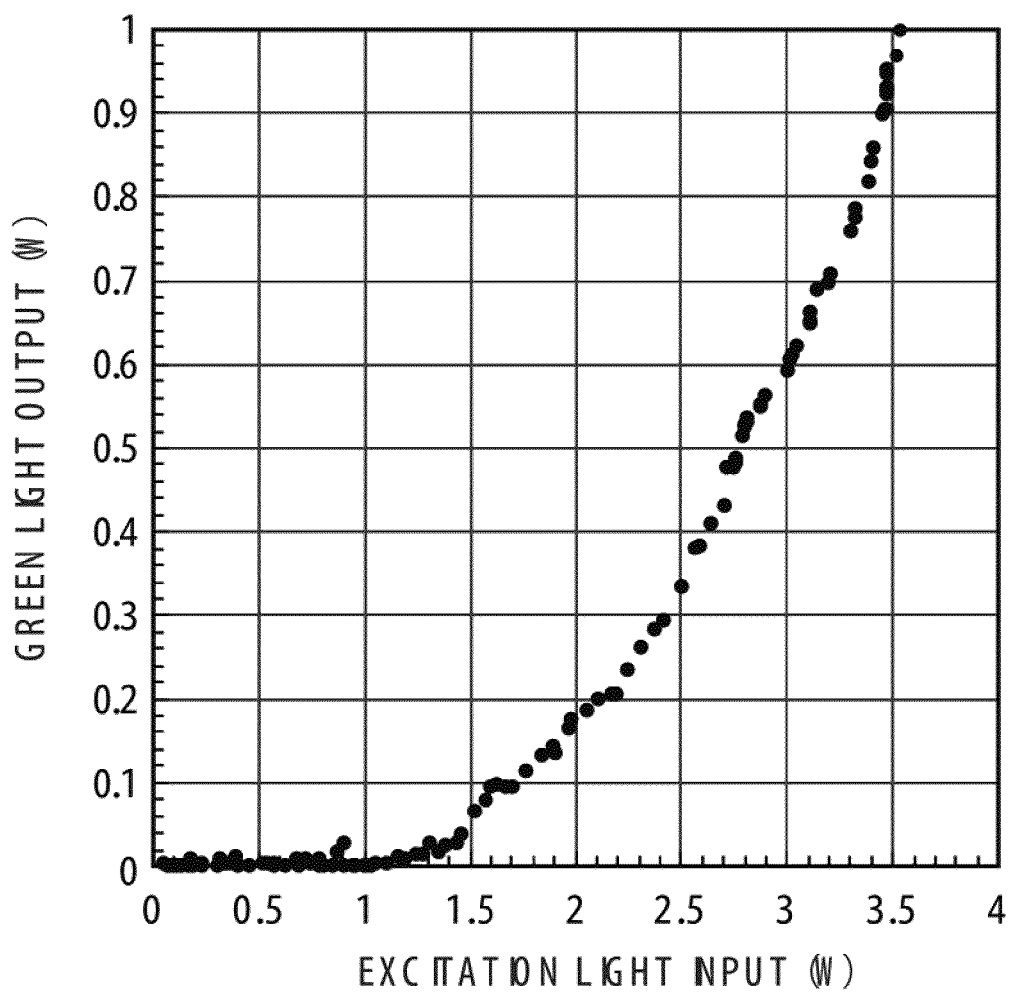
FIG. 19 is a plot diagram showing light I/O characteristics of the optical element during input of excitation light having a wavelength of 808 nm to the optical element.

FIG. 19 is a plot diagram showing light I/O characteristics of the optical element 300C when the excitation light PL having a wavelength of 808 nm is input to the optical element 300C. The light I/O characteristics of the optical element 300C are described with reference to FIGS. 17 to 19.

The horizontal axis of the plot diagram of FIG. 19 shows input intensity of the excitation light PL. The vertical axis of the plot diagram of FIG. 19 shows intensity of the output light, which is emitted from the optical element 300C. It may be understood from FIG. 19 that a harmonic output (green light) of 1 W is obtained.

The present inventors further researched a cross-sectional area in the bonding position CP, a bonding strength between the solid-state laser medium 240C and the wavelength conversion element 250C and their relationships with the harmonic output.

Figure 20:
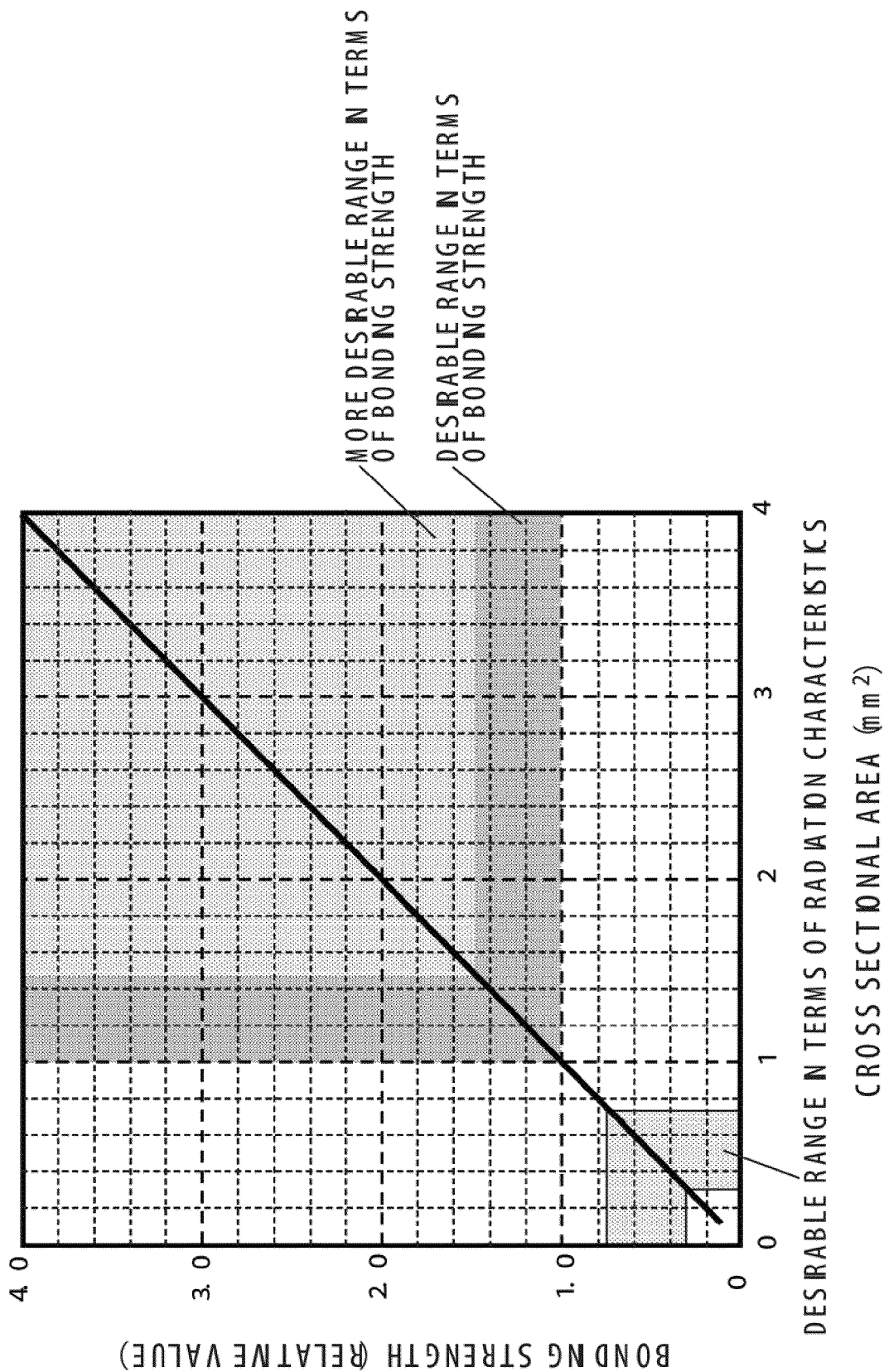
FIG. 20 is a graph showing a relationship between a cross-sectional area of the optical element and a bonding strength, which is required for a given harmonic output.

FIG. 20 is a graph showing a relationship between the cross-sectional area of the optical element 300C and the required bonding strength for a given harmonic output. The cross-sectional area in the bonding position CP, the bonding strength between the solid-state laser medium 240C and the wavelength conversion element 250C and their relationship with the harmonic output are described with reference to FIGS. 14, 18 and 20.

No less than 1 mm$^2$ of a bonding cross-sectional area was required as the bonding area for ensuring sufficient bonding strength to withstand stress caused by a difference in thermal expansion coefficient between the aforementioned solid-state laser medium 240C and the wavelength conversion element 250C (bonding strength for 1 mm$^2$ of the bonding cross-sectional area is hereinafter referred to as "1") in order to obtain a harmonic output (green light) no less than 500 mW. It was also figured out that a bonding strength of 1.5 times or more was required to obtain a harmonic output no less than 1 W. It was also figured out that heat radiation characteristics became worse because of an elongated distance from the beam path BP as the passing point of the laser beam to the outer circumferential surface of the solid-state laser medium 240C unless the cross-sectional area of the solid-state laser medium 240C was no more than 0.75 mm$^2$, which resulted in saturation of the output even if it was attempted to obtain a harmonic output no less than 500 mW.

In the following descriptions, the area of the first bonding surface 241C of the solid-state laser medium 240C, which is bonded to the wavelength conversion element 250C, is represented by symbol "S1". The area of the incident end surface 242 opposite to the first bonding surface 241C of the solid-state laser medium 240C is represented by symbol "S2". The area S1 greater than the area S2 contributes to a given radiation effect. It is preferable in terms of the bonding strength and the radiation effect that the relationship between the areas S1, S2 satisfies the following inequality relationship.

$$0.75 \times S1 > S2 \quad \text{(Formula I)}$$

In terms of the bonding strength, the cross-sectional area of the optical element 300C in the bonding position CP has to be at least 1 mm$^2$, and preferably 1.5 mm$^2$ or more. In terms of the radiation characteristics, the cross-sectional area perpendicular to the beam path BP (beam propagation direction) in the solid-state laser medium 240C is preferably no more than 0.75 mm$^2$. Based on the research conducted by the present inventors, it was figured out that the required sizes of the cross-sectional area in terms of the bonding strength and the radiation characteristics were contradictory.

Based on the aforementioned research results, in this embodiment, the cross-sectional area of the first bonding surface 241C of the solid-state laser medium 240C (and the cross-sectional area of the second bonding surface 252C of the wavelength conversion element 250C) is at least 1 mm$^2$, and preferably 1.5 mm$^2$ or more. The cross-sectional area of the solid-state laser medium 240C (cross-sectional area of portions excluding the portion where the rib 320 is formed) is no more than 0.75 mm$^2$. Consequently, even if emitted harmonic wave has no less than 500 W of output intensity, the radiation characteristics and element strength (bonding strength between the solid-state laser medium 240C and the wavelength conversion element 250C) of the optical element 300C may be preferably maintained.

Figure 21:
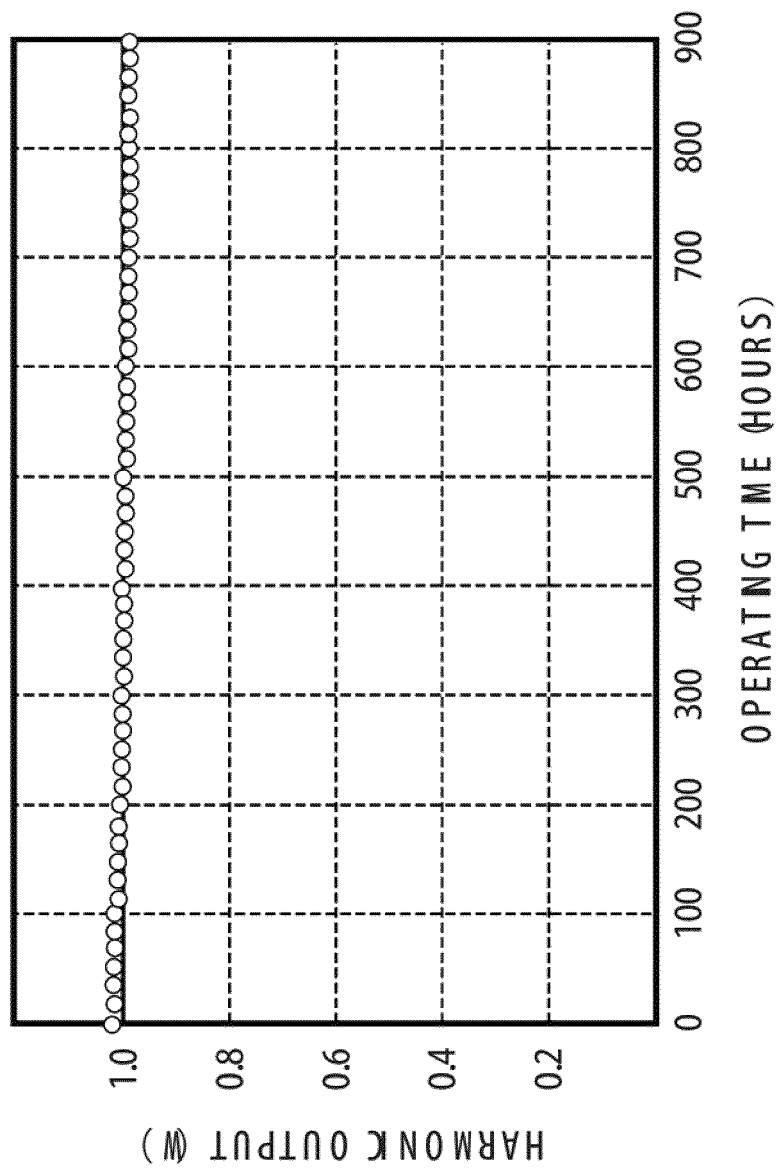
FIG. 21 is a plot diagram showing a relationship between operating time and harmonic output intensity during continuous operation of the laser light source including the optical element.

FIG. 21 is a plot diagram showing a relationship between operating time and harmonic output intensity during continuous operation of the laser light source 200C (wavelength conversion laser light source) comprising the optical element 300C according to this embodiment. The relationship between the operating time and the harmonic output intensity is described with reference to FIGS. 1, 13, 18 and 21.

As described with reference to FIG. 13, halt of laser oscillation was observed approximately 100 hours after beginning the operation of the standard laser light source 100 as shown in FIG. 1. On the other hand, as shown in FIG. 21, no less than 500 mW of output was stably obtained from the laser light source 200C comprising the optical element 300C according to this embodiment at 65° C. of temperature environment during a prolonged operation exceeding 900 hours.

It is described above that the optical element 300C provides advantageous effects in an optical system which outputs no less than 500 mW of harmonic wave. Similar effects are also given in an optical system which outputs less than 500 mW of harmonic wave. Even in the optical system with relatively small harmonic output intensity, enough strength of and preferable heat radiation from the optical element 300C in optical contact are both achieved. A laser light source according to the methodologies of the present embodiment achieves no less than 500 mW of output and is operable at a maximum operating temperature of 40° C. or higher.

<Rib>

Other features of the optical element 300C are described with reference to FIG. 17 once again.

As shown in FIG. 17, comparing the first bonding surface 241C with the incident end surface 242 of the solid-state laser medium 240C, one side length of the first bonding surface 241C is substantially equal to one side length of the incident end surface 242 in the width direction (w). On the other hand, one side length of the first bonding surface 241C is longer than one side length of the incident end surface 242 in the thickness direction (t). The lengths of the first bonding surface 241C and the incident end surface 242 in the z-axis direction are substantially equal whereas one side of the first bonding surface 241C in the y-axis direction is longer than the incident end surface 242.

A rib 320 extending in parallel to the z-axis (and c-axis of the wavelength conversion element 250C) is formed along the bonding position CP between the solid-state laser medium 240C and the wavelength conversion element 250C. A user may easily identify the direction of the crystal axis based on the rib 320 extending in one direction. For example, the excitation light which passes through vanadate-based crystal such as $YVO_4$ or $GdVO_4$ has to be input to have a polarizing direction parallel to the c-axis. The user may identify the c-axis direction based on the rib 320 of the optical element 300C (rib 320 extending in the polarizing direction of the excitation light). In this embodiment, the rib 320 is exemplified as the protrusion.

In this embodiment, the rib 320 is formed along the bonding position CP which appears on each lateral surface 310 of the optical element 300C. The rib may be formed along the bonding position which appears on the top and bottom surfaces (perpendicular surface of the optical element to the z-axis) of the optical element. Each side length of the first bonding surface may be longer than each side length of the incident end surface of the solid-state laser medium. The rib 320 may be formed such that the projection view of the first bonding surface covers the projection view of the incident end surface when viewing the solid-state laser medium from the incident end surface. Consequently, the bonding site between the solid-state laser medium and the wavelength conversion element protrudes both in the z and y axis directions, so that the bonding area between the solid-state laser medium and the wavelength conversion element becomes even larger than the incident end surface of the solid-state laser medium.

<Sealing Member>

The sealing member is described with reference to FIGS. 14 to 17 once again.

If the interface between the first bonding surface 241C of the solid-state laser medium 240C and the second bonding surface 252C of the wavelength conversion element 250C in optical contact becomes in contact with ambient air, the first bonding surface 241C is facilitated to separate from the second bonding surface 252C. It is likely that the sealant 245 situated along the bonding position CP between the solid-state laser medium 240C and the wavelength conversion element 250C prevents the interface between the first and second bonding surfaces 241C, 252C from coming in contact with ambient air. Accordingly, the bonding strength of the optical element 300C is maintained at a high level for a long period of time. It is likely that the sealant 245, which covers the periphery of the first and second bonding surfaces 241C, 252C, not only prevents the interface between the first and second bonding surfaces 241C, 252C from coming in contact with ambient air, but also prevents the deposition DP such as carbon from adhering across the beam path BP (See FIG. 14).

<Method for Manufacturing Optical Element>

A method for manufacturing the optical element 300C is described with reference to FIGS. 15 to 18 once again. It should be noted that the optical element 300C may be manufactured according to a method other than the manufacturing method described hereinafter.

As shown in FIG. 15, the bar-shaped optical element array 500 comprises a solid-state laser medium 240C and a wavelength conversion element 250C, which are optically bonded. The optical element 300C is manufactured by being separated from the optical element array 500. The optical bonding position CP between the solid-state laser medium 240C and the wavelength conversion element 250C is sealed with the sealant 245. The bar-shaped optical element array 500 is 1 mm in thickness (t), 2.5 mm in length (l), 10 mm in width (w). The length (l) of the optical element array 500 includes 0.5 mm of length dimension of the wavelength conversion element 250C and 2.0 mm of length dimension of the solid-state laser medium 240C.

When the materials of the solid-state laser medium 240C and the wavelength conversion element 250C are bonded together, the first and second notches 246, 257 have not been formed yet. After the materials of the solid-state laser medium 240C and the wavelength conversion element 250C are bonded together, the notches are provided from both sides of the solid-state laser medium 240C and the wavelength conversion element 250C by means of for example a dicing saw to form the first and second notches 246, 257, respectively. The first and second notches 246, 257 reach a position apart from the bonding position CP by 200 µm to 500 µm, respectively. In terms of yield upon separating the optical element 300C from the bar-shaped optical element array 500, it is preferable to provide notches (first and second notches 246, 257) to the materials of the solid-state laser medium 240C and the wavelength conversion element 250C until the cutting edge of the dicing saw reaches a position apart from the bonding position CP by 100 to 200 µm, respectively.

FIG. 22 is a photograph of the bar-shaped optical element array 500. Section (a) of FIG. 22 shows the overall optical element array 500. Section (b) of FIG. 22 is an enlarged photograph around the bonding position CP, the first and second notches 246, 257 of the optical element array 500. The method for manufacturing the optical element 300C is further described with reference to FIGS. 15 to 18 and FIG. 22.

As described above, the solid-state laser medium 240C is formed from $Nd:YVO_4$ crystal. The wavelength conversion element 250C is formed from $MgO:LiNbO_3$ in which a polarization inverted structure is formed thereto. The solid-state laser medium 240C and the wavelength conversion element 250C are optically bonded to form a piece to be processed into the optical element array 500.

As shown in section (b) of FIG. 22, the first and second notches 246, 257 are formed by means of a dicing saw so that the dicing saw does not reach the bonding position CP. The blade width of the dicing saw and the notch pitch are set to appropriate values, respectively to determine a desired value of the cross-sectional area of the solid-state laser medium 240C perpendicular to a light propagation direction.

As shown in sections (a) and (b) of FIG. 18, as described above, a part of the optical element array 500 formed with the first and second notches 246, 257 is separated at the notch section to be the optical element 300C. The narrowed area (refer to section (b) of FIG. 22), which is used for connecting the adjacent optical element 300C, may be easily broken, for example, by pressurization or bending, so that the optical element 300C may be separated.

The rib 320 protruding from the lateral surface 310 of the separated optical element 300C is sealed by means of the sealant 245 (refer to section (a) of FIG. 22). Subsequently, the optical element 300C is held by the element holder 270C as shown in section (c) of FIG. 18 to complete the laser light source 200C.

The present inventors measured the cross-sectional area of the optical element 300C, which was manufactured as described above. The cross-sectional area in the bonding position CP of the optical element 300C was 1.5 $mm^2$ (thickness 1.00 mm×width 1.50 mm). The cross-sectional area of the incident end surface (end surface to which the excitation light PL was incident) of the solid-state laser medium 240C was 0.75 $mm^2$ (thickness 1.00 mm×width 0.75 mm).

Several optical elements 300C are simultaneously manufactured according to the aforementioned manufacturing method. When the bar-shaped optical element array 500 is manufactured, the z-axis of the solid-state laser medium 240C and the c-axis of the wavelength conversion element 250C are positioned, and then the solid-state laser medium 240C and the wavelength conversion element 250C are bonded. Consequently, the bonding direction between the solid-state laser medium 240C and the wavelength conversion element 250C may be more easily determined than adjusting the axes between the solid-state laser medium 240C and the wavelength conversion element 250C of the individual optical elements 300C.

In this embodiment, the z-x plane of MgO:LiNbO$_3$ crystal and the a-c plane of Nd:YVO$_4$ crystal, which are used in the optical element 300C, are bonded. The bonding between MgO:LiNbO$_3$ crystal and Nd:YVO$_4$ crystal is adjusted so that the z-axis of MgO:LiNbO$_3$ crystal and the c-axis of Nd:YVO$_4$ crystal become parallel. Since the longitudinal direction of the rib 320 formed on the lateral surface 310 of the optical element 300C is parallel to the z-axis of MgO:LiNbO$_3$ crystal and the c-axis of Nd:YVO$_4$ crystal, a user may identify the direction of the optical element 300C based on the shape of the rib 320.

The rib 320 protruding from the lateral surface 310 shown in section (b) of FIG. 18 is formed on the y-z plane of MgO:LiNbO$_3$ crystal and the a-c plane of Nd:YVO$_4$ crystal. The longitudinal direction of the rib 320 coincides with the z-axis direction of MgO:LiNbO$_3$ crystal and the c-axis direction of Nd:YVO$_4$ crystal. If vanadate-based crystal such as YVO$_4$ or GdVO$_4$ is used, the excitation light PL has to be input to have a polarizing direction parallel to the c-axis. Since the user identifies the direction of the optical element 300C based on the rib 320, the optical element 300C may be relatively easily mounted.

The optical element 300C may be manufactured by means of a method other than the aforementioned manufacturing method. For example, the solid-state laser medium may be formed in advance so that the first bonding surface becomes larger than the incident end surface opposite to the first bonding surface. The solid-state laser medium may thereafter come in optical contact with the wavelength conversion element so as to form the optical element.

Fifth Embodiment

In this embodiment, an optical element in which an area ratio of the first bonding surface of the solid-state laser medium to the incident end surface of the solid-state laser medium is greater than the optical element 300C according to the fourth embodiment is described.

Figure 23:
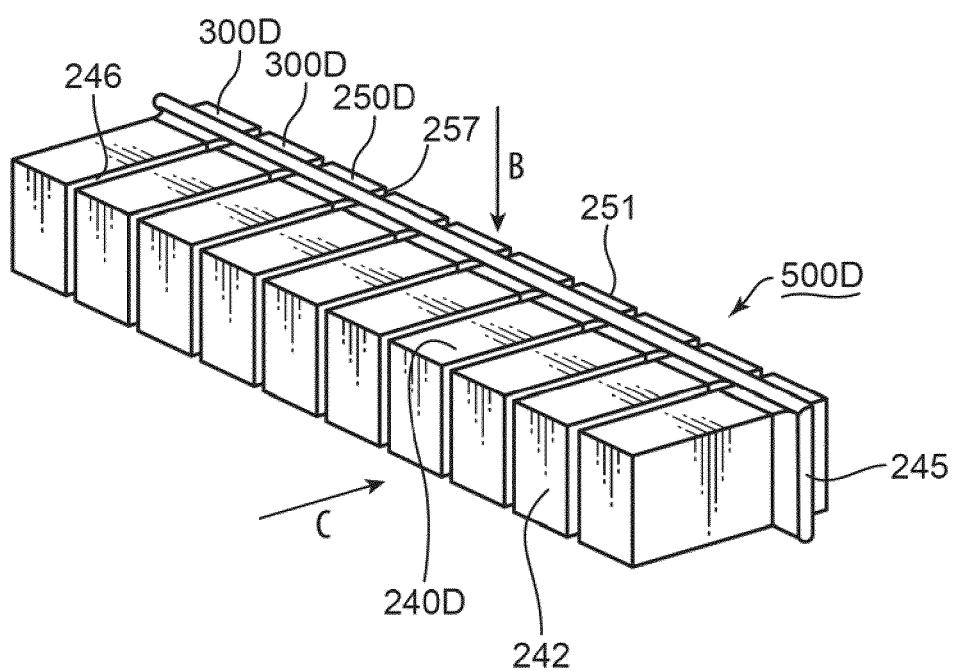
FIG. 23 is a schematic perspective view of an optical element array according to the fifth embodiment.
Figure 24:
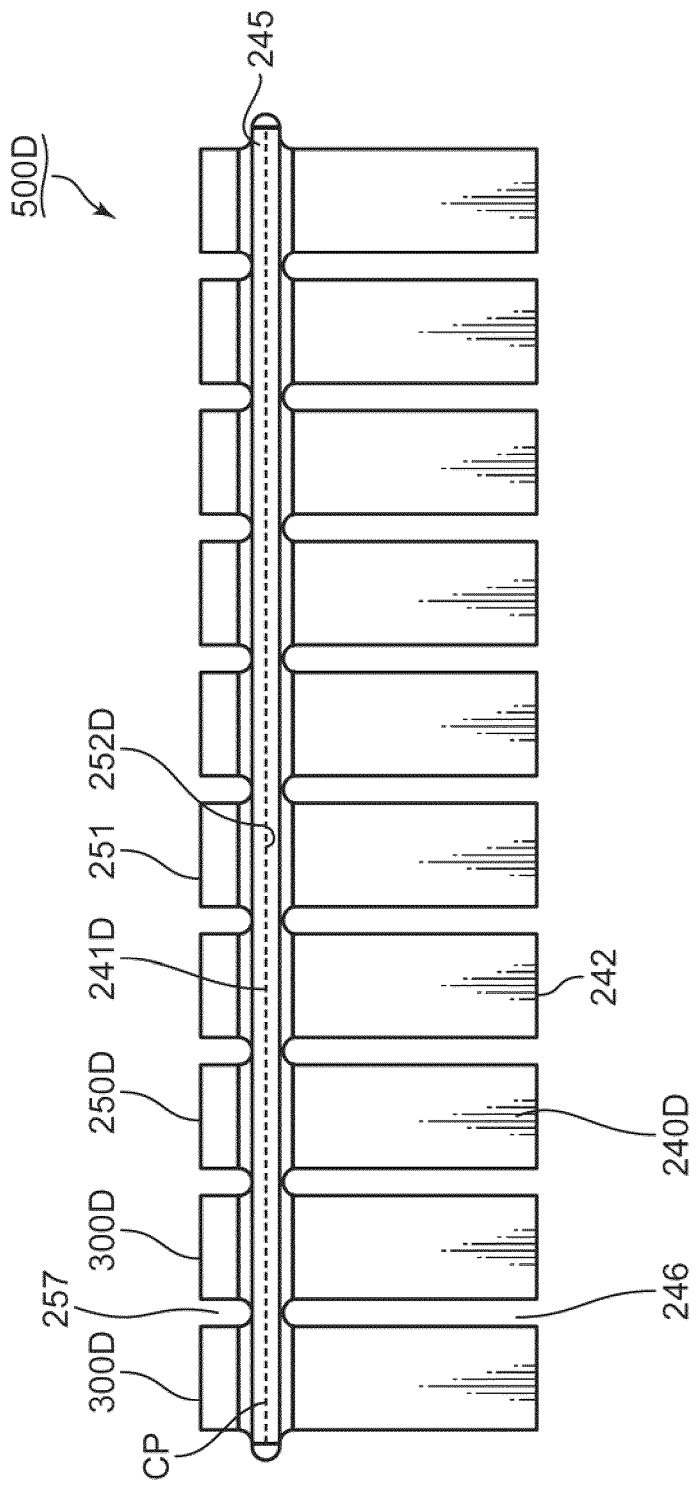
FIG. 24 is a plan view of the optical element array shown in FIG. 23.
Figure 25:
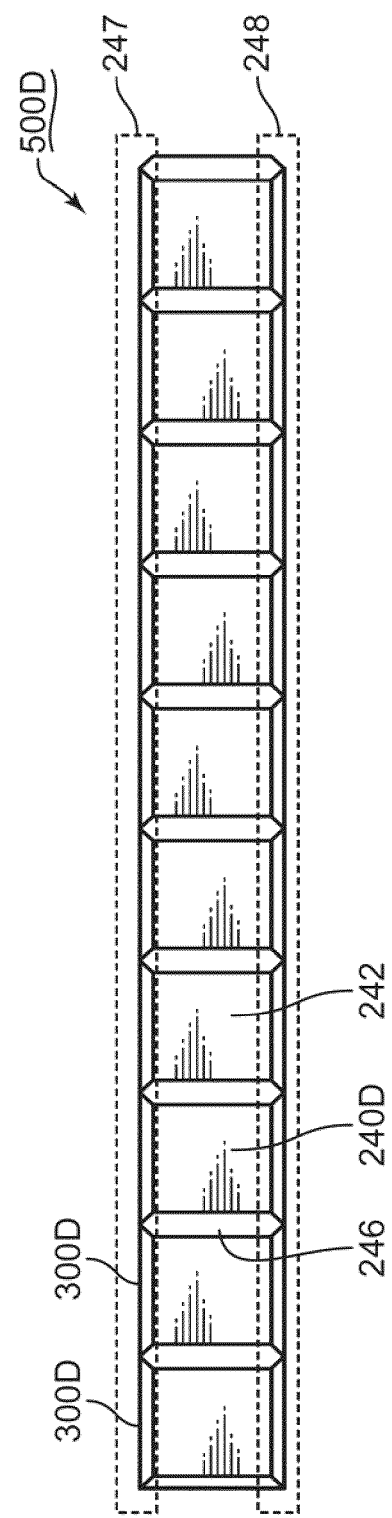
FIG. 25 is a front view of the optical element array shown in FIG. 23.

FIG. 23 is a schematic perspective view of the optical element array according to the fifth embodiment. FIG. 24 is a plan view of the optical element array shown in FIG. 23 (diagram viewed from the direction shown with the arrow B in FIG. 23). FIG. 25 is a front view of the optical element array shown in FIG. 23 (diagram viewed from the direction shown with the arrow C in FIG. 23). The optical element array is described with reference to FIGS. 23 to 25. The same elements as the elements described in the context of the fourth embodiment are given the same reference numeral. The descriptions of the fourth embodiment are incorporated for such same elements.

The bar-shaped optical element array 500D comprises a solid-state laser medium 240D, a wavelength conversion element 250D, and sealant 245. In FIG. 24, the bonding site between the solid-state laser medium 240D and the wavelength conversion element 250D is shown as the bonding position CP. The sealant 245 is situated along the bonding position CP.

The solid-state laser medium 240D includes an incident end surface 242 to which the excitation light is incident, and a first bonding surface 241D, which is bonded to the wavelength conversion element 250D. The solid-state laser medium 240D is formed with a first notch 246 which extends from the incident end surface 242 toward the bonding position CP.

The wavelength conversion element 250D includes an emitting end surface 251 from which the output light is emitted, and a second bonding surface 252D, which is bonded to the first bonding surface 241D of the solid-state laser medium 240D. The wavelength conversion element 250D is formed with a second notch 257, which extends from the emitting end surface 251 toward the bonding position CP.

The optical element 300D is formed through the formation of the first and second notches 246, 257.

For example, the optical contact between the first bonding surface 241D of the solid-state laser medium 240D and the second bonding surface 252D of the wavelength conversion element 250D is created to integrate the solid-state laser medium 240D with the wavelength conversion element 250D.

FIG. 25 shows cutting portions (upper cutting portion 247 and lower cutting portion 248) of the solid-state laser medium 240D with a dotted line.

The sealant 245 seals the periphery of the bonding position CP between the solid-state laser medium 240D and the wavelength conversion element 250D, which are optically bonded together. Like the fourth embodiment, the optical element 300D may be easily separated from the optical element array 500D due to the first and second notches 246, 257, which are formed by means of a dicing saw.

In this embodiment, the solid-state laser medium 240D is formed from YVO$_4$ crystal. Unlike the fourth embodiment, as shown in FIG. 25, the a-a plane of YVO$_4$ crystal (solid-state laser medium 240D) is also diced to reduce the thickness of the c-axis direction. The upper and lower cutting portions 247, 248 of FIG. 25 show portions cut by dicing. The upper and lower cutting portions 247, 248 are cut, so that the cross-sectional area other than the bonding position CP where the solid-state laser medium 240 is in optical contact (distance from the beam path to the outer circumferential surface of the solid-state laser medium 240D) is reduced, in order to facilitate to release heat, which is generated from beam path portions of the solid-state laser.

The bar-shaped optical element array 500D is twice notched by a dicing saw from sides of the wavelength conversion element 250D and the solid-state laser medium 240 to form the notches (first and second notches 246, 257). Therefore it becomes less likely that cut fragments from the incident end surface 242 of the solid-state laser medium 240D and the emitting end surface 251 of the wavelength conversion element 250D adhere to the cutting edge of the dicing saw and cause chipping, which results in better yield in the manufacture of the optical element array 500D.

The blade width of the dicing saw is selected as appropriate. For example, the width of the first notch 246 formed on the solid-state laser medium 240D is preferably greater than the width of the second notch 257 formed on the wavelength conversion element 250D so as to improve the radiation performance of the solid-state laser medium 240D.

The area of the emitting end surface 251 of the optical elements 300C, 300D according to the fourth and fifth embodiments may be greater than the area of the incident end surface 242. Consequently, the direction of the optical elements 300C, 300D may be automatically and more easily identified by image processing methodologies.

In the fourth and fifth embodiments, the solid-state laser mediums 240C, 240D are formed from Nd:YVO$_4$ crystal. The wavelength conversion elements 250C, 250D are formed from MgO:LiNbO$_3$ crystal in which polarization inverted structures are formed, respectively. Alternatively, if the materials of the solid-state laser medium and the wavelength conversion element are in optical contact without interposing an optical thin film and a difference in refractive index between both materials is no more than 0.1, other materials such as Nd:GdVO$_4$ crystal or MgO:LiTaO$_3$ crystal may be used for the solid-state laser medium and the wavelength conversion element. The optical element, which includes the solid-state laser medium and the wavelength conversion element formed from other materials, also delivers the effects described in the context of the fourth and fifth embodiments.

The solid-state laser medium and the wavelength conversion element may be bonded via an optical thin film. If the solid-state laser medium and the wavelength conversion element are bonded by an optical thin film which is designed and deposited so as to conform to a difference in refractive index between the solid-state laser medium and the wavelength conversion element, the light reflection at the bonding portion between the solid-state laser medium and the wavelength conversion element may be sufficiently reduced. For example, the solid-state laser medium may be formed from YAG or other garnet-based ceramic laser medium, YAG crystal, or a ceramic material other than ceramic YAG (for example, various translucent ceramic materials such as ceramic $Y_2O_3$). The optical element, which includes the solid-state laser medium formed from the aforementioned materials and bonded via an optical thin film, also provides the effects described in the context of the fourth and fifth embodiments.

The wavelength conversion element may be formed from various materials such as KTP ($KTiOPO_4$) and KTA ($KTiOAsO_4$). The optical element including the wavelength conversion element formed from these materials also provides the effects described in the context of the fourth and fifth embodiments.

In this embodiment, the solid-state laser medium 240D is formed with Nd-doped $YVO_4$ crystal. Alternatively, the solid-state laser medium may be formed with a material which uses laser active ions other than Nd. The optical element with the solid-state laser medium formed from a material which uses laser active ions other than Nd also provides the aforementioned superior effects.

The methodologies of this embodiment may be applied to ceramic materials other than ceramic YAG (for example, various translucent ceramic materials such as ceramic $Y_2O_3$).

Sixth Embodiment

Figure 26:
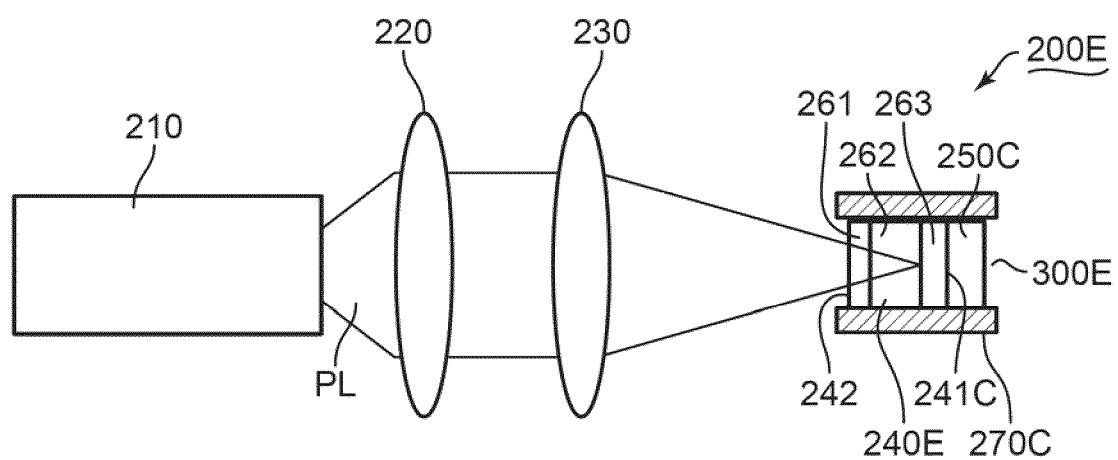
FIG. 26 is a schematic view of a laser light source according to the sixth embodiment.

FIG. 26 is a schematic view of the laser light source according to the sixth embodiment. The same elements as the elements described in the context of the fourth embodiment are given the same reference numeral. The descriptions of the fourth embodiment are incorporated for such same elements.

The laser light source 200E comprises an excitation light source 210 which generates excitation light PL, a collimator lens 220, a condenser lens 230, an optical element 300E and an element holder 270C configured to hold the optical element 300E. The optical element 300E comprises a wavelength conversion element 250C and a solid-state laser medium 240E.

The excitation light source 210 generates excitation light PL. The collimator lens 220 shapes the excitation light PL into parallel light. Subsequently, the condenser lens 230 condenses the excitation light PL into the solid-state laser medium 240E. When the excitation light PL is condensed in the solid-state laser medium 240E, laser oscillation happens in the optical element 300E. The wavelength conversion element 250C thereafter performs wavelength conversion. The wavelength-converted light is emitted through the wavelength conversion element 250C. In this embodiment, the wavelength conversion element 250C is exemplified as the emitting portion.

Figure 27:
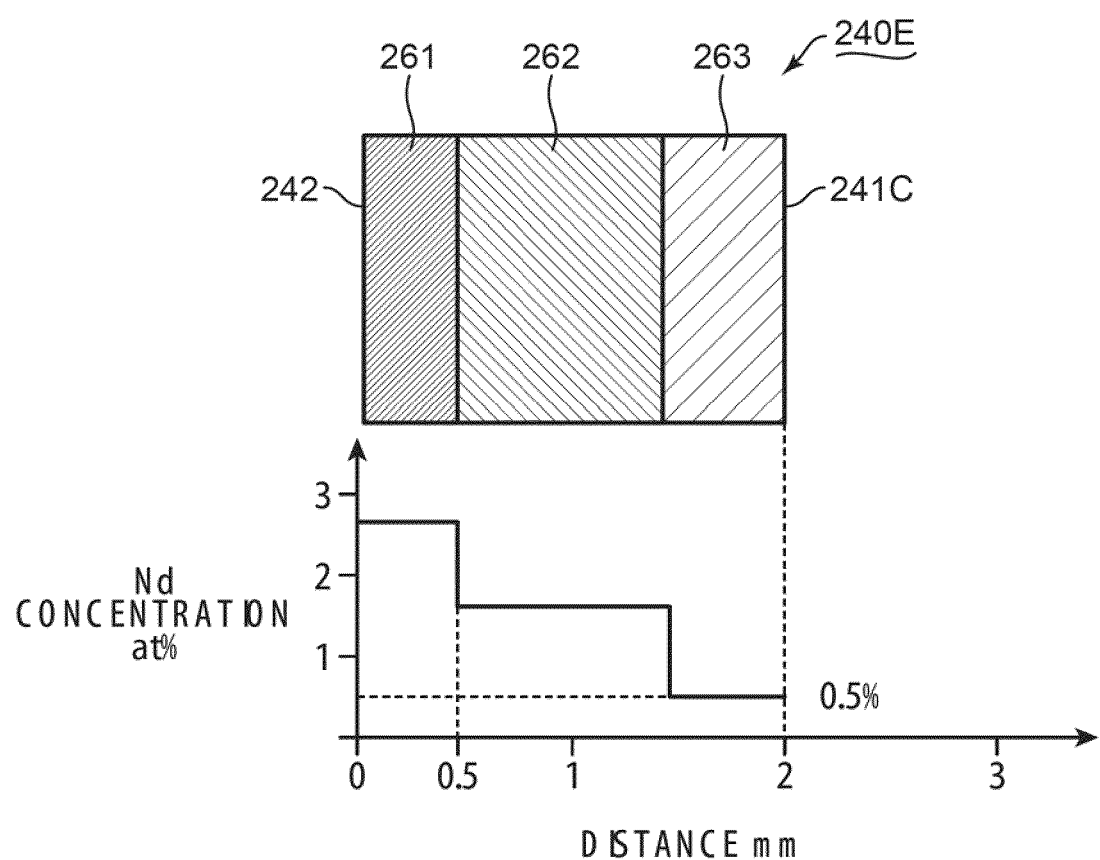
FIG. 27 is a schematic view of a solid-state laser medium and a concentration distribution of laser active substances in the solid-state laser medium.

FIG. 27 is a schematic view of the solid-state laser medium 240E and concentration distribution of the laser active substances in the solid-state laser medium 240E. The laser light source 200E is further described with reference to FIGS. 1, 26 and 27.

The solid-state laser medium 240E includes an incident end surface 242 to which the excitation light PL is incident, and a first bonding surface 241C, which is bonded to the wavelength conversion element 250C. The solid-state laser medium 240E includes three regions (first region 261, second region 262 and third region 263) which are aligned from the incident end surface 242 toward the first bonding surface 241C. The first region 261 is adjacent to the incident end surface 242. The third region 263 is adjacent to the first bonding surface 241C. The second region 262 is situated between the first and third regions 261, 263.

In this embodiment, Nd is added to the solid-state laser medium 240E as the laser active substances. The concentration of the laser active substances is changed step by step among the first, second and third regions 261, 262, 263. Consequently, the region (position along the propagation direction of the beam in the solid-state laser medium 240E) which absorbs the excitation light changes in response to an ambient temperature around the solid-state laser medium 240E, so that the operating temperature range is expanded. Even if the ambient temperature shifts the oscillation wavelength of the excitation light source 210 so that the excitation light PL is not absorbed in the region of 0.5 mm from the incident end surface 242 (i.e. the first region 261), the solid-state laser medium 240E having the concentration profile shown in FIG. 27 (the highest Nd concentration in the first region 261, the second highest Nd concentration in the second region 262, and the lowest Nd concentration in the third region 263), which is used as the laser light source 200E, allows absorption of the excitation light PL in the subsequent second and/or third regions 262, 263. Therefore the absorbed amount of the excitation light PL by the solid-state laser medium 240E becomes substantial consistent.

The Nd concentration of the first region 261 of the solid-state laser medium 240E shown in FIG. 27 is 2.5%. It should be noted that the first region 261 is 0.5 mm in thickness from the incident end surface 242. The second region 262 adjacent to the first region 261 is 1 mm in thickness, and the Nd concentration in the second region 262 is 1.5%. The third region 263 adjacent to the second region 262 is 0.5 mm in thickness, and the Nd concentration in the third region 263 is 0.5%. Thus, the Nd concentration in the solid-state laser medium 240E decreases step by step from the excitation light source 210 to the wavelength conversion element 250C.

The optical element 300E according to this embodiment has the shape (shape which facilitates thermal radiation) described in the context of the fourth and/or fifth embodiments. Accordingly, the operating temperature of the laser light source 200E according to this embodiment is expanded to a range of 0 to 70° C. whereas the operating temperature range of the laser light source 100 described in the context of FIG. 1 is approximately 20 to 40° C.

The stepwise change in Nd concentration may be achieved by superposing or bonding different single crystal mediums such as $GdVO_4$ or $YVO_4$. In this case, the effect of expanding the operating temperature range of the laser light source may also be achieved.

For example, if the concentration of the laser active substances in the solid-state laser medium is simply increased, the laser active substances absorb the oscillated light to prevent laser oscillation. The aforementioned problem may be resolved by using the solid-state laser medium having several dopant concentration profiles according to the methodologies of this embodiment.

Seventh Embodiment

In this embodiment, a highly environment-resistant (in particular, high temperature resistance characteristics) optical contact assembly (optical contact assembly having an optical element structure), which is made from different types of materials, is described.

There are a technique for superposing several optical members with adhesive and a technique for directly bonding several optical members as techniques for forming an optical element from several optical members. The advantages of the direct bonding technique over the superposing technique using adhesive are described hereinafter.

A functional optical element including integrated optical members is effective for downsizing and cost reduction of optical elements. The integration of optical members contributes to fixation of a relative position between the optical members, which results in stable functions of the optical elements.

The superposing technique using adhesive is generally used to integrate the optical members. For example, functional thin films are formed on binding surfaces of the optical members, so that the optical members are adhered to each other to form an optical element, which performs wavelength separation and polarization separation.

The direct bonding techniques are known as another method for integrating the optical members. Optical members are firmly bonded without adhesive by means of the direct bonding technique. Optical members formed from various materials such as glass, semiconductor, ferroelectric or piezoelectric ceramics are very precisely bonded by means of the direct bonding technique. The "optical contact/optical contact condition" as used in this embodiment is one of the direct bonding techniques in a broad sense. A standard direct bonding technique is generally described hereinafter as well as the optical contact shown in this embodiment.

The directly bonded body, which is formed by means of the aforementioned direct bonding technique, is used, for example, as an optical waveguide. One of two different optical members, which are directly bonded, is formed into a thin plate, and then they are subjected to a ridge process to form the optical waveguide. This kind of optical wave guide formation becomes known as attractive methodologies because it is effective for manufacturing optical elements.

It has been proposed to directly bond the same types of substrates or different types of substrates which have substantially equivalent refractive indexes and/or thermal expansion coefficients, such as various oxide crystal substrates made of $LiNbO_3$ crystal (hereinafter referred to as "LN crystal"), $LiTaO_3$ crystal (hereinafter referred to as "LT crystal"), MgO: LN crystal or sapphire.

It has also been proposed to use a thin film for bonding between these substrates. Various materials such as $SiO_2$, SiN, low melting point glass, and metal oxide may be exemplified as the thin film material used in this bonding.

If a precisely processed thickness from the bonding surface to a surface of the optical member, a precise distance from the bonding surface to the surface of the optical member, the surface inclination of the optical member with respect to the bonding surface or precise surface flatness is required, the direct bonding technique is more advantageous than the bonding technique using adhesive, because a thickness distribution of the adhesive may deteriorate functions of the optical element.

In addition, if the laser beam passes through the binding surface of the optical member, the adhesive (for example, epoxy resin or acrylate resin) causes optical power losses due to optical absorption and light scattering. A high power laser beam passing through the binding surface of the optical member may potentially deteriorate the adhesive layer on the binding surface (for example, separation, burning or discoloration). Accordingly, if a laser beam passes through between optical members, the direct bonding technique for integrating the optical members without an intermediate material such as adhesive is advantageous.

As described above, it is one of the advantageous applications of the direct bonding technique to firmly and precisely bond optical members to fabricate a functional device, which has various characteristics. In particular, the direct bonding technique is effective if different optical members in characteristics are bonded together.

A direct bonded body made from different types of substrates including glass and LN or LT crystal is exemplified as a directly bonded body including different types of materials with ferroelectric crystal. These different types of substrates are generally subjected to a heating process under a temperature condition from several 100° C. to 1000° C., so that they are directly bonded. Accordingly, a substantially equivalent thermal expansion coefficient of these bonded substrates is required to form a directly bonded body including these different types of materials. Accordingly, in comparison to the direct bonding of the aforementioned glass and LN or LT crystal, it is easier to directly bond different materials in refractive index, which have substantially equivalent thermal expansion coefficients such as a LN crystal and a MgO:LN crystal than the forgoing direct bonding between glass and LN or LT crystal.

If directly bonded members are the same type or series of materials (for example, LN crystal and MgO:LN crystal), the aforementioned heating process integrates crystal structures at the boundary between the directly bonded members (structurally makes a bulk crystal state without a bonded boundary), which results in high bonding strength of a bonded body.

Since there are mismatches of the crystal structure and lattice constant between different types of crystal materials, it is difficult to integrate crystal structures between the optical members of the different types of crystal materials, for example, even if the aforementioned heating process is performed to directly bond the optical members. Accordingly, it becomes more important to ensure optical characteristics and environment resistance performance under a tightly attached or adsorbed condition (defined as "in optical contact condition" in this embodiment) between optical members including different types of materials, which are integrated into an optical element without processes such as the heating process to create a firm binding condition between the different materials.

The difference in thermal expansion coefficient between the different types of the optical members leads to a difference in an expansion amount between the tightly attached optical members during the heating process. Consequently, stress generated in the tightly attached optical members may cause separation at the binding surface and/or cracks of the optical members if the optical members are structurally weak.

The present inventors conducted intensive study for enhancing the environment resistance characteristics (mainly thermal resistance) of the optical element structure made from different types of optical members in optical contact. As described in this embodiment, the present inventors figured out that an optical element structure with high environment resistance characteristics may be obtained by forming a concavity or a notch on the periphery of the optical contact surface, and using a sealing member situated in the concavity or the notch to cover the periphery of the bonding surface.

According to the methodologies of this embodiment, an optical contact assembly including several optical members may be manufactured without depending on materials. The methodologies of this embodiment broaden selectivity of materials and optical members, to be advantageously applied for manufacturing various optical elements.

Figure 28:
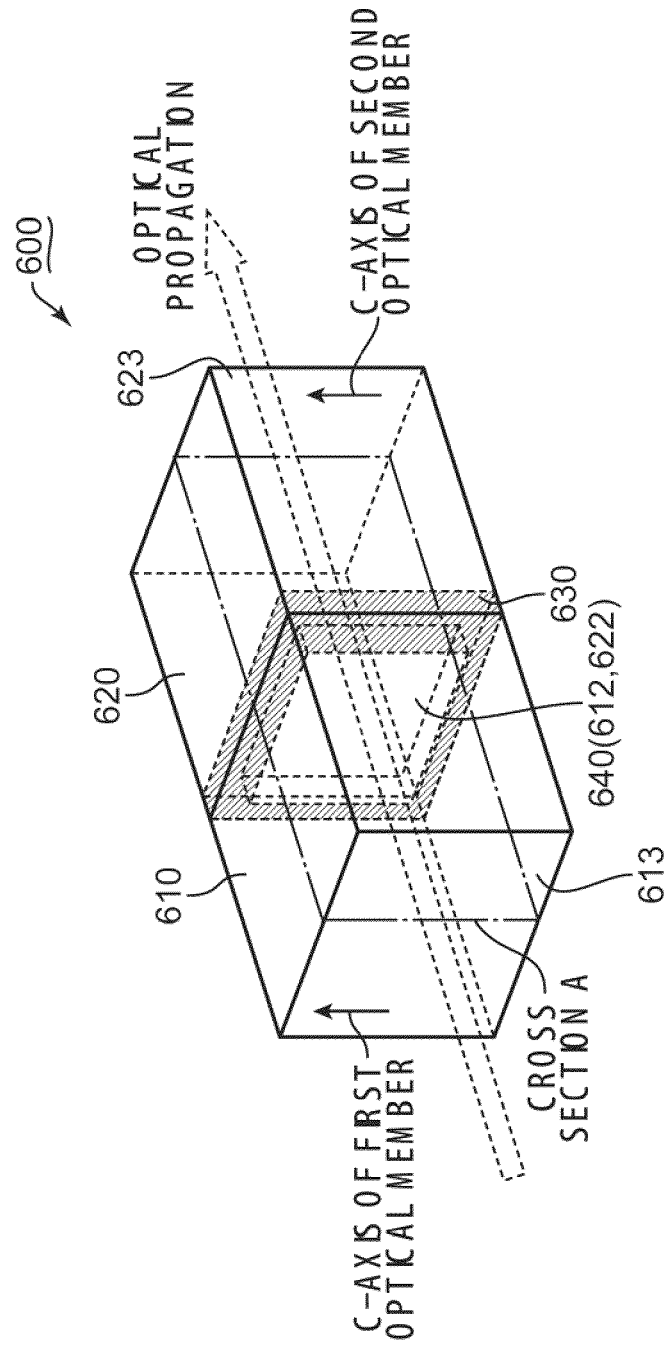
FIG. 28 is a perspective view of the optical element fabricated by means of optical contact between different optical members in materials.
Figure 29:
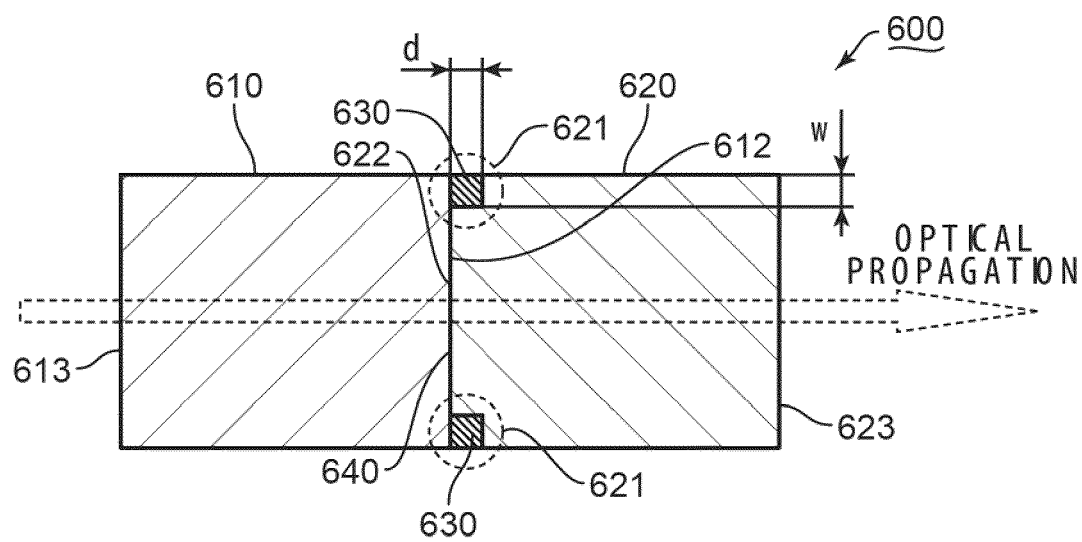
FIG. 29 schematically shows the cross section A shown in FIG. 28.

The optical element of this embodiment is described. FIG. 28 is a perspective view of the optical element, which is fabricated by means of optical contact of optical members that are different types of materials according to this embodiment. FIG. 29 schematically shows the cross section A shown in FIG. 28.

The optical element 600 comprises a first optical member 610 and a second optical member 620. Optical contact between the first and second optical members 610, 620 is created to form an optical contact surface 640. In this embodiment, laser crystal made from Nd:YVO$_4$ is exemplified as the first optical member 610, and MgO:LN crystal is exemplified as the second optical member 620. Alternatively, as long as the first and second optical members are formed from different types of materials, the first and second optical members may be formed from other materials.

The optical element 600 comprises sealant 630. The sealant 630 is formed from ultraviolet curable resin. The second optical member 620 includes a notch 621 (refer to FIG. 29) which is formed by slitting a part of MgO:LN crystal. The sealant 630 is situated in the notch 621.

As shown in FIGS. 28 and 29, the first and second optical members 610, 620 are bonded at the optical contact surface 640 by means of the optical contact process without the interposing an adhesive layer such as resin. The first optical member 610 includes a first principal plane 612, which is bonded to the second optical member 620. The second optical member 620 includes a second principal plane 622, which is bonded to the first principal plane 612 of the first optical member 610 to form the optical contact surface 640. The first and second principal planes 612, 622 are at least partially subjected to optical polishing (mirror polishing). The second principal plane 622 is molecularly bonded to the first principal plane 612 with hydrogen bonding, so that the second optical member 620 is adsorbed to the first optical member 610.

A part of MgO:LN crystal in contact with the second principal plane 622 of the second optical member 620 is subjected to a stepping process to form a groove, which surrounds the periphery of the second principal plane 622. The first and second optical members 610, 620 are not in contact at the portion where the notch 621 adjacent to the optical contact surface 640 is formed. The ultraviolet curable resin used as the sealant 630 is filled in the notch 621. The sealant 630 covers the periphery of the optical contact surface 640 to seal the optical contact surface 640. In this embodiment, the notch 621 is formed on the second optical member 620. Alternatively, the notch may be formed on the first optical member. Instead of the notch, a concavity into which the sealing member is situated may be formed on the first and/or second optical members.

In this embodiment, the laser crystal (Nd:YVO$_4$ crystal) used as the first optical member 610 and MgO:LN crystal used as the second optical member 620 are both optically uniaxial anisotropic crystals. As shown in FIG. 28, the c-axis of the laser crystal used as the first optical member 610 and the c-axis (i.e. the Z axis) of MgO:LN crystal used as the second optical member 620 are both parallel to the optical contact surface 640. The c-axis of the laser crystal used as the first optical member 610 and the c-axis of MgO:LN crystal used as the second optical member 620 both extend in the substantially same direction (i.e. these c-axes are substantially parallel).

A notch 621 is formed on MgO:LN crystal used as the second optical member 620 in order to manufacture the optical element 600 shown in FIGS. 28 and 29. The notch 621 may be formed by means of various methods. In this embodiment, the notch 621 is formed by a dicing process.

The second optical member 620 includes an emitting end surface 623 opposite to the second principal plane 622 in addition to the second principal plane 622 in the optical contact. The second principal plane 622 and the emitting end surface 623 of the second optical member 620 are both subjected to mirror polishing. The second optical member 620 is a crystal substrate which keeps a high level of parallelism between the second principal plane 622 and the emitting end surface 623 (for instance, no more than 0.1 microns per 1 mm in thickness between the second principal plane 622 and the emitting end surface 623).

A dicing groove is formed on the second optical member 620 to shape a square or rectangular second principal plane 622 (several 100 microns×several 100 microns to several mm×several mm) to be in the optical contact. The dicing groove is, for example, approximately 0.2 to 1 mm in width (w) (distance from the lateral surface of the second optical member 620, which is parallel to the light propagation direction, to the periphery of the second principal plane 622). The step from the second principal plane 622 (depth (d) which defines a separation distance between the first and second optical members 610, 620) is approximately 10 to 300 microns. Alternatively, the depth (d) of the dicing groove may be within a range of 1 micron or more and 500 microns or less.

MgO:LN crystal used as the second optical member 620 is completely cut with keeping the dicing-grooved portion adjacent to the second principal plane 622 to form a block of the second optical member 620 (MgO:LN crystal) with the notch 621.

The first optical member 610 includes an incident end surface 613 opposite to the first principal plane 612 in addition to the first principal plane 612 to be in optical contact. The first principal plane 612 and the incident end surface 613 of the first optical member 610 are both subjected to mirror polishing. The first optical member 610 is a crystal substrate which keeps a high level of parallelism between the first principal plane 612 and the incident end surface 613 (for instance, no more than 0.1 microns per 1 mm in thickness between the first principal plane 612 and the incident end surface 613).

The laser crystal used as the first optical member 610 is cut into blocks by dicing to form a first optical member 610 comprising the larger first principal plane 612 than the second principal plane 622. It should be noted that an appearance of the first optical member 610 is substantially equal to an appearance of the second optical member 620.

Subsequently, the first and second principal planes 612, 622 of the first and second optical members 610, 620 are subjected to hydrophilic treatment. The first and second principal planes 612, 622 of the first and second optical members 610, 620 are subjected to ultrasonic cleaning with, for example, acetone. Subsequently, the first and second principal planes 612, 622 of the first and second optical members 610, 620 are immersed in mixed solution of ammonia water:

hydrogen peroxide water:deionized water=1:1:6 warmed to approximately 60 to 70° C. (hereinafter referred to as the "ammonia hydroxide") for 15 minutes or longer. After rinse process with deionized water, the first and second principal planes 612, 622 of the first and second optical members 610, 620 are subjected to drying process.

After the drying process, the first principal plane 612 of the first optical member 610 comes in contact with the second principal plane 622 of the second optical member 620 so that the direction of the crystal axis of the laser crystal used as the first optical member 610 coincides with the direction of the crystal axis of MgO:LN used as the second optical member 620. Subsequently, the first and second principal planes 612, 622 are slightly pressurized, which results in adsorption between the first and second principal planes 612, 622 to form the optical contact surface 640.

The ultraviolet curable resin used as the sealant 630 is applied and filled in the notch 621 surrounding the periphery of the optical contact surface 640. Consequently, the sealant 630 substantially blocks the periphery of the optical contact surface 640 from ambient air. Subsequently, ultraviolet rays of approximately several 10 mJ are irradiated on the ultraviolet curable resin. Consequently, the ultraviolet curable resin is cured to become the sealant 630. The optical contact assembly (integrated optical element) including the optical members is thereby manufactured according to this embodiment.

This embodiment is characterized in the notch 621 formed along the periphery of the optical contact surface 640 and the sealant 630 provided to the notch 621. The advantageous effects arisen from the notch 621 and the sealant 630 are described hereinafter.

The present inventors used Nd:YVO$_4$ crystal (first optical member 610) and MgO:LN crystal (second optical member 620) and subjected the first and second principal planes 612, 622 to hydrophilic treatment and adsorption process for adsorbing the first and second principal planes 612, 622 to fabricate an optical contact assembly of crystal substrates which had an area between different types of materials (area of the optical contact surface) that was approximately 1 mm×1 mm to 15 mm×15 mm. The present inventors evaluated bonding strength and environment resistance characteristics such as thermal resistance of the manufactured optical contact assembly.

In general, a bonding strength of the superposition or bonding between surfaces (separation rate with respect to a tensile force under simple description) is dependent on an area size of the binding/bonding surface. A larger binding/bonding surface results in a greater bonding strength.

The present inventors conducted a tensile strength test under a normal temperature and confirmed that the bonding strength of the optical contact assembly (optical element 600) formed from different types of materials, which included the adsorbed first and second principal planes 612, 622, respectively, increased as the optical contact surface 640 became larger.

The present inventors further confirmed that the area of the optical contact surface 640 affected how easy to create an adsorbed condition between the first and second principal planes 612, 622 during manufacturing the optical contact assembly (optical element 600). If a manufactured optical contact assembly (optical element 600) has a large optical contact surface 640, the overall adsorbed condition of the optical contact surface 640 may be easily achieved under relatively small pressurization. Even if there were foreign objects (contamination) of approximately several microns between the first an second principal planes 612, 622 of the first and second optical members 610, 620 in optical contact, the adsorbed condition was kept excluding the periphery of the foreign objects (region of several 10 microns). As the area of the optical contact surface 640 became small, the pressurization required for obtaining the adsorption between the first and second principal planes 612, 622 increased. The foreign objects of approximately several microns which intervened between the first and second principal planes 612, 622 of the first and second optical members 610, 620 was likely to interfere with the adsorption between the first and second principal planes 612, 622. In particular, if the optical contact surface 640 was a size of 2 mm×2 mm or less, the aforementioned tendency became significant, so that sufficient washing and cleaning for the first and second principal planes 612, 622 of the first and second optical members 610, 620 as well as pressurization of several kgf/cm$^2$ or more became required.

The present inventors further examined separation at the optical contact surface 640 if external gas or moisture was infiltrated into the optical contact surface 640 in the adsorbed condition. The present inventors manufactured several types of optical contact assemblies having different areas of the optical contact surface 640 with crystal substrates made of different types of materials. Subsequently, the present inventors immersed the optical contact assemblies in deionized water, and observed occurrence and progress of the separation at the optical contact surface 640 caused by water infiltration from the periphery of the optical contact surface 640.

As a result of the observation, it was figured out that, if the area of the optical contact surface 640 was small (for example, approximately 3 mm×3 mm or less), the overall optical contact surface 640 separated easily. If the area of the optical contact surface 640 was 10 mm×10 mm or more, it took a relatively long period of time for the separation to expand to the entire optical contact surface 640 even though there was separation nearby the periphery of the optical contact surface 640. In particular, it was less likely to observe separation at the center region of the optical contact surface 640, which was apart from the periphery by approximately 3 mm from the periphery.

If optical members (first and second optical members 610, 620) made of different types of materials are in optical contact, it is expected that a difference in thermal expansion coefficient between these members considerably affect failure modes such as the separation at the optical contact surface 640 or cracks of these members. Table 1 shows comparison of the physical properties of Nd:YVO$_4$ crystal (first optical member 610) and MgO:LN crystal (second optical member 620). It should be noted that the physical properties shown in Table 1 are known values.

TABLE 1

| | Nd:YVO$_4$ (a-cut) 1.0%-doped | | | LiNbO$_3$ (non-doped) | |
|---|---|---|---|---|---|
| Crystal Structure | Zircon tetragonal system | | | Trigonal system | |
| Lattice Constant | a = b = 7.1193 Å, c = 6.2892 Å | | | a = b = 5.148 Å, c = 13.863 Å | |
| Density | 4.22 g/cm$^3$ | | | 4.46 g/cm$^3$ | |
| Thermal Expansion Coefficient (@300 K) | $\alpha_a$ = 4.43 × 10$^{-6}$/K $\alpha_c$ = 11.37 × 10$^{-6}$/K | | | $\alpha_a$ = 7.00 × 10$^{-6}$/K $\alpha_c$ = 16.7 × 10$^{-6}$/K | |
| Heat Conduction Coefficient (@300 K) | //C: 0.0523 W/cm/K ⊥C: 0.0510 W/cm/K | | | 38 Cal/cm · s · ° C. (@25° C.) 10 Cal/cm · s · ° C.) (@200° C.) | |
| Mohs hardness | 4 to 5 (Glass like) | | | 5 | |
| | | @532 nm | @1064 nm | | @532 nm | @1064 nm |
| Refractive index | $n_o$ $n_e$ | 2.0210 2.256 | 1.9573 2.1652 | $n_o$ $n_e$ | 2.31 2.22 | 2.24 2.15 |

It may be understood from a difference in lattice constant in Table 1, for example, that MgO:LN crystal expands by approximately 1.5 times as large as Nd:YVO$_4$ crystal in the c-axis direction in response to a environmental temperature change. Accordingly, if Nd:YVO$_4$ crystal and MgO:LN crystal are adsorbed under a normal temperature, it is expected that considerable stress is applied to the optical contact surface 640 of the optical contact assembly (optical element 600).

Figure 30:
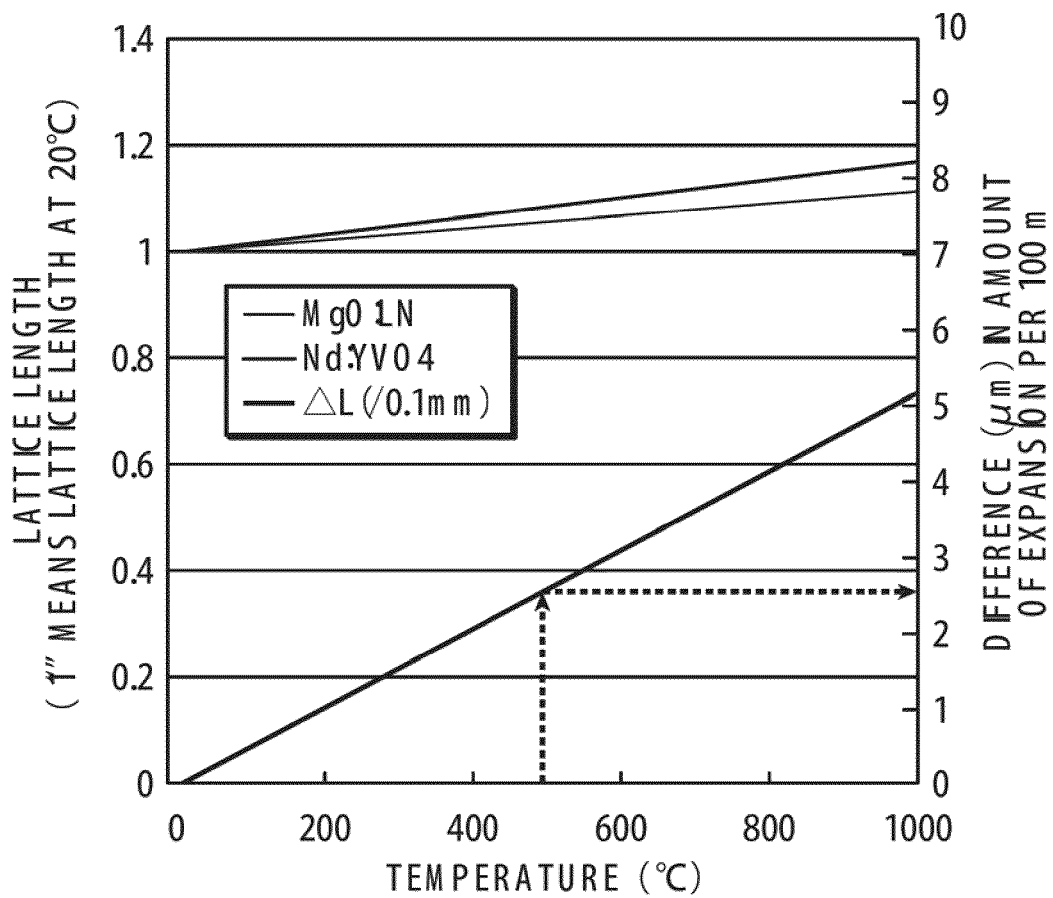
FIG. 30 is a graph schematically showing calculation results for a difference in thermal expansion coefficient in the c-axis direction between MgO:LN crystal and Nd:YVO$_4$ crystal, and a difference in expansion amount between the crystals due to the difference in the thermal expansion coefficient.

FIG. 30 is a graph schematically showing calculation results of the difference in thermal expansion coefficient in the c-axis directions of MgO:LN crystal and Nd:YVO$_4$ crystal, and the difference in crystal expansion amount resulting from the difference in thermal expansion coefficient. By referring to FIG. 30, stress applied to the optical contact surface 640 may be easily understood.

FIG. 30 shows the two calculation results described below.

(1) Lattice constant change in response to an environmental temperature change from 20° C. to 1000° C. if the lattice constants (lengths of single crystal lattice) of MgO:LN crystal and the Nd:YVO$_4$ crystal at 20° C. are 1.

(2) Difference in expansion amount if given points on the surface of the MgO:LN crystal and Nd:YVO$_4$ crystal (first and second principal planes 612, 622) separated by 100 μm along the c-axis from a reference point (one arbitrary point on the optical contact surface 640 formed with MgO:LN crystal and Nd:YVO$_4$ crystal adsorbed under a normal temperature) expands in response to an environmental temperature change up to 1000° C.

Based on the calculation results shown in FIG. 30, it is expected that stress (hydrogen bonding force attempting to maintain the adsorbed condition and stress caused by the difference in thermal expansion between the crystals) applied to the optical contact surface 640 increases as the temperature rises, which results in separation at the optical contact surface 640.

The present inventors focused on the fact on the basis of the calculation results shown in FIG. 30 that the difference in expansion amount is merely approximately several % in response to the temperature rise of several 100° C.

Figure 31:
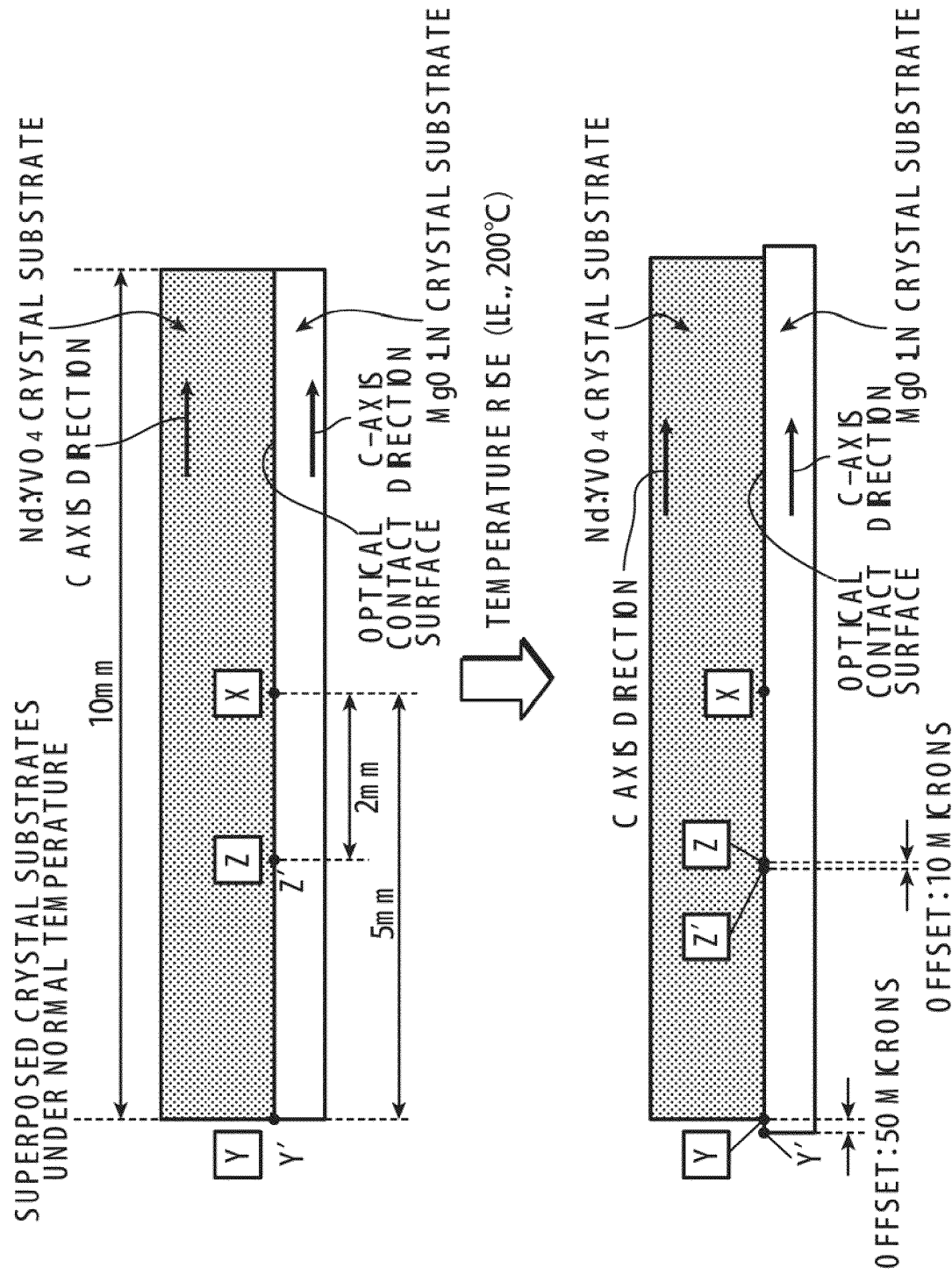
FIG. 31 shows MgO:LN crystal substrate and Nd:YVO$_4$ crystal substrate.

FIG. 31 shows MgO:LN crystal substrate and Nd:YVO$_4$ crystal substrate. The upper diagram of FIG. 31 schematically shows MgO:LN crystal substrate and Nd:YVO$_4$ crystal substrate, which are superposed to each other under a normal temperature to create an adsorbed condition. The lower diagram of FIG. 31 schematically shows a condition of the superposed substrates (MgO:LN crystal substrate and Nd:YVO$_4$ crystal substrate) during a temperature rise. The expansion in the c-axis direction which causes stress to the optical contact surface due to the difference in thermal expansion coefficient is described with reference to FIG. 31.

FIG. 31 shows MgO:LN crystal substrate and Nd:YVO$_4$ crystal substrate which are approximately 10 mm in length in the c-axis direction. Point X at the center of the optical contact surface shown in FIG. 31 is indicated as the reference point. There are the peripheries of MgO:LN crystal substrate and Nd:YVO$_4$ crystal substrate at a position horizontally apart from point X by 5 mm. In FIG. 31, a point on the periphery of Nd:YVO$_4$ crystal substrate is indicated as point Y, and a point on the periphery of MgO:LN crystal substrate is indicated as point Y'.

If MgO:LN crystal substrate and Nd:YVO$_4$ crystal substrate are positioned and superposed under a normal temperature (non-adsorbed state), as shown in the upper diagram of FIG. 31, the positions of point Y coincides with point Y'. Since the difference in expansion amount in response to the environmental temperature from the normal temperature to 200° C. is 1 micron per 100 microns of length in the c-axis direction, an offset of approximately 50 microns is generated between point Y and point Y' if MgO:LN crystal substrate and Nd:YVO$_4$ crystal substrate are heated to 200° C.

If MgO:LN crystal substrate and Nd:YVO$_4$ crystal substrate are adsorbed under a normal temperature, stress for setting off the aforementioned offset is required in order to maintain the adsorbed condition.

FIG. 31 shows point Z and point Z' at positions horizontally separated from the reference point (point X) by approximately 2 mm. Point Z is on Nd:YVO$_4$ crystal substrate and point Z' is on MgO:LN crystal substrate. If the temperatures of Nd:YVO$_4$ crystal substrate and MgO:LN crystal substrate reach 200° C., an offset between point Z and point Z' is only approximately 10 microns. Accordingly, the stress applied to "point Z-point Z'" on the adsorbed MgO:LN crystal substrate and Nd:YVO$_4$ crystal substrate is small in comparison to "point Y-point Y'". Specifically, since the stress, which works on the optical contact surface, depends on the difference in expansion displacement and not on the difference in expansion coefficient between the bonded members (MgO:LN crystal substrate and Nd:YVO$_4$ crystal substrate), a greater difference in expansion displacement results in greater stress.

Based on the aforementioned observation, the present inventors hypothesized that an optical contact assembly with a small optical contact surface area was less likely to cause separation due to a thermal change than an optical contact assembly with a large optical contact surface area since the stress, which worked on the optical contact surface, was smaller under the same environmental temperature change.

In order to verify the aforementioned hypothesis, the present inventors put the aforementioned optical contact assemblies with various optical contact surface sizes in an oven, and observed the separation or cracks caused by the environmental temperature.

An optical contact assembly (sample) under an adsorbed condition was mounted on an aluminum petri dish and placed in the oven. The temperature in the oven was raised at a temperature increase rate of 2° C./minute from a room temperature to the intended temperature (60° C. to 200° C.). Subsequently, the temperature in the oven was maintained for 20 minutes at the intended temperature, and thereafter returned to a room temperature at a temperature decrease rate of approximately 2° C./minute. Subsequently, the sample was removed from the oven to observe the optical contact surface with a microscope.

As a result of the aforementioned test, it was figured out that a larger area of the optical contact surface was likely to cause the separation or cracks under a lower temperature. In particular, the separation at the optical contact surface having an area of 10 mm×10 mm or more was observed in samples obtained from a test temperature of roughly 70 to 75° C. If the test temperature exceeded 100° C. and the area of the optical contact surface was 10 mm×10 mm or more, the first principal plane 612 (refer to FIG. 29) in optical contact numerously cracked. The temperature under which optical contact assemblies with an optical contact surface area of approximately 5 mm×5 mm or less separated was approximately 90 to 110° C. In particular, the temperature under which the optical contact assemblies with an optical contact surface area of approximately 2 mm×2 mm or less separated was approximately 120 to 130° C.

Based on the aforementioned results, the present inventors figured out that the temperature under which the optical contact surface separated or cracked was raised by reduction in the optical contact surface area (i.e. reduction in the difference in thermal expansion amount between the members in optical contact (first and second optical members 610, 620). Based on the aforementioned observation, the present inventors succeeded in improving the characteristics of the optical contact assembly for withstanding an environmental temperature change.

As described above, conditions for strengthening the bonding of the optical contact assembly including members made of different types of materials are contradictory to conditions under which the optical contact surface is less likely to separate or crack due to a thermal change. In terms of strengthening the bonding and preventing the separation due to infiltration of gas and moisture, an optical contact surface with a large area is desirable. On the other hand, in terms of preventing the separation and cracks of the optical contact surface caused by a thermal change, an optical contact surface with a small area is desirable.

The present inventors developed a concavity or a notch adjacent to the periphery of the optical contact surface of the optical contact assembly comprising optical members formed from different types of materials as well as a sealing member configured to cover the periphery of the optical contact surface in the concavity or the notch. The concavity or the notch and the sealing member which characterize the methodologies of this embodiment contribute to the following effects.

(1) The bonding between the optical members is reinforced and strengthened since the optical members are bonded not only by the bonding strength of the optical contact surface (force of forming an adsorbed condition by means of hydrogen bonding) but are also bonded by the sealing member.

(2) Since the concavity or the notch is adjacent to the periphery of the optical contact surface, the optical contact surface area is reduced. Consequently, it becomes less likely that the aforementioned thermal change separates or cracks the optical contact surface.

(3) The sealing member covering the periphery of the optical contact surface blocks the optical contact surface from ambient atmosphere to create a sealed condition. Accordingly, it becomes less likely that gas and moisture infiltrate to separate the optical contact surface. Consequently, the reliability and environment resistance characteristics of the optical element are improved for a long period of time.

As shown in FIGS. 28 and 29, the optical contact surface 640 of the optical element 600 according to the methodologies of this embodiment allows transmission of a laser beam. The first and second optical members 610, 620 are tightly attached and fixed at the optical contact surface 640 without interposing an intermediate layer such as adhesive. Accordingly, unlike an optical element comprising optical members between which an intermediate layer such as adhesive intervenes, in principle, failures such as deterioration of the intermediate layer due to irradiation of the laser beam as well as optical absorption/scattering due to such deterioration of the intermediate layer are less likely to happen.

There is no air space between the first and second principal planes 612, 622 of the optical element 600 described with reference to FIGS. 28 and 29. Accordingly, a step of refractive index, which is sensed by light at the optical contact surface 640 along the optical propagation shown in FIGS. 28 and 29, becomes a difference $\Delta n = |n_1 - n_2|$ where $n_1$ is the refractive index of the first optical member 610 and $n_2$ is the refractive index of the second optical member 620. For example, if the laser beam with a wavelength of 1064 nm which propagates in the optical element 600 perpendicularly enters to the optical contact surface 640, an extraordinary light refractive index for the first optical member 610 (laser crystal) becomes $ne_1$ (@1064 nm)=2.1652, and, an extraordinary light refractive index for the second optical member 620 (MgO:LN crystal) becomes $ne_2$ (@1064 nm)=2.15, which results in $\Delta ne = |ne_1 - ne_2| \cong 0.015$.

The Fresnel reflection ratio R on the basis of the refractive index step is represented by $R = \{(n_1 - n_2) \div (n_1 + n_2)\}^2$. Accordingly, the Fresnel reflection in the aforementioned optical contact surface 640 is, at most, 0.012%. The Fresnel reflection is so small that it is not necessary to form an antireflection film on the optical contact surface 640 between the first and second optical members 610, 620 for various optical applications.

Accordingly, if the functional optical element is manufactured by integrating optical members with similar refractive indexes by means of the optical contact technique, it is not necessary to form an antireflection film on the optical contact surface between the optical members.

Figure 32:
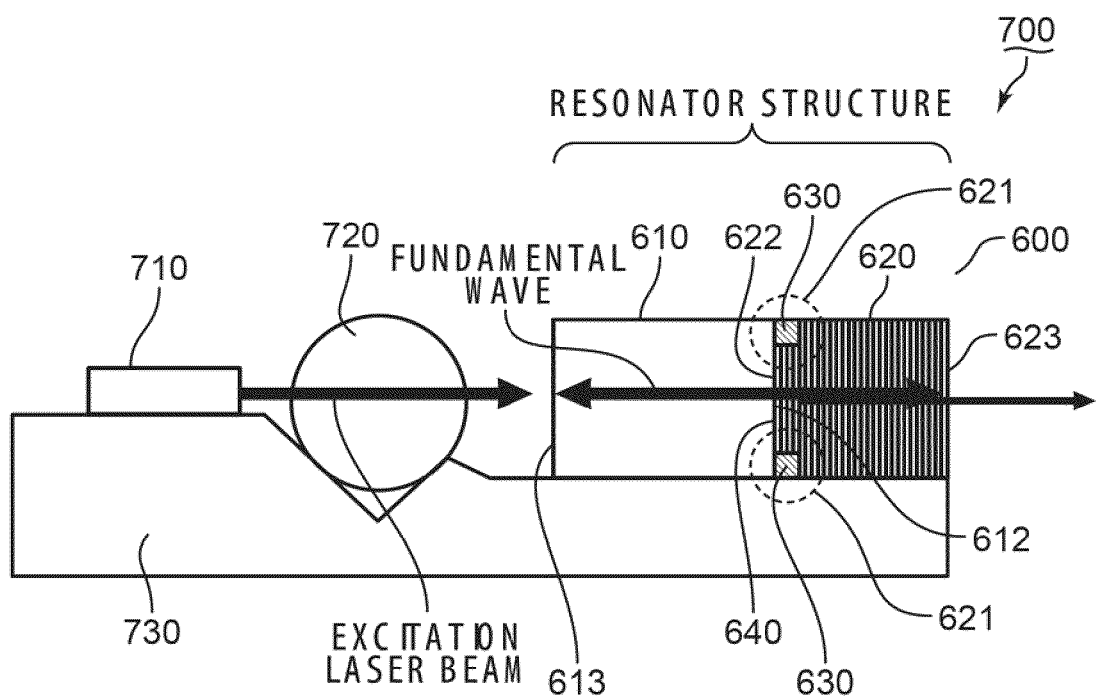
FIG. 32 shows a resonator-type wavelength conversion laser light source including an optical element.

FIG. 32 shows a resonator-type wavelength conversion laser light source comprising the optical element 600 described with reference to FIGS. 28 and 29. A light beam passes through the optical element build into the laser light source shown in FIG. 32. The optical element 600 is an optical contact assembly including laser crystal and wavelength conversion element like the optical element 140 according to the first embodiment. The laser light source is described with reference to FIGS. 28, 29 and 32.

The laser light source 700 comprises an optical element 600. The optical element 600 comprises first and second optical members 610, 620. The first optical member 610 is laser crystal made of Nd:YVO$_4$. The second optical member 620 is MgO:LN crystal. The first optical member 610 includes a first principal plane 612, and an incident end surface 613 opposite to the first principal plane 612. The second optical member 620 includes a second principal plane 622, and an emitting end surface 623 opposite to the second principal plane 622. Optical contact between the first and second principal planes 612, 622 is created to form an optical contact surface 640.

The optical element 600 further comprises sealant 630. The sealant 630 is formed from ultraviolet curable resin. A notch 621 is formed by slitting a part of MgO:LN crystal used as the second optical member 620. The sealant 630 is situated in the notch 621.

The laser light source 700 further comprises an excitation semiconductor laser device (hereinafter referred to as the "pump LD 710") configured to excite the laser crystal (first optical member 610), a condenser lens 720 configured to condense the excitation laser beam emitted from the pump LD 710 to the laser crystal (first optical member 610), and a mount 730 to which the optical element 600, the pump LD 710 and the condenser lens 720 are fixed. In this embodiment, the pump LD 710 is exemplified as the excitation light source.

A periodic polarization inverted structure is formed on MgO:LN crystal, which is used as the second optical member 620. With incidence of an intended fundamental laser beam, the second optical member 620 generates a second harmonic (Second Harmonic Generation; hereafter referred to as "SHG") having a wavelength, which is a half of the fundamental wavelength. For example, if the period of the aforementioned periodic polarization inverted structure is approximately 7 microns in the optical axis direction of the incident fundamental wave, the fundamental wave having a wavelength of 1064 nm is wavelength-converted into a green light having a wavelength of 532 nm. This kind of functional optical elements is generally referred to as a wavelength conversion element (in particular, an element configured to perform wavelength conversion into SHG light is referred to as SHG element). It should be noted that, if the optical contact assembly (optical element 600) is formed with the laser crystal (first optical member 610) and MgO:LN crystal (second optical member 620), which are subjected to a polishing process so as to obtain high parallelism, the incident end surface 613 (end surface on the side of the condenser lens 720) of the first optical member 610 becomes substantially parallel positional relationship with the emitting end surface 623 (end surface opposite to the second principal plane 622, which becomes in optical contact with the first optical member 610) of the second optical member 620.

An antireflection film or a high-reflection film may be deposited on the first and second optical members 610, 620 as appropriate. In particular, a dielectric multi-layered film which satisfies the reflection/transmission characteristics such as the antireflection characteristics (for example, reflectance of 1% or less) for a laser beam with a wavelength of 808 nm, high-reflection characteristics (for example, reflectance of 99.5% or higher) for a laser beam with a wavelength of 1064 nm, and high-reflection characteristics (for example, reflectance of 96% or higher) for a laser beam with a wavelength of 532 nm is deposited on the incident end surface 613 of the first optical member 610. A dielectric multi-layered film with characteristics of high-reflection characteristics (for example, reflectance of 99.5% or higher) for a laser beam with a wavelength of 1064 nm, and high-reflection characteristics (for example, reflectance of 96% or higher) for a laser beam with a wavelength of 532 nm is deposited on the emitting end surface 623 of the second optical member 620.

The pump LD 710 emits an excitation laser beam with a wavelength of 808 nm. The condenser lens 720 condenses the excitation laser beam to the laser crystal (first optical member 610). As described above, the excitation laser beam is irradiated to the laser crystal (first optical member 610) without losses caused by the film formed on the incident end surface 613 of the first optical member 610 to have the antireflection characteristics for 808 nm of light. The excitation laser beam condensed to be high power density is absorbed by the laser crystal (first optical member 610), and thereafter emitted as a fundamental laser beam (hereinafter referred to as the "fundamental wave") of 1064 nm.

Because of the highly reflective films on the emitting end surface 623 of the second optical member 620 and the incident end surface 613 of the first optical member 610, which are disposed in parallel, the first and second optical members 610, 620 both together work as a resonator structure for the light of 1064 nm. Accordingly, the fundamental with wavelength of 1064 nm emitted from the laser crystal (first optical member 610) oscillates in a resonance mode. The fundamental wave under the resonance mode is amplified in the resonator (optical element 600). Consequently, a high power laser beam of several kW is generated as an internal power of the resonator. Such high power fundamental wave is irradiated to MgO:LN crystal (second optical member 620) to obtain SHG having a wavelength of 532 nm with high wavelength conversion efficiency.

The fundamental wave in the resonator (optical element 600) contains light propagating rightward and light propagating leftward in FIG. 32. Accordingly, the generated SHG also contains the bidirectional components. The SHG output toward the condenser lens 720 is, however, inhibited by the film formed on the incident end surface 613 of the first optical member 610 to have highly reflective characteristics for the light having a wavelength of 532 nm. Consequently, most of the generated SHG light is emitted from the emitting end surface 623 of the second optical member 620.

The optical element 600 according to this embodiment contributes to fabrication of a very compact wavelength conversion laser light source (laser light source 700) as shown in FIG. 32. In particular, the notch 621 is formed nearby the periphery of the optical contact surface 640 of the aforementioned optical contact assembly (optical element 600) comprising optical members (laser crystal (first optical member 610) and MgO:LN crystal (second optical member 620)) made from different types of materials, and then the sealant 630 (ultraviolet curable resin) is filled and disposed in the notch 621 to cover the periphery of the optical contact surface 640, so that the sealant 630 (ultraviolet curable resin) contributes to improvement in the bonding strength of the optical element 600, reduction in area of the optical contact surface 640, and infiltration prevention of external gas and moisture, which results in a highly reliable wavelength conversion laser light source (laser light source 700).

In this embodiment, the notch 621 is formed on one of the optical members (first or second optical member 610, 620) made of two different materials. Alternatively, the notch may be formed on both optical members.

In this embodiment, preferably, a conductive material comes in contact with the lateral surface of the second and/or first optical members 620, 610 (surface which perpendicularly intersects with the polarization inversion region). Consequently, like the first to seventh embodiments, charges are eliminated from the second optical member 620 and/or heat is emitted from the first optical member 610.

Eighth Embodiment

Figure 33:
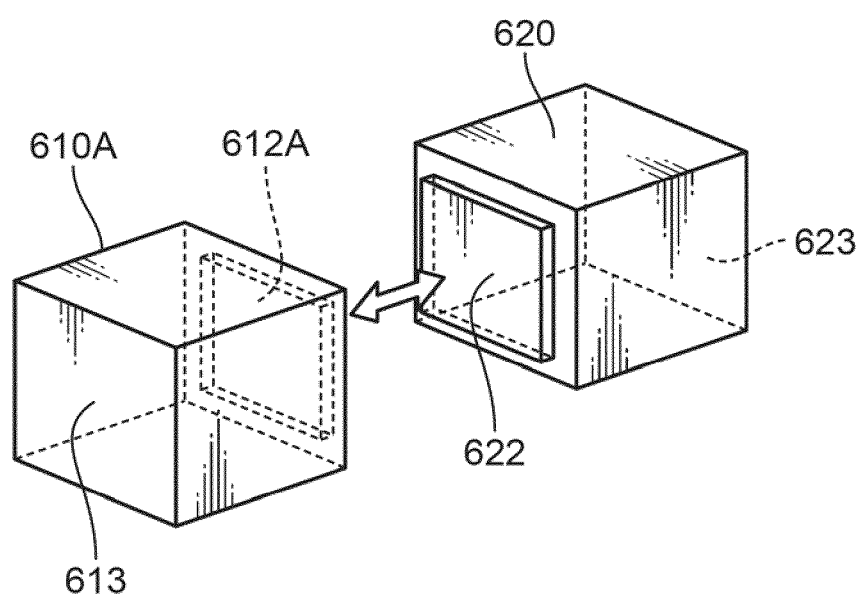
FIG. 33 is a perspective view schematically showing first and second optical members before optical contact.
Figure 34:
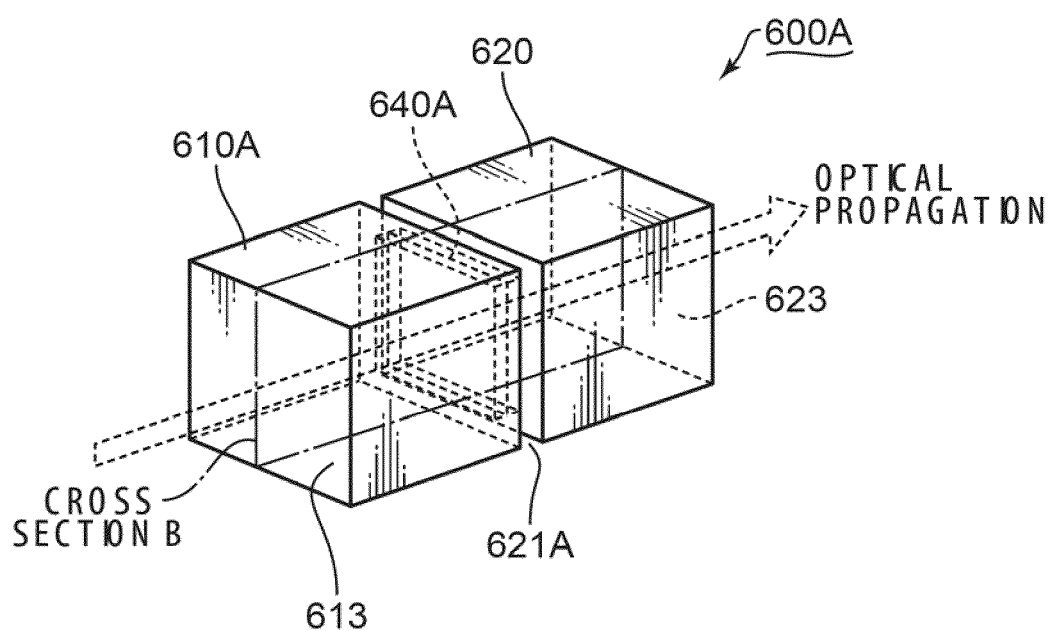
FIG. 34 is a perspective view of the optical element comprising the first and second optical members in optical contact.
Figure 35:
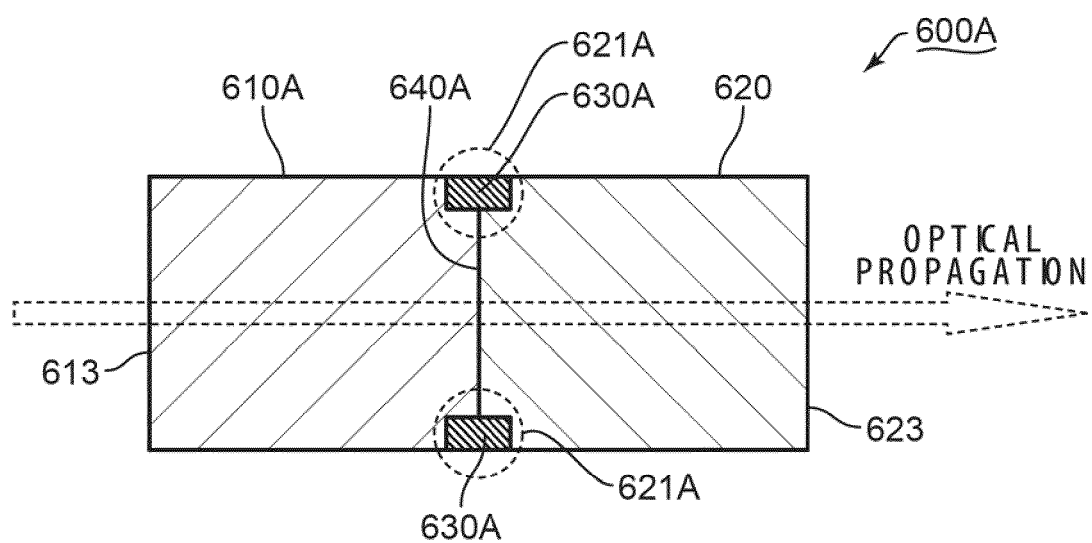
FIG. 35 schematically shows the cross section B shown in FIG. 34.

FIG. 33 is a perspective view schematically showing the first and second optical members before they are subjected to the optical contact. FIG. 34 is a perspective view of the optical element comprising the first and second optical members in optical contact. FIG. 35 schematically shows the cross section B shown in FIG. 34. The optical element according to the eighth embodiment is described with reference to FIGS. 33 to 35. The same elements as the elements described in the context of the seventh embodiment are given the same reference numeral, and the descriptions of the seventh embodiment are incorporated for such same elements.

The optical element 600A includes first and second optical members 610A, 620. As shown in FIG. 33, the first optical member 610A includes a first principal plane 612A, and an incident end surface 613 opposite to the first principal plane 612A. The second optical member 620 includes a second principal plane 622, and an emitting end surface 623 opposite to the second principal plane 622. Optical contact between the first and second principal planes 612A, 622 is created to form an optical contact surface 640A (c.f. FIGS. 34 and 35).

A notch 621A adjacent to the optical contact surface 640A is formed on the optical element 600A. The notch 621A is formed by a notch process to both the first and second optical members 610A, 620. The optical element 600A further comprises sealant 630A situated in the notch 621A to cover the periphery of the optical contact surface 640A.

Since the sealant 630A is filled in the notch 621A, which is formed on both the first and second optical members 610A, 620, path of gas or moisture to reach the optical contact surface 640A become longer, so that the gas or moisture has to follow the boundary between the first or second optical member 610A, 620 and the sealant 630A. Accordingly, the optical element 600A of this embodiment has high resistance against the infiltration of gas and moisture.

Ninth Embodiment

Figure 36:
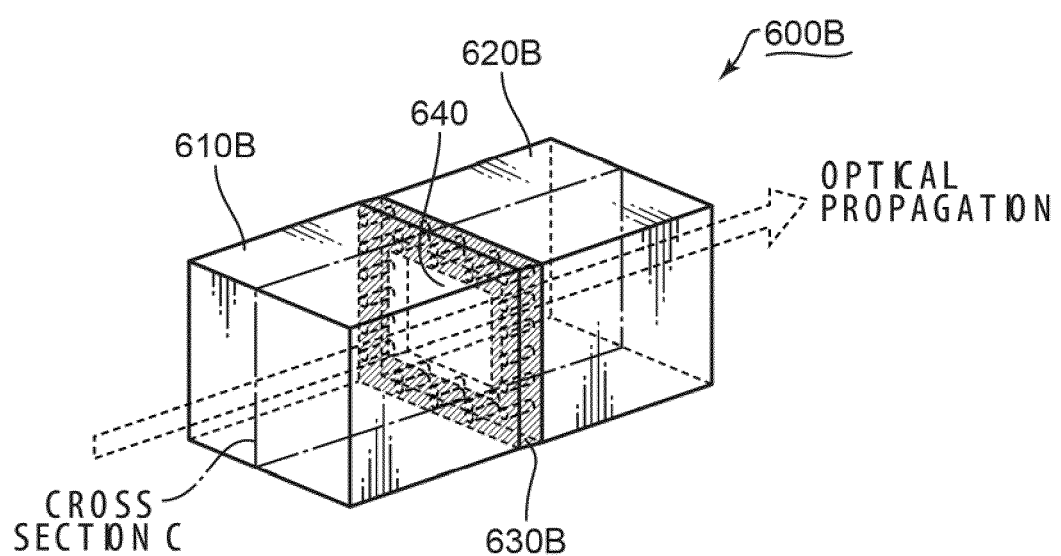
FIG. 36 is a schematic perspective view of the optical element comprising optical contact regions, which are scattered in the region where the sealing member is disposed.

FIG. 36 is a schematic perspective view of the optical element comprising an optical contact region, which is scattered in a region where the sealing member is situated. FIG. 37 schematically shows the cross section C shown in FIG. 36.

In this embodiment, a photolithography process and a dry etching process for forming a unique notch or concavity in the optical member (first and/or second optical members) is performed around the optical contact surface to form columnar or tabular structures. The optical contact process for the first and second optical members is subsequently performed. Consequently, several scattered optical contact regions are formed in a region where the sealing member is situated. The same elements as the elements described in the context of the seventh embodiment are given the same reference numeral, and the descriptions of the seventh embodiment are incorporated for such same elements.

The optical element 600B comprises first and second optical members 610B, 620B. Optical contact between the first and second optical members 610B, 620B is created to form an optical contact surface 640. The optical element 600B further comprises sealant 630B which covers the periphery of the optical contact surface 640.

The second optical member 620B is formed with a notch 621B. A part of the second optical member 620B is subjected to, for example a shaping process such as a photolithography process or a dry etching process to form the notch 621B, so that optical contact regions are scattered in a region of the notch 621B.

For instance, a filling amount of the sealant 630B may be reduced by the optical contact regions, which are scattered in the notch 621B.

In the case of the optical element 600 described in the context of the seventh embodiment, if a dimension of the optical contact surface 640 (area of the optical contact surface 640) which allows transmission of a laser beam is smaller than an outer dimension of the optical element 600 (dimension obtained by adding a width dimension of the notch 621 of the optical element 600 to a cross-sectional area of the optical element along the optical contact surface 640 or a cross-sectional area of the optical contact surface 640 in an arbitrary axis direction), contraction or expansion while the sealant 630 cures causes excessively high tensile stress or expansion stress to the optical member (first and/or second optical members 610, 620) in the notch 621. The excessively high tensile stress or expansion stress results in an unnecessary force to the optical contact surface 640 to potentially deteriorate the adsorbed condition or cause separation between the first and second optical members 610, 620.

In the case of the optical element 600B according to this embodiment, the filling amount of the sealant 630B is reduced by several optical contact regions scattered in the notch 621B around the optical contact surface 640 to decrease the unnecessary force generated in the aforementioned optical contact surface 640. Consequently, it is less likely that the separation at the optical contact surface 640 and the offset between the first and second optical members 610B, 620B happens.

In the seventh to ninth embodiments, Nd:YVO$_4$ crystal (laser crystal) is exemplified as the first optical members 610, 610A, 610B. Nd:YVO$_4$ and Nd:GdVO$_4$ are preferably used as the solid-state laser crystal. If Nd-doped amount in the solid-state laser crystal is high, the absorption coefficient goes up, which results in a compact microchip laser device because the excitation laser beam is absorbed in a short distance in the axis direction of optical propagation to emit a fundamental wave.

Nd:YVO$_4$ or Nd:GdVO$_4$ used as the first optical members 610, 610A, 610B advantageously causes laser oscillation with single polarization since an excitation efficiency of the solid-state laser has anisotropic characteristics with respect to the crystal axis. In particular, the oscillation with the single polarization considerably improves conversion efficiencies since the wavelength conversion using the nonlinear optical crystal described in this embodiment has polarization dependencies. Coincidence of the optical axis of birefringence of crystals having a periodic polarization inverted structure with the optical axis of phase matching reduces a change in polarization, which is dependent on temperature. The laser crystal of single polarization improves the conversion efficiency and stabilizes the polarization. It should be noted that, in comparison to the Nd:YVO$_4$ crystal, the thermal expansion coefficient of the Nd:GdVO$_4$ crystal is closer to thermal expansion coefficient of the MgO:LN crystal. Therefore with optical contact between the nonlinear optical crystal and the laser crystal, it becomes less likely that a temperature change of the crystal causes strain on the optical contact surface. Thus, it is likely that a stable bonded condition is maintained even under an external environmental temperature change.

Ceramic laser mediums such as GdScGa, YScGa, YAG or alike may be used as the first optical member. These laser mediums may be used in a similar manner to the aforementioned laser crystals. For example, such laser medium and ferroelectric crystal as the wavelength conversion element in optical contact may be used to manufacture an optical element or a wavelength conversion laser light source comprising the optical element. The ceramic processes such as blending, molding and sintering crystal are superior to crystal pulling methods in terms of mass productivity. Therefore the ceramic laser mediums may be advantageously manufactured with very low cost in comparison to laser crystals. In particular, functional ceramics referred to as fine ceramics may be advantageously used for various optical applications.

The notch or the concavity of 1 micron in depth (dimension "d" (step from the optical contact surface) shown in FIG. 29) is deep enough for the sealing member to cover the periphery of the optical contact surface. Accordingly, photolithography and dry etching may be used to form the notch or the concavity. If photolithography and dry etching are used to form the notch or the concavity, the shape and size of the optical contact surface may be precisely controlled. Photolithography and dry etching advantageously allows less number of processes than the dicing process to form the notch or the concavity because the photolithography and the dry etching allow a large area to be scraped out.

As described above, the sealing member blocks the periphery of the optical contact surface from ambient atmosphere. This important role and effect of the sealing member are largely dependent on a substantial distance between the periphery of the optical contact surface and the ambient atmosphere.

The present inventors uses samples, among which a depth of the notch or the concavity (dimension "d" (step from the optical contact surface) shown in FIG. 29) is changed, and samples, among which a width of the notch or concavity (dimension "w" (distance from the optical contact surface to the periphery of the sealing member) shown in FIG. 29) is changed, to confirm impacts of a change in a substantial distance between the periphery of the optical contact surface and the ambient atmosphere (on the blocking effect).

As a result of the aforementioned examination, it was figured out that the blocking effect of the sealing member between the optical contact surface and ambient atmosphere was dependent on neither the depth nor width of the notch or the concavity whereas the blocking effect was likely to become more noticeable as the substantial path length along the interface between the sealing member and the optical member to the optical contact surface became longer. If the aforementioned substantial path length was no less than 500 microns and the sealing member was sufficiently filled and cured, external gas and moisture were prevented from infiltrating for a long period of time, which may not cause any problem in a practical level.

In the seventh to ninth embodiments, ultraviolet curable resin is exemplified as the sealing member. A sealing member formed from ultraviolet curable resin is advantageous because a user may select a type of ultraviolet curable resin based on various characteristics and environment in which an optical element is used. For example, appropriate ultraviolet curable resin may be selected according to various requirements such as viscosity, refractive index after curing, thermal resistance and chemical resistance. Alternatively, thermosetting resin may be used instead of the ultraviolet curable resin as the sealing member for the optical element.

Sodium silicate ($Na_2SiO_3$) or silicic acid obtained by gelling sodium silicate may be used as the sealing member. Highly concentrated sodium silicate aqueous solution is highly viscous liquid like millet jelly, which is generally known as water glass. The highly concentrated sodium silicate aqueous solution is dissolved in water to achieve appropriate viscosity. Subsequently, the sodium silicate aqueous solution with appropriate viscosity is applied to the notch of the optical element, which is formed for the sealing member, to cover the periphery of the optical contact surface. Thereafter, a suitable tool such as a pipette is used to add an appropriate amount of diluted hydrochloric acid into the sodium silicate aqueous solution, which causes chemical reaction between the sodium silicate and the hydrochloric acid to gel the sodium silicate (becomes an amorphous state with less fluidity), and becomes silicic acid ($H_2SiO_3$). If this gelled silicic acid is used as the sealing member, it becomes less likely that gas and moisture infiltrates to the optical contact surface. The optical members are also firmly bonded and fixed by the aforementioned gelling to improve resistances to treatment and thermal variability. Since the gelled amorphous silicic acid (similar characteristics to glass) becomes harder than a resin-based sealing member, for example, it becomes less likely that the dicing blade clogs during a dicing process. Accordingly, a blade for cutting an optical member is also used for a cutting process on the sealing member.

It should be noted that processing surfaces of the notch or the concavity where the sealing member is applied are preferably uneven surfaces rather than mirrored surfaces, in order to enhance bonding effect of the sealing member. Consequently, a contact area between the sealing member and the optical member is widened, so that the bonding effect is also enhanced.

Based on studies conducted by the present inventors, if ultraviolet curable resin is used as the sealing member and a notch or a concavity with a surface roughness (Ra) of 10 microns or more is formed, adhesiveness of the sealing member improves.

The present inventors formed an optical contact surface of 1.2 mm×1.2 mm on an optical element having an outer dimension of approximately 2 mm×2 mm (i.e. a notch or a concavity was formed so that a distance from the periphery of the optical contact surface to the outermost circumferential surface of the optical member became approximately 400 microns). Fine unevenness formed on the notch, of which the maximum step size (d) from the optical contact surface was approximately 500 microns, was approximately 10 to 50 microns in width and approximately 100 microns or higher in height. Under this condition, significant improvement in the aforementioned adhesiveness was confirmed. The aforementioned structure, which had a longer path length along the interface between the sealing member and the optical member, appropriately prevented gas and moisture in ambient atmosphere from infiltrating.

In the aforementioned description, the ultraviolet curable resin is used as the sealing member. Alternatively, the sealing member may be formed with other dielectric thin films (for example, thin film formed from $SiO_2$).

Tenth Embodiment

As a method for disposing the sealing member configured to block ambient atmosphere from the optical contact surface, it is considered to dispose a sealing member along the periphery of an optical contact surface of an optical contact assembly, which is fabricated without forming the notch or the concavity (notch or concavity formed adjacent to the periphery of the optical contact surface) described in the context of the aforementioned embodiments. In this case, the sealing member protrudes outward from the outermost part of the first and/or second optical members. If an optical element shaped in such a manner is disposed and fixed, for example, to a flat portion of the mount 730 shown in FIG. 32, the sealing member interferes with the flat portion of the mount 730 and makes it difficult to horizontally fix the optical member. Accordingly, the mount 730 has to be subjected to modification such as processing a concavity therein not to interfere with the sealing member, which protrudes outward from the outermost part of the first and/or second optical member.

FIGS. 38A to 39C show an exemplary optical element of which shape contributes to overcoming the issues arisen from the outwardly protruded sealing member from the outermost part of the first and/or second optical members. FIGS. 38A to 39C all show the optical element comprising two optical members in optical contact. The two optical members both include at least one flat outer face. A notch adjacent to both the flat outer surface and the optical contact surface is formed. In addition, the optical element comprises a sealing member which covers the periphery of the optical contact surface. The sealing member also covers the periphery of the optical contact surface, which is not adjacent to the notch. The structure of the optical element shown in FIGS. 38A to 39C advantageously allows the flat outer surface to be used as a reference plane, which is used for mounting the optical element, in addition to the advantageous effects described in the context of the seventh to ninth embodiments. The optical contact surface of the optical element may be shaped into a circle or a rectangle. Alternatively, the optical contact surface of the optical element may be shaped in an approximate semi-circle, in which a circle is cut with a straight line, or a polygonal shape. As described above, in this embodiment, the optical contact surface of the optical element may take on various shapes. It should be noted that this embodiment is characterized in that the outer circumferential surface of the optical member contains at least one flat plane.

Figure 38A:
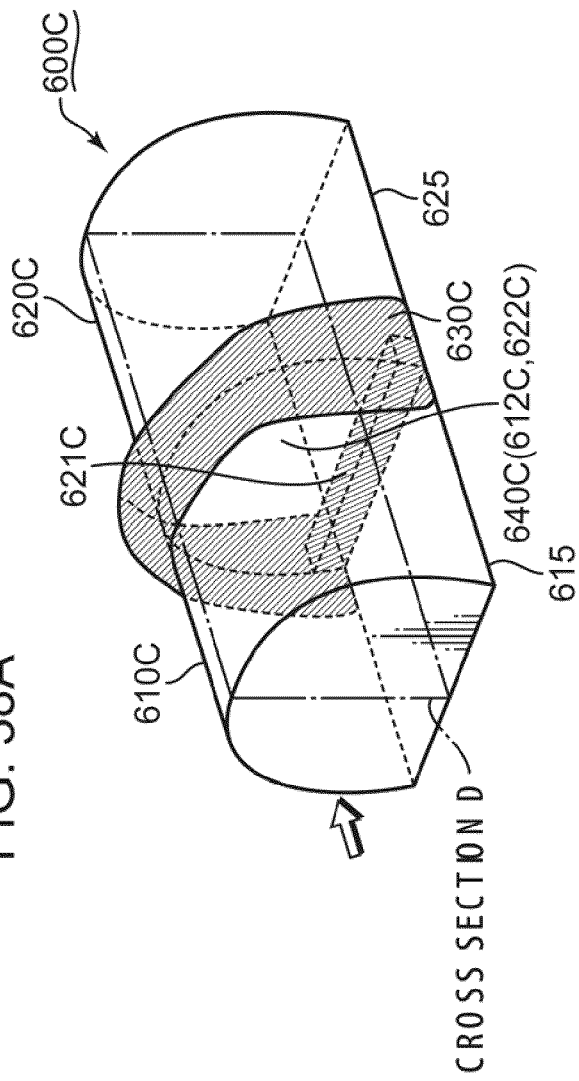
FIG. 38A is a schematic perspective view of an optical element comprising two optical members in optical contact.
Figure 38C:
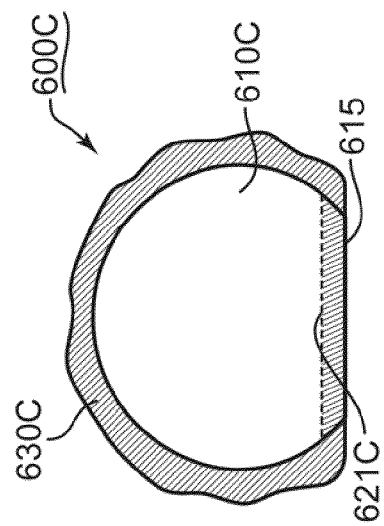
FIG. 38C shows the optical element viewed from the direction of the arrow in FIG. 38A.
Figure 38B:
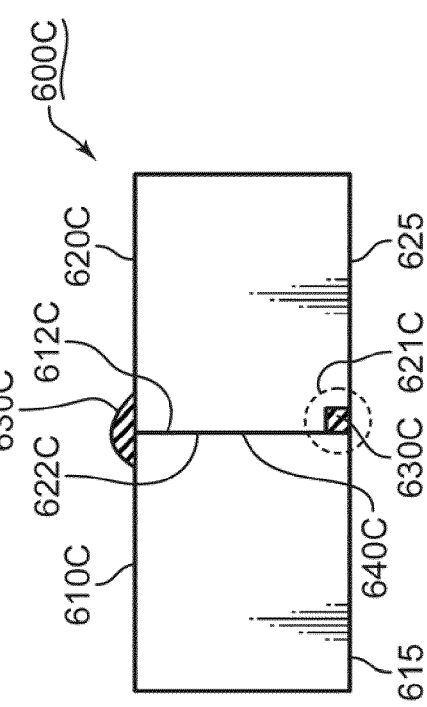
FIG. 38B schematically shows the cross section D shown in FIG. 38A.

FIGS. 38A to 38C schematically show the optical element comprising two optical members, which have a substantially semi-circular cross section. FIG. 38A is a schematic perspective view of the optical element comprising two optical members in optical contact. FIG. 38B schematically shows the cross section D in FIG. 38A. FIG. 38C shows the optical element viewed from the direction of the arrow in FIG. 38A.

The optical element 600C shown in FIGS. 38A to 38C comprises first and second optical members 610C, 620C. The first and second optical members 610C, 620C are both shaped in a substantially semi-circular column. The first optical member 610C includes a substantially flat bottom surface 615 and a first principal plane 612C in optical contact with the second optical member 620C. The second optical member 620C includes a substantially flat bottom surface 625 and a second principal plane 622C in optical contact with the first principal plane 612C. The first and second principal planes 612C, 622C of the first and second optical members 610C, 620C are bonded to form an optical contact surface 640C so that the bottom surfaces 615, 625 of the first and second optical members 610C, 620C substantially level at the same plane. The first and second principal planes 612C, 622C are formed in the substantially same shape and size.

The optical element 600C further comprises sealant 630C which covers the periphery of the optical contact surface 640C. The second optical member 620C is formed with a notch 621C. The notch 621C is formed by slitting a part of the second optical member 620C so that the notch 621C becomes adjacent to the bottom surfaces 615, 625 and optical contact surfaces 640C. The sealant 630C is not only disposed in the notch 621C, which extends from the lower edge of the optical contact surface 640C to the bottom surfaces 615, 625, but is also disposed to the curved surface of the first and second optical members 610C, 620C.

FIGS. 39A to 39C schematically show the optical element comprising two optical elements between which there is a difference of the principal plane in size that forms the optical contact surface. FIG. 39A is a schematic perspective view of an optical element comprising a tapered optical member and a right rectangular block optical member in optical contact. FIG. 39B schematically shows the cross section E in FIG. 39A. FIG. 39C shows the optical element viewed from the direction of the arrow in FIG. 39A.

The optical element 600D shown in FIGS. 39A to 39C comprises first and second optical members 610D, 620D. The first optical member 610D is a tapered rectangular block which narrows toward the second optical member 620D (i.e. narrows along the propagation direction of light). The second optical member 620D is a right rectangular block.

The first optical member 610D includes a substantially flat bottom surface 615D and a first principal plane 612D in optical contact with the second optical member 620D. The second optical member 620D includes a substantially flat bottom surface 625D and a second principal plane 622D in optical contact with the first principal plane 612D. The first principal plane 612D of the first optical member 610D and the second principal plane 622D of the second optical member 620D are bonded to form an optical contact surface 640D so that the bottom surfaces 615D, 625D of the first and second optical members 610D, 620D substantially levels at the same plane. The bottom surfaces 615D, 625D are at a substantially right angle with respect to the optical contact surface 640D.

The optical element 600D further comprises sealant 630D which covers the periphery of the optical contact surface 640D. The first optical member 610D is formed with a notch 621D. The notch 621D is formed by slitting a part of the first optical member 610D so that the notch 621 becomes adjacent to the bottom surfaces 615D, 625D and the optical contact surface 640D. The sealant 630D is not only disposed in the notch 621D, which extends from the lower edge of the optical contact surface 640D to the bottom surfaces 615D, 625D, but is also disposed to the corners between the first and second optical members 610D, 620D.

In the seventh to tenth embodiments, an optical element comprising laser crystal and a wavelength conversion element and a wavelength conversion laser light source with the optical element are exemplified as the optical contact assembly comprising optical members which are made from different types of materials. The methodologies according to these embodiments may be applied to other optical elements (for example, various optical elements such as a modulator-integrated laser light source configured by combining laser crystal with a nonlinear optical crystal to exhibit an electro-optic effect, an optical intensity modulator-integrated laser light source configured by combining a ceramic laser and an acoustic optical element such as $TeO_2$ comprising an electrode, or an optical circuit element configured by combining several optical elements which exhibits a lens effect or diffraction effect upon application of voltage).

Eleventh Embodiment

In the aforementioned seventh to tenth embodiments, an optical contact assembly comprising $Nd:YVO_4$ crystal (laser crystal) and MgO:LN crystal (nonlinear optical crystal) and a wavelength conversion laser light source comprising the optical contact assembly used as a resonator structure are exemplified as the optical contact assembly formed from different types of materials. In this embodiment, the optical contact surface of the optical contact assembly is used as an optical window configured to control a lateral mode of the laser beam. The methodologies of this embodiment are characterized by using the optical contact surface of an intended size and shape to control the lateral mode to establish a resonance mode.

Figure 40:
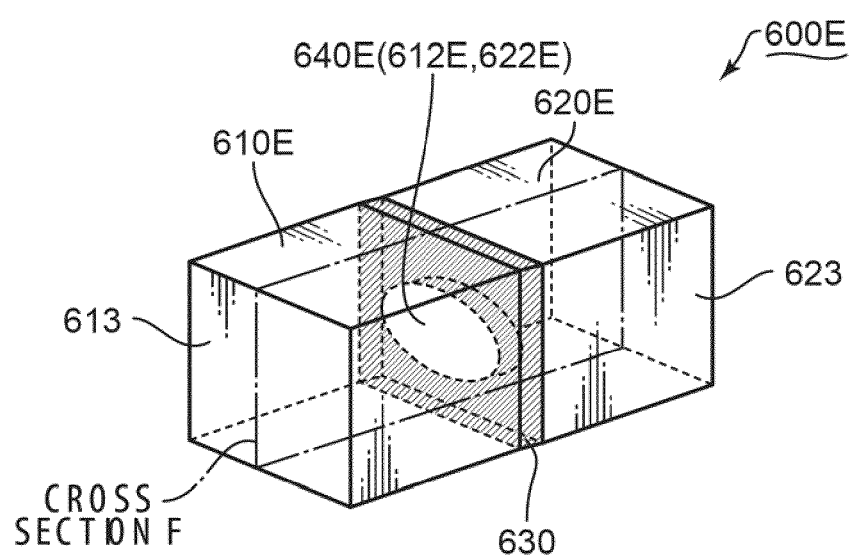
FIG. 40 is a perspective view schematically showing an optical element comprising an optical contact surface which functions as an optical window.
Figure 41:
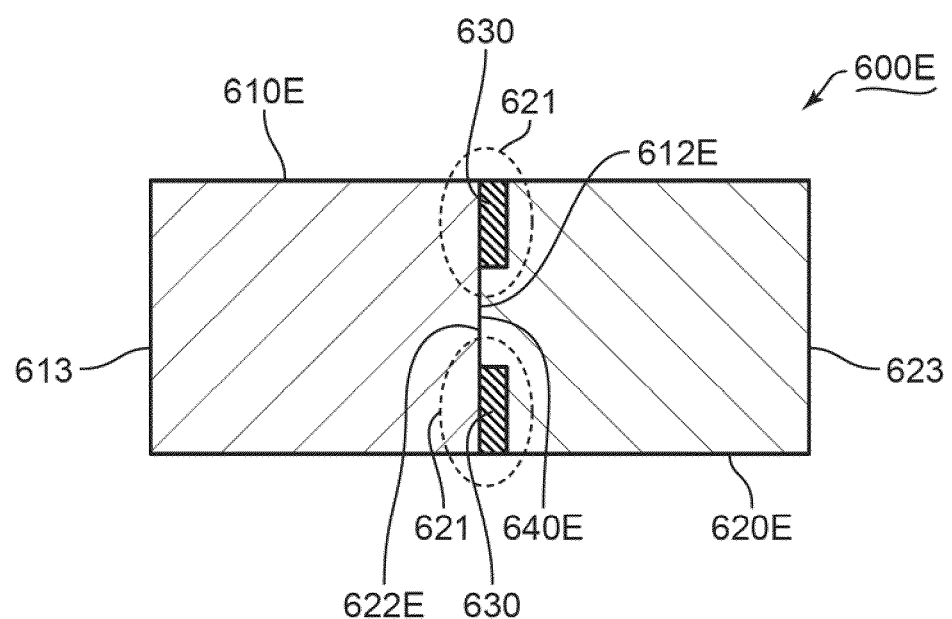
FIG. 41 schematically shows the cross section F shown in FIG. 40.

FIGS. 40 and 41 show an optical element of this embodiment. The optical element shown in FIGS. 40 and 41 is applied to a resonator-type solid-state laser light source including an optical crystal comprising a solid-state laser medium and a resonator mirror in optical contact.

FIG. 40 is a perspective view schematically showing the optical element comprising an optical contact surface which functions as an optical window. FIG. 41 schematically shows the cross section F shown in FIG. 40. The same elements as the seventh embodiment are given the same reference numeral, and the descriptions of the seventh embodiment are incorporated for such same elements.

The optical element 600E comprises laser crystal used as the first optical member 610E, and MgO:LN crystal used as the second optical member 620E. The first optical member 610E includes a first principal plane 612E in optical contact with the second optical member 620E and an incident end surface 613 opposite to the first principal plane 612E. The second optical member 620E includes a second principal plane 622E in optical contact with the first principal plane 612E and an emitting end surface 623 opposite to the second principal plane 622E. Optical contact between the first and second principal planes 612E, 622E is created to form the optical contact surface 640E.

The second optical member 620E is formed with a notch 621 formed by slitting a part of MgO:LN crystal. The optical element 600E further comprises sealant 630 situated in the notch 621. The sealant 630 covers the periphery of the optical contact surface 640E. The optical element 600E may be manufactured by means of the processes described in the context of the seventh embodiment.

In this embodiment, an excitation laser beam with a wavelength of 808 nm is incident to the incident end surface 613 (end surface opposite to the first principal plane 612E of the first optical element (laser crystal)) of the optical element 600E. Subsequently, the laser beam with a wavelength of 1064 nm, which is excited in the laser crystal used as the first optical member 610E, passes through the optical contact surface 640E and propagates to the second optical member 620E. The laser beam with a wavelength of 1064 nm is also reflected by the emitting end surface 623 (end surface opposite to the second principal plane 622E of the second optical member 620E) of the MgO:LN crystal used as the second optical member 620E. In addition, the laser beam with a wavelength of 1064 nm is once again reflected by the incident end surface 613 of the laser crystal used as the first optical member 610E. Oscillation of the resonance mode is thereby generated in the optical element.

A reflective film such as a dielectric multi-layered film with high-reflection characteristics (for example, reflectance of 99.8% or higher) for the laser beam with a wavelength of 1064 nm is formed on the incident end surface 613 of the laser crystal used as the first optical member 610E to achieve the aforementioned oscillation of the resonance mode. A reflective film such as a dielectric multi-layered film with high-reflection characteristics (for example, reflectance of 99.8% or higher) for the laser beam with a wavelength of 1064 nm is also formed on the emitting end surface 623 of the MgO:LN crystal used as the second optical member 620E.

For example, a laser beam from a light source such as a highly powered excitation semiconductor laser is incident to the laser crystal used as the first optical member 610E. Consequently, the laser beam is absorbed in the first optical member 610E to cause emission of a laser beam, which has a wavelength in response to energy level. For example, if Nd:YVO$_4$ crystal is used as the laser crystal and an excitation laser beam with a wavelength of 808 nm is used as the pump light, light with a wavelength of 1064 nm is emitted from Nd:YVO$_4$ crystal. If a semiconductor laser is used as the excitation laser, the profile (lateral mode) of the pump light beam becomes an oval shape. The irradiation region of Nd:YVO$_4$ crystal (i.e. the cross section shape of the laser excitation region) also becomes an oval shape. Consequently, the lateral mode of the excited light with a wavelength of 1064 nm also becomes an oval shape.

Conversion of light of 808 nm to light of 1064 nm in the laser crystal used as the first optical member 610E is effected by the mode coupling (also simply referred to as "coupling"). In the coupling of light with a wavelength of 808 nm to light with a wavelength of 1064 nm, for example, the light of 1064 nm, which is excited when the coupling efficiency from the single mode of light with a wavelength of 808 nm to a multi mode of light with a wavelength of 1064 nm becomes significant, is a multi lateral mode, which causes various issues in terms of utilization of the output beam. For example, if the laser beam with a wavelength of 1064 nm enters the wavelength conversion element to obtain SHG with a wavelength of 532 nm, the conversion efficiency becomes significantly worse than the single mode. The beam of the multi lateral mode has greater $M^2$ (M squared) so-called as an index of beam quality. Therefore the multi lateral mode beam is inferior in terms of condensing characteristics. For example, the multi lateral mode beam may not be directed to utilization in a scan-type display device comprising an MEMS device.

With regard to conversion from the beam lateral mode to the single mode in such a resonator configuration, it has been proposed to use a resonator with an optical window (for example, an aperture) configured to give losses to the multi mode. However a structure for forming an aperture between the optical members may be required, for example, to fabricate a compact resonator with combination of compact optical members. Accordingly, there may be various problems such as an increased number of components, requirements for controlling an aperture insertion position, unstable fixation of the aperture and alike.

With respect to the aforementioned issues, in this embodiment, a lateral mode of a laser beam which passes through the optical element is controlled by means of controlled shape/size of the optical contact surface of the optical element. As described above, the present embodiment contributes to reduction in a number of components, stabilizes the resonator configuration and makes it unnecessary to adjust a position of the optical window because a resonator is formed from optical members in optical contact of which optical contact surface is used as the optical window.

The shape and size of the aforementioned optical window may be controlled, for example, to a precision of submicron units on the basis of process methods such as photolithography or dry etching process.

The present inventors observed a spot of a laser beam with 1064 nm on the optical contact surface 640E of the optical element 600E described with reference to FIGS. 40 and 41 to which an excitation laser beam with a wavelength of 808 nm was incident. It should be noted that the optical contact surface 640E was set as a condensing position. The excitation laser beam was adjusted so that the maximum diameter of the beam lateral mode at the condensing position became approximately 100 µm.

Figure 42A:
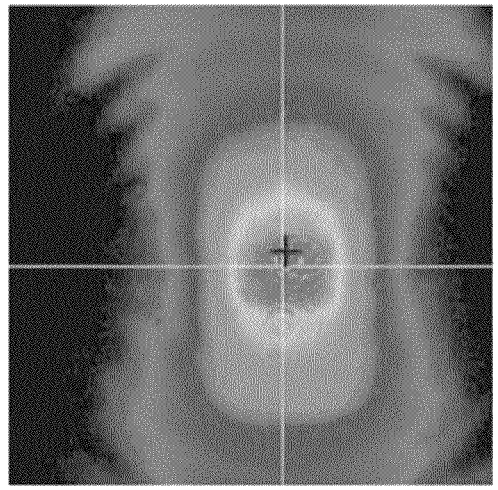
FIG. 42A shows a photograph of a beam spot observed on an optical contact surface which is 1 mm in diameter.
Figure 42B:
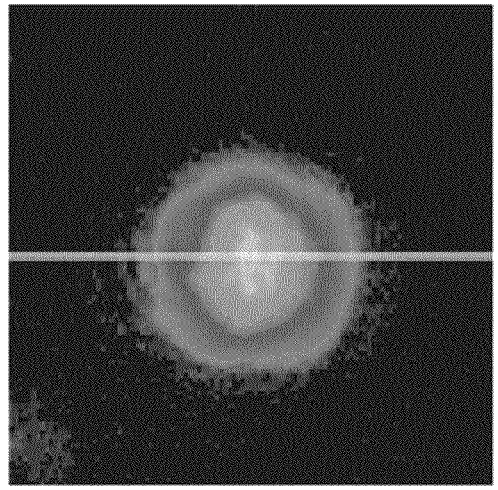
FIG. 42B shows a photograph of a beam spot observed on an optical contact surface which is 300 μm in diameter.

FIGS. 42A and 42B show an image of the beam spot observed on the optical contact surface 640E. FIG. 42A shows an image of the beam spot observed on the optical contact surface 640E, which is 1 mm in diameter. FIG. 42B shows an image of the beam spot observed on the optical contact surface 640E, which is 300 µm in diameter.

Upon observing the beam spot for the optical element 600E including an optical contact surface 640E (approximately 1 mm in diameter), which was too large to function as an optical window, $M^2$ of the beam on the optical contact surface 640E was 1.39 in the short direction, and 2.3 in the long axis direction. The present inventors used the other optical element 600E which had a different area to confirm functions of the optical contact surface 640E as the optical window. Consequently, significantly improved $M^2$ of the beam, which was 1.07 in the short direction and 1.58 in the long axis direction, respectively, was observed on the optical contact surface 640E, which was 400 µm in diameter. In addition, $M^2$ of the beam observed on the optical contact surface 640E, which was 300 µm in diameter, was 1.01 in the short direction and 1.04 in the long axis direction, respectively. Accordingly, a substantially true circular beam shape was observed on the optical contact surface 640E, which was 300 µm in diameter. The present inventors further observed the optical element 600E including the optical contact surface 640E, which was no more than 250 µm in diameter. As a result of the observation, the present inventors confirmed that most of the beam was bounced off from the optical window as the optical contact surface 640E, which was no more than 250 µm in diameter, to substantially decrease excitation efficiency for light of 1064 nm. Accordingly, the preferable size of the optical contact surface 640E is approximately 3 to 4 times as long as the beam diameter on the optical contact surface 640E.

Twelfth Embodiment

Figure 43:
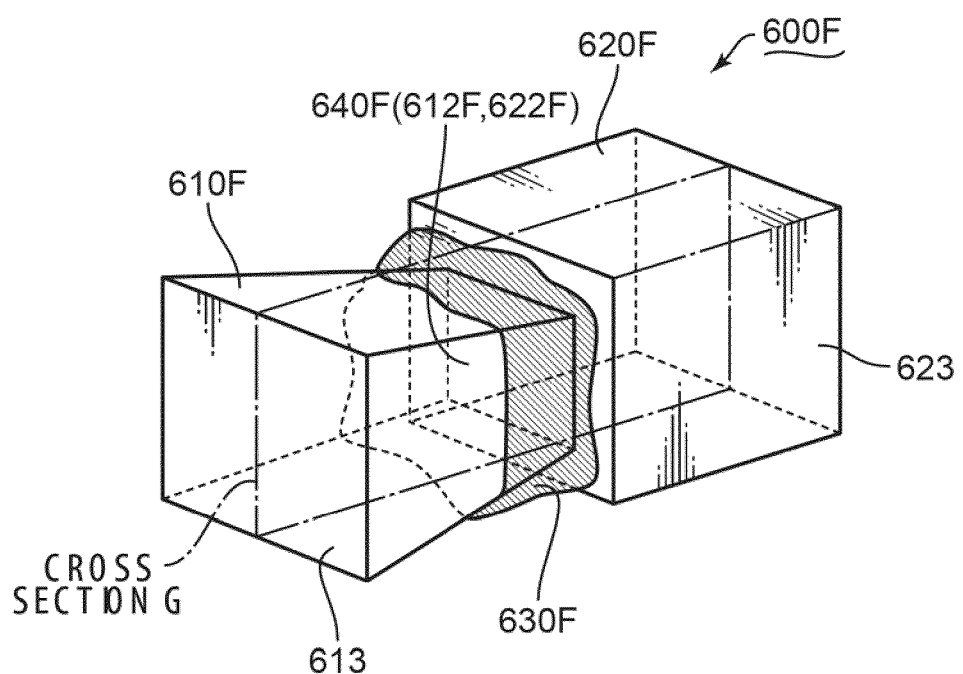
FIG. 43 is a schematic perspective view of an optical element.

FIGS. 43 and 44 show an optical element comprising a tapered optical member. The optical element is used as a resonator. Like the eleventh embodiment, the optical contact surface of the optical element functions as an optical window.

FIG. 43 is a schematic perspective view of the optical element. FIG. 44 schematically shows the cross section G shown in FIG. 43. The optical element is described with reference to FIGS. 43 and 44. The same elements as the eleventh embodiment are given the same reference numeral, and the descriptions of the eleventh embodiment are incorporated for such same elements.

The optical element 600F comprises laser crystal used as the first optical member 610F and MgO:LN crystal used as the second optical member 620F. The first optical member 610F includes a first principal plane 612F in optical contact with the second optical member 620F and an incident end surface 613 opposite to the first principal plane 612F. The second optical member 620F includes a second principal plane 622F in optical contact with the first principal plane 612F and an emitting end surface 623 opposite to the second principal plane 622F. Optical contact between the first and second principal planes 612F, 622F is created to form the optical contact surface 640F. The second principal plane 622F is wider than the first principal plane 612F. Accordingly, corners are formed between peripheral walls (tilted walls extending between the incident end surface 613 and the first principal plane 612F) of the first optical member 610F and the second principal plane 622F. The optical element 600F further comprises sealant 630F situated at the corners. The sealant 630F seals the periphery of the optical contact surface 640F between the first and second principal planes 612F, 622F.

The laser crystal used as the first optical member 610F is subjected to a shaping process to form a notch 621F. The first optical member 610F is formed in a tapered shape by the shaping process from the incident end surface 613 to the first principal plane 612F, so that the first optical member 610F becomes gradually tapered to the second optical member 620F. Accordingly, the substantially perpendicular cross section of the first optical member 610F to the optical axis of the light entered to the incident end surface 613 changes along the optical axis. The second optical member 620F is a substantially right rectangular block whereas the first optical member 610F is tapered. The second principal plane 622F of MgO:LN crystal used as the second optical member 620F is wider than the first principal plane 612F of the laser crystal used as the first optical member 610F. The shape and size of the first principal plane 612F of the laser crystal used as the first optical member 610F and the peripheral walls of the tapered laser crystal are controlled so that the first principal plane 612F and the peripheral walls may substantially function as the optical window of the laser beam. The taper angles, which is determined by the taper shaping process (i.e. the inclination angles of each peripheral wall surface of the first optical member 610F, which is determined by a length of the first optical member 610F in a light propagation direction, the cross section shape of the first principal plane 612F, and the cross section shape of the incident end surface 613), are appropriately set according to properties of the used laser beam wavelength, characteristics of the optical members and optical conditions such as an incident condition of the beam to the optical element 600F.

The taper process to which the first optical member 610F is subjected may be carried out by means of various processes such as dicing, polishing, and etching. It should be noted that surface conditions after the taper process may be appropriately controlled so that unnecessary lateral modes mode is efficiently removed because the surface conditions after the taper process (for example, surface roughness) varies losses of the optical beam to be used. The shape and size of the optical contact surface 640F of the optical element 600F shown in FIG. 44 are appropriately controlled, so that the lateral mode control for the laser beam passing through the optical element 600F is achieved. Since optical contact between the optical members (first and second optical members 610F, 620F) is created to form a resonator and the optical contact surface 640F is used as the optical window, a number of components may decrease and the resonator configuration becomes more stable. In addition, it may become unnecessary to adjust a position of the optical window.

Thirteenth Embodiment

In this embodiment, mass productivity in manufacturing the optical element described in the context of the seventh embodiment and advantageous characteristics concerning mounting of the optical element are described.

As described in the context of the seventh embodiment, fragmented optical members are prepared for manufacturing the optical element. After a notch process to the optical members, hydrophilic treatment and formation of an optical contact surface (superposition of the first and second principal planes) are performed. Subsequently, the sealing member is applied and hardened. Disadvantages in such processes for making the fragmented optical members in optical contact are described below.

(1) It depends on a bonding surface area how easily an adsorption condition is formed upon manufacturing the optical contact assembly. The adsorption condition is formed over the entire optical contact surface with lower pressure to fabricate an optical contact assembly if the optical contact surface is larger. On the other hand, it requires higher pressure to form the adsorption condition over a smaller optical contact surface area.

(2) Foreign objects, which are approximately several microns in size, between surfaces of the optical members in optical contact make it difficult to form the adsorption condition. Accordingly, the surfaces of the optical members in optical contact have to be sufficiently washed and cleaned.

The aforementioned issues are likely to be more apparent if the optical contact assembly is formed from fragmented optical members, which have optical contact surfaces of an area of 2 mm×2 mm or less.

In order to resolve the aforementioned problems, the present inventors conducted research on a simple method for fabricating an optical element with a small optical contact surface area after creating optical contact between optical members to form a large optical contact surface area. The present inventors manufactured the optical elements described in the context of the aforementioned seventh to eleventh embodiments by means of the following processes. The processes used by the present inventors are described hereinafter.

(1) A groove structure (width: W1) was formed by means of a processing technique such as dicing or dry etching to a large principal plane of the optical member to be in optical contact. Dicing or dry etching was performed so that at least a part of the groove structure reaches the periphery of the principal plane of the optical member.

(2) Hydrophilic treatment was performed to the grooved principal plane of the optical member. Subsequently, the grooved principal plane of the optical member became in optical contact with the other optical member (an adsorbed condition was created between the optical members) to form the optical contact surface.

(3) The sealing member was filled in the gap (air gap) formed between the optical members with the aforementioned groove structure. The sealing member was subsequently hardened.

(4) A tool such as a dicing blade having a blade width W2, which was smaller than the aforementioned groove width W1, was used to cut the sealing member to form the fragmented optical element. It should be noted that a part of the sealing member kept covering the periphery of the optical contact surface.

The problems on manufacturing an optical contact assembly comprising a fragmented optical member may be preferably overcome by means of the aforementioned manufacture process of the optical element and the structure of the optical element described in the context of the seventh and eleventh embodiments (i.e. structure of a concavity or a notch adjacent to the periphery of the optical contact surface and a sealing member covering the periphery of the optical contact surface in the concavity or notch).

FIGS. 45A to 45E schematically show the process for fabricating the optical element. Optical contact between Nd:YVO$_4$ crystal (laser crystal) and MgO:LN crystal (non-linear optical crystal) is created by means of a series of processes shown in FIGS. 45A to 45E to form the optical element.

FIG. 45A schematically shows a process for forming grooves in the first optical member. FIG. 45B schematically shows a process for creating an optical contact condition between the grooved first optical member (first optical member subjected to the process of FIG. 45A) and the second optical member (to be laminated). FIG. 45C schematically shows a process for filling and hardening the sealing member in the grooved portions (air gap) of the optical contact assembly under an adsorbed condition. FIG. 45D schematically shows a dicing process for cutting the optical element along the grooved portions to which the sealing member is filled. FIG. 45E is a perspective view of a fragmented optical element.

FIG. 45A shows laser crystal 910 (Nd:YVO$_4$ crystal) used as the first optical member 810, and a groove structure 921 formed on a surface of the laser crystal 910. It should be noted that the surface of the laser crystal 910 formed with the groove structure 921 is used for forming the optical contact surface 840 as the first principal plane 812. The surface of the laser crystal 910 opposite to the first principal plane 812 is used as the incident end surface 813.

FIG. 45B shows MgO:LN crystal 920 used as the second optical member 820 in addition to the laser crystal 910 formed with the groove structure 921. In FIG. 45B, the surface of MgO:LN crystal 920 facing the first principal plane 812 of the laser crystal 910 is used as the second principal plane 822. The surface of the MgO:LN crystal 920 opposite to the second principal plane 822 is used as the emitting end surface 823. Optical contact between the first and second principal planes 812, 822 is created to form the optical contact surface 840 shown in FIG. 45E.

FIG. 45C shows the sealing member 830 filled and hardened in the air gap formed by the groove structure 921 and the second principal plane 822 of the MgO:LN crystal 920, in addition to the laser crystal 910 formed with the groove structure 921 and MgO:LN crystal 920. Detailed manufacturing processes as well as its characteristics are described hereinafter.

As shown in FIG. 45A, an a-axis cut laser crystal 910, which is 2 mm in thickness and 12 mm×12 mm in area, is prepared. The principal planes (top and bottom surfaces) of the laser crystal 910 are subjected to mirror polishing. One surface of the principal planes (top or bottom surface) of the laser crystal 910 is used as the first principal plane 812 to be in optical contact. The other surface is used as the incident end surface 813. A groove structure 921 is formed by means of dicing on the first principal plane 812 of the laser crystal 910, which is used as the first principal plane 812. For example, dicing with a dicing blade width of approximately 300 microns may be used for forming the groove structure 921. The groove pitch in the groove structure 921 may be set, for example, to 1.2 mm. The groove width may be approximately 400 to 700 microns. The groove depth may be approximately 30 microns. By the formation of such a groove structure 921, the optical contact surface 840 of the fragmented optical element 800 shown in FIG. 45E becomes a rectangle of approximately 500 microns×500 microns to approximately 800 microns×800 microns. The outer cross sectional dimension of the optical element 800 shown in FIG. 45E becomes approximately 1 mm×1 mm.

Sufficient organic cleaning is performed to the laser crystal 910 formed with the groove structure 921 to remove resin adhesive used in the process for the groove structure 921 and other contaminations. Subsequently, hydrophilic treatment is performed to the substrates of the laser crystal 910 and MgO:LN crystal 920 (0.5 mm in thickness, 12 mm×12 mm in area, X-cut plate). Hydrophilic treatment is the same as the treatment described in the context of the seventh embodiment.

As shown in FIG. 45B, the optical contact condition is created between the first principal plane 812 of the laser crystal 910 formed with the groove structure 921 and the principal plane (i.e. the second principal plane 822 to be optical contact) of MgO:LN crystal 920. While the first principal plane 812 of the laser crystal 910 and the second principal plane 822 of the MgO:LN crystal 920 are superposed, the substrates of the laser crystal 910 and MgO:LN crystal 920 are directionally adjusted so that the crystal axis (c-axis) of the laser crystal 910 and the crystal axis of MgO:LN crystal 920 become parallel.

The groove structure 921 formed with the laser crystal 910 grids the optical contact surface 840 into very small areas which are from approximately 500 μm×500 μm to approximately 800×800 μm, respectively. However the overall area of the superposed substrates (laser crystal 910 and MgO:LN crystal 920) is 12 mm×12 mm, which is wide enough to easily create the adsorption (state of optical contact) between the first and second principal planes 812, 822. By means of the aforementioned superposition process, the present inventors confirmed that it was not only dependent on the area of the individually gridded optical contact surfaces but also the overall area of the optical members (laser crystal 910 and MgO:LN crystal 920) used for forming the optical contact assembly whether the adsorption condition is easily created. The present inventors first figured out the fact that a larger entire area of the optical members (laser crystal 910 and MgO:LN crystal 920) made it easier to create the adsorption condition.

Figure 46:
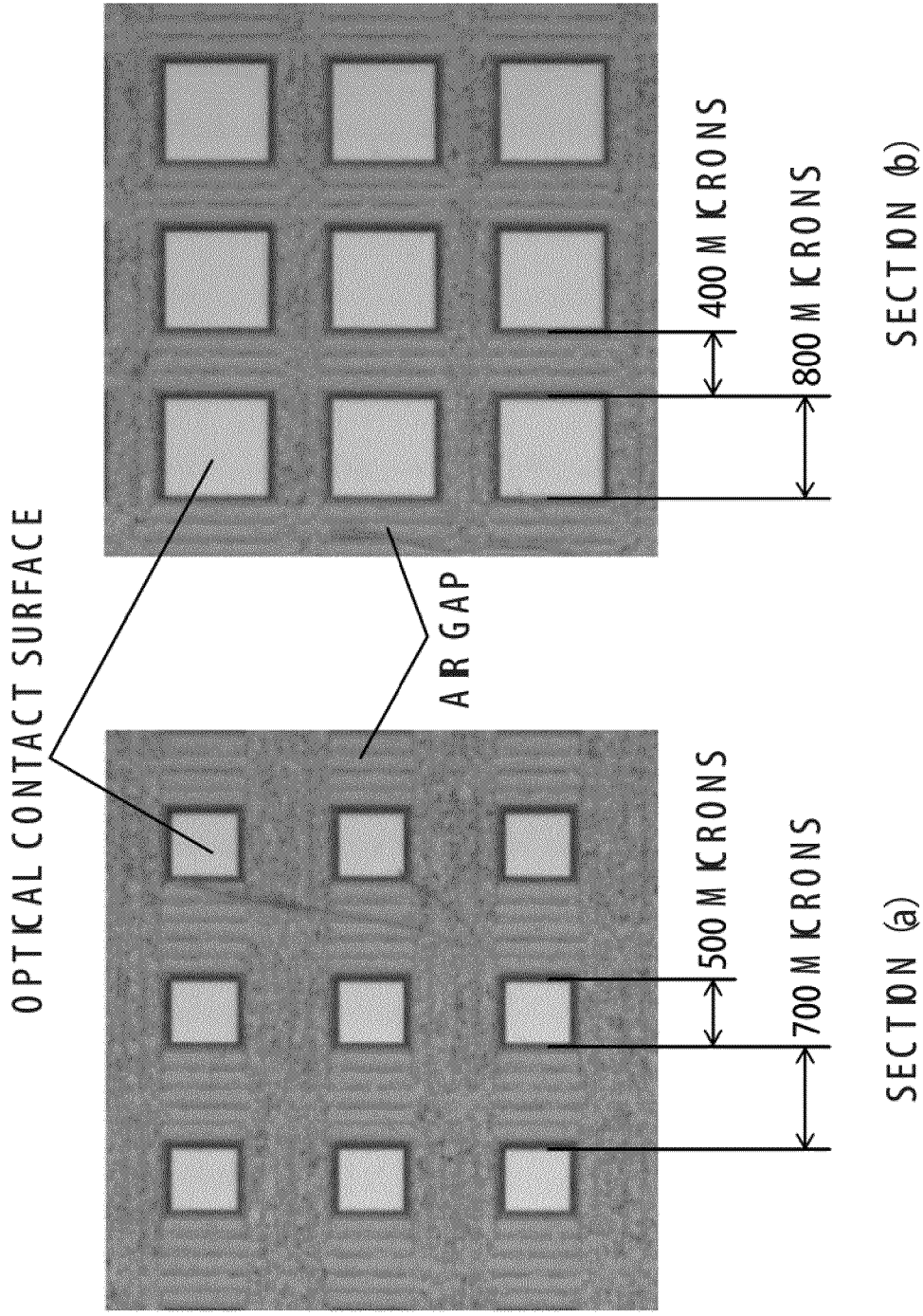
FIG. 46 is a microscopic image of an optical contact assembly.

FIG. 46 is a stereoscopic microscope image of the optical contact assembly obtained as a result of the aforementioned processes. The image of FIG. 46 is a photograph of the optical contact surface 840 from the surface side of MgO:LN crystal 920, which is used as the emitting end surface 823. The optical contact surface 840 shown in section (a) of FIG. 46 has a dimension of 500 μm×500 μm. The optical contact surface 840 shown in section (b) of FIG. 46 has a dimension of 800 μm×800 μm.

In FIG. 46, the bright rectangular portion represents the optical contact surface 840 between the laser crystal 910 and MgO:LN crystal 920. In FIG. 46, the dark grid portion represents the air gap formed by the groove structure 921 and MgO:LN crystal 920.

A rainbow interference pattern on the optical contact surface 840 means inferior formation of the adsorption condition on the optical contact surface 840. The interference pattern, however, is not observed on the optical contact surface 840 in FIG. 46. Accordingly, this means that the optical contact surface 840 with a preferable adsorption condition is formed by means of the aforementioned processes.

After the formation of the preferable adsorption condition in the optical contact surface 840, ultraviolet curable resin was filled and cured as the sealing member 830 in the air gap formed by the groove structure 921 and MgO:LN crystal 920. In this embodiment, various types of ultraviolet curable resins may be used. The present inventors used OG146 (40 cp) of low viscosity manufactured by Epoxy Technology, Inc., and U1541K (60000 cp) of relatively high viscosity manufactured by Chemitech Inc.

Differences in viscosity cause differences in filling rate. However both resin materials were appropriately filled in the air gap formed by the groove structure 921 and MgO:LN crystal 920. Both resin materials cured with the irradiation of ultraviolet rays of up to approximately 2000 mJ/cm$^2$. The present inventors did not observe that both resin materials caused any inferior filling due to contraction of the resin during its curing.

After the resin is filled and cured, the optical contact assembly is fragmented by means of the dicing process shown in FIG. 45D. The blade width of the dicing used for the fragmenting process is thinner than the width (400 to 700 μm) of the groove structure 921 into which the sealing member 830 is filled. The present inventors used a dicing blade, which was 150 microns in width, to fragment the optical contact assembly.

The optical contact assembly is fragmented to form the optical element 800 shown in FIG. 45E. The sealing member 830 filled in the air gap covers the periphery of the optical contact surface 840 even after the fragmentation. Since the cutting width including the blade width during the dicing process is approximately 180 microns, the sealing member 830 remains in the width region from the periphery of the optical contact surface 840 to the dicing portion (width of approximately 100 to 500 microns in response to a width defined by the groove structure 921).

Figure 47:
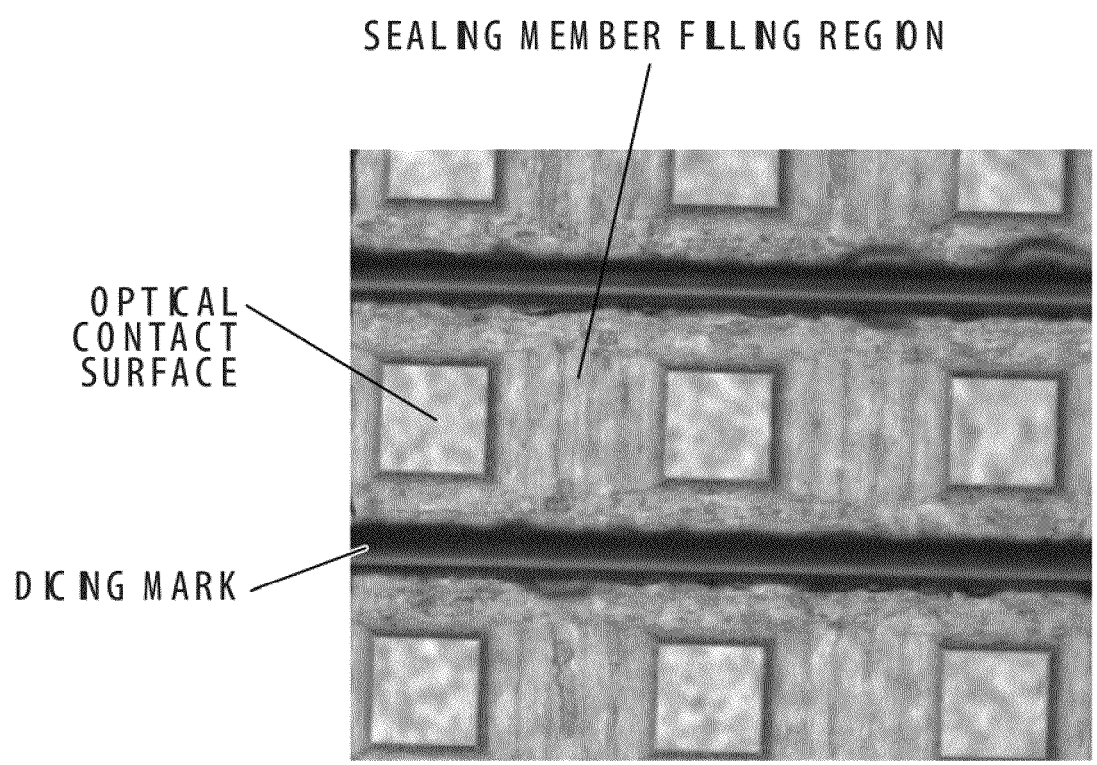
FIG. 47 is a photograph taken by a microscope, which shows an observational image of the fragmented optical contact assembly by a dicing process.

FIG. 47 is a photograph taken by a stereoscopic microscope showing an observational image of the optical contact assembly fragmented by means of the dicing process.

According to the observational image shown in FIG. 47, there were no observable separation of the optical contact surface 840 caused by infiltration of water into the optical contact surface 840 and the region, where the sealing member 830 was filled, or due to mechanical stress applied from the dicing blade to the optical contact assembly during the dicing process. Accordingly, it may be understood from the observational image of FIG. 47 that the preferable fragmented optical element 800 having an incident surface of approximately 1 mm×1 mm and length of 2.5 mm was eventually formed.

As described above, the processes according to this embodiment may appropriately resolve the problems in forming a fragmented optical contact assembly (i.e. problems concerning how to easily create the absorption condition in the optical contact). It is likely that the filled ultraviolet curable resin (sealing member 830) prevents water and gas from infiltrating and gas into the optical contact surface 840. In addition, since the filled ultraviolet curable resin (sealing member 830) increases the bonding strength of the optical contact assembly, the resistivity of the optical contact assembly against the mechanical stress during the dicing process also increases, which is practically advantageous in the formation process of the fragmented optical contact assembly.

The processes of this embodiment may be exclusively applied to the optical element structure shown in the seventh and/or eleventh embodiments. The optical element structure shown in seventh and/or eleventh embodiments may be easily and efficiently manufactured by means of the processes of this embodiment.

In this embodiment, a groove structure 921 is only formed on the laser crystal 910 to form the optical element 800. Alternatively, the groove structure may only be formed on MgO:LN crystal. Or the groove structure may be formed on both optical members configuring the optical element 800. Similar effects to those described may be obtained in all cases.

In this embodiment, the ultraviolet curable resin is used as the sealing member 830. Alternatively, thermosetting resin may be used as the sealing member. Similar effects are obtained even with the thermosetting resin. It should be noted that resin, which has to be filled with a heating process, such as hot-melt wax, is unsuitable for the processes of this embodiment. If resin which has to be filled with a heating process is used as the sealing member, it is likely that the optical members warps because of a difference in thermal expansion between the optical members in optical contact, which worsens the adsorption condition.

Sodium silicate ($Na_2SiO_3$) or silicic acid obtained by gelling sodium silicate described in the context of the seventh embodiment may be used as the sealing member. The highly concentrated sodium silicate aqueous solution is dissolved in water to achieve appropriate viscosity. Subsequently, the sodium silicate aqueous solution is filled from openings of the air gap, which appear on the peripheral surface of the optical contact assembly, like the aforementioned ultraviolet curable resin. Thereafter, a suitable tool such as a pipette is used to add an appropriate amount of diluted hydrochloric acid around the aforementioned opening. Consequently, the sodium silicate is hardened (gelled) at the filled portion (air gap) and becomes silicic acid. The optical members are firmly bonded and fixed by the aforementioned gelling, which improves resistances to treatment and thermal variability. Since the generated silicic acid becomes harder amorphous, of which characteristics are similar to glass, than the resin-based sealing member, for example, it becomes less likely that the dicing blade clogs during the dicing process. Accordingly, the sealing member may be cut by the blade, which is used for cutting the optical member.

Fourteenth Embodiment

In this embodiment, an image display device with the optical element or the wavelength conversion laser light source described in the context of the aforementioned first to thirteenth embodiments is described.

Figure 48:
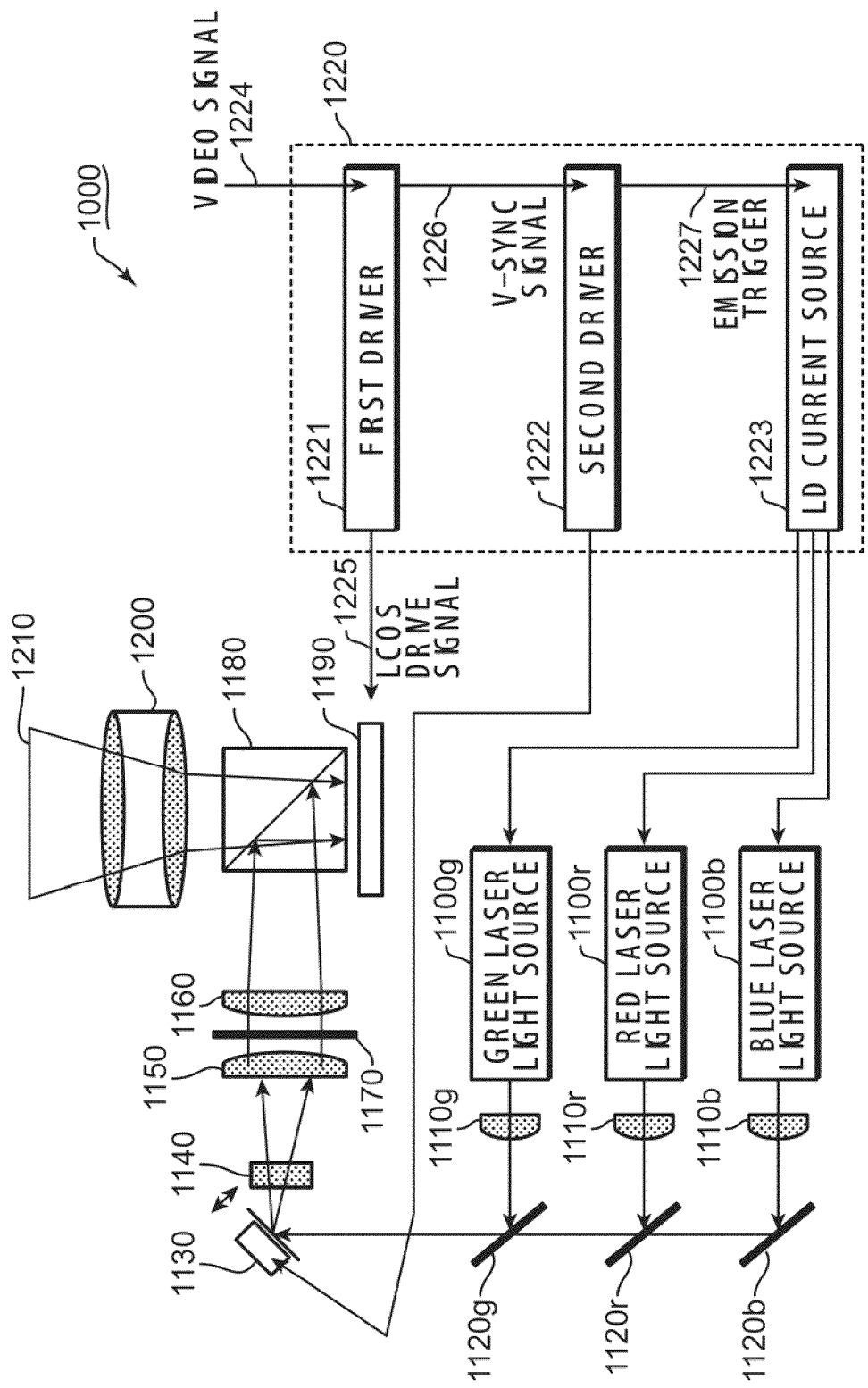
FIG. 48 is a diagram showing a laser projector which uses laser as a light source.

FIG. 48 is a diagram showing the laser projector (laser projector with a ferroelectric LCOS used as the two-dimensional modulator) which uses a laser as a light source. In this embodiment, the laser projector is exemplified as the image display device.

A laser projector 1000 comprises a blue laser light source 1100*b*, a red laser light source 1100*r* and a green laser light source 1100*g*. The laser projector 1000 further comprises collimator lenses 1110*b*, 1110*r* and 1110*g* corresponding to the blue, red and green laser light sources 1100*b*, 1100*r*, 1100*g*, respectively. The laser beams emitted from the blue, red and green laser light source 1100*b*, 1100*r*, 1100*g* are collimated into parallel light with the collimator lenses 1110*b*, 1110*r* and 1110*g*, respectively. In this embodiment, the blue, red and/or laser light sources 1100*b*, 1100*r*, 1100*g* may be laser light sources comprising the optical elements and/or the wavelength conversion laser light sources shown in the aforementioned embodiments.

The laser projector 1000 further comprises mirrors 1120*b*, 1120*r* and 1120*g* configured to reflect the laser beams collimated by the collimator lenses 1110*b*, 1110*r* and 1110*g*. The mirrors 1120*b*, 1120*r* and 1120*g* are dielectric multi-layered mirrors with reflection characteristics in a blue region (wavelength of 400 to 460 nm), a red region (wavelength of 600 nm or more) and a green region (wavelength of 520 to 560 nm), respectively. The collimator lenses 1110*b*, 1110*r* and 1110*g* and the mirrors 1120*b*, 1120*r* and 1120*g* are adjusted so that the beam paths from the blue, red and green laser light sources 1100*b*, 1100*r*, 1100*g* become coaxial immediately after the mirror 1120*g*.

The laser projector 1000 further comprises a scan mirror 1130 configured to scan the beam. In FIG. 48, the scan mirror 1130 deflects rightward and scans the laser beam from the mirrors 1120*b*, 1120*r* and 1120*g*.

The laser projector 1000 further comprises a lens 1140 configured to shape the beam into a linear emission line. A cylindrical lens may be used as the lens 1140.

The laser projector 1000 further comprises lenses 1150, 1160 and a diffuser plate 1170 situated between the lenses 1150, 1160. The lenses 1150, 1160 are a pair of relay lens/field lens. The diffuser plate 1170 further changes the beam, which is shaped into the emission line by the lens 1140 (cylindrical lens), into a band shape.

The laser projector 1000 further comprises a prism 1180 used as the polarization beam splitter, and a ferroelectric liquid crystal display device (LCOS 1190). The ON/OFF control of the LCOS 1190 is performed by means of rotation of a light polarizing direction. Accordingly, the prism 1180 functions as a polarization beam splitter.

The beam is multiplexed in front of the scan mirror 1130. Subsequently, the scan mirror 1130 moves the beam optical path, and then the beam with S polarization enters the prism 1180. The reflective film in the prism 1180 is configured to reflect light with S polarization. Accordingly, light with S polarization illuminates the LCOS 1190.

The laser projector 1000 further comprises a projection lens 1200, and a screen 1210. The light reflected by the LCOS 1190 is projected on the screen 1210 through the projection lens 1200.

The laser projector 1000 comprises a controller 1220. The controller 1220 comprises a first drive circuit 1221 configured to drive the LCOS 1190, a second drive circuit 1222 configured to drive the laser light sources (blue, red and green laser light sources 1100*b*, 1100*r*, 1100*g*) and the scan mirror 1130, and a laser current source 1223. In this embodiment, the second drive circuit 1222 is exemplified as the laser driver.

A video signal 1224 is input to the first drive circuit 1221. The first drive circuit 1221 thereafter generates an LCOS drive signal 1225 for driving the LCOS 1190. A V-SYNC signal 1226 generated as one of the LCOS drive signals 1225 is output as a trigger signal to the second drive circuit 1222.

The second drive circuit 1222 thereafter generates and outputs an emission trigger 1227 based on the V-SYNC signal 1226. The emission trigger 1227 represents a drive waveform of the scan mirror 1130 and emission timings of the laser light sources (blue, red and green laser light sources 1100*b*, 1100*r*, 1100*g*). The emission trigger 1227 is input to the laser current source 1223. The laser current source 1223 supplies current to the laser light sources (blue, red and green laser light sources 1100*b*, 1100*r* and 1100*g*) based on the emission trigger 1227.

An image is thereby displayed on the screen 1210 by means of the aforementioned series of operations and controls.

Fifteenth Embodiment

In this embodiment, an image display device using the optical element or the wavelength conversion laser light source described in the context of the aforementioned first to thirteenth embodiments is described.

Figure 49:
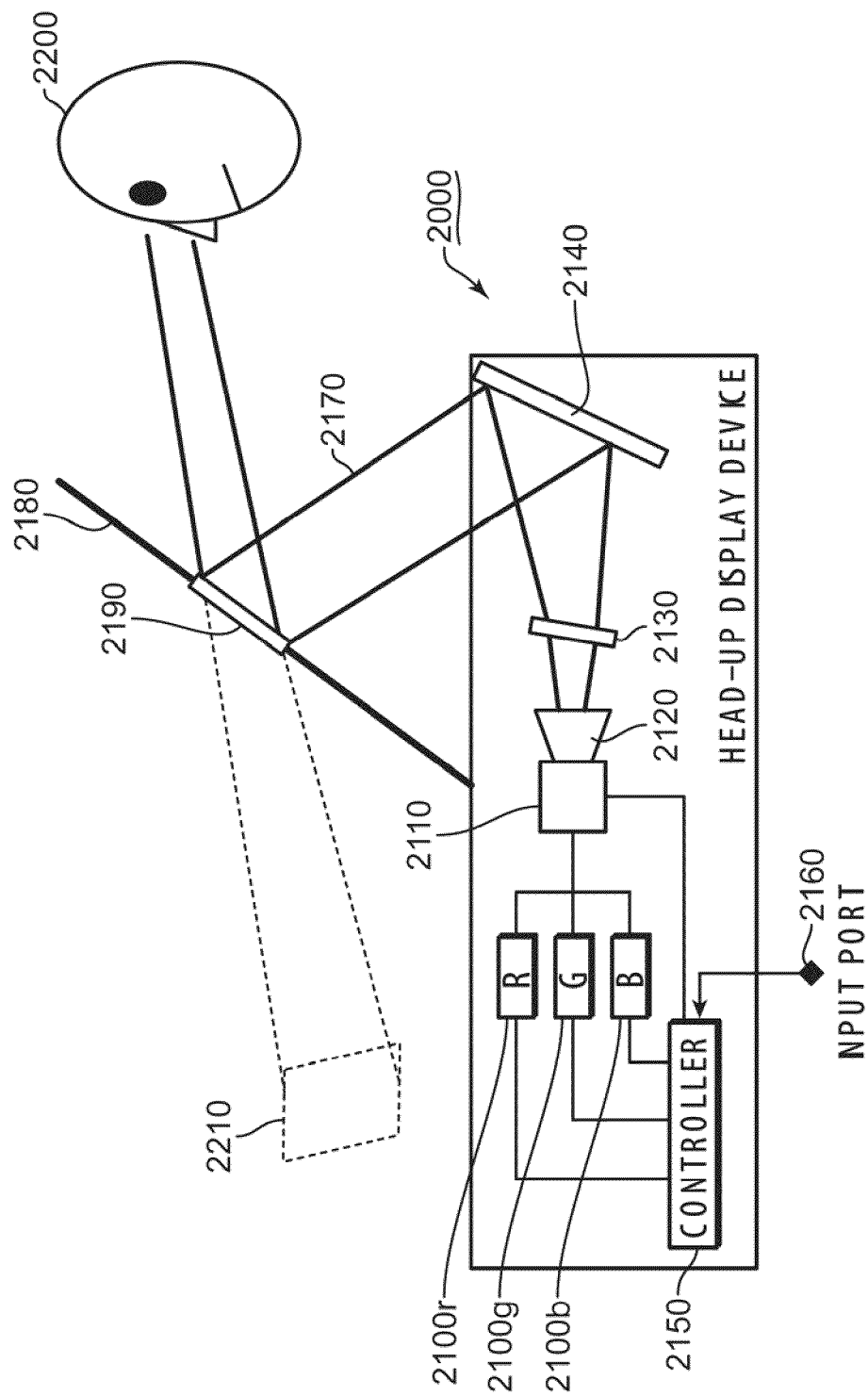
FIG. 49 is a schematic view of a head-up display device using laser beams.

FIG. 49 is a schematic view of a head-up display device using the laser beam. In this embodiment, the head-up display device is exemplified as the image display device.

A head-up display device 2000 comprises a blue laser light source 2100*b*, a red laser light source 2100*r* and a green laser light source 2100*g*. The head-up display device 2000 further comprises a two-dimensional modulator 2110 such as a compact liquid crystal panel or a digital mirror device (DMD), a projection lens 2120, an intermediate screen 2130, a folding mirror 2140, and a controller 2150 configured to control these elements.

The laser beams emitted from the blue, red and green laser light sources 2100*b*, 2100*r*, 2100*g* are multiplexed and formed by means of an optical system (not shown), and thereafter illuminates the two-dimensional modulator 2110. The light modulated by the two-dimensional modulator 2110 is projected on the intermediate screen 2130 via the projection lens 2120 to display an image on the intermediate screen 2130.

The head-up display device 2000 further comprises an input port 2160 to which the image data is input. Data of the image, which is displayed by the head-up display device 2000, is input as electric signals from the input port 2160. The controller 2150 converts the signals of the image data into drive signals of the two-dimensional modulator 2110. The controller 2150 generates timing signals for defining timings of lighting the blue, red and green laser light sources 2100*b*, 2100*r*, 2100*g* based on the signals of the image data.

With generating the timing signals, the controller 2150 supplies necessary current to the blue, red and green laser light sources 2100*b*, 2100*r*, 2100*g* to drive them.

As described above, the display light 2170 representing the image displayed on the intermediate screen 2130 is reflected by the folding mirror 2140 toward the reflective mirror 2190 mounted on the front windshield 2180 of a vehicle. The reflective mirror 2190 further reflects the display light 2170 toward the driver 2200.

The driver 2200 may view the virtual image 2210 (region represented by a dotted line in FIG. 49) of the image displayed with the display light 2170 on the front windshield 2180.

The head-up display device 2000 may provide an image to the driver 2200 by means of the aforementioned series of operations and controls.

In the image display device described in the context of the fourteenth and fifteenth embodiments, for example, the methodologies of the optical element and/or the wavelength conversion laser light source comprising the optical element described in the context of the aforementioned first to thirteenth embodiments may be applied to the green laser light sources 1100*g*, 2100*g*. Consequently, the light source may achieve stable output under a broad temperature range for a long period of time. The image display device may thereby maintain stable brightness under a broad temperature range.

The aforementioned embodiments mainly comprise the following configurations.

The wavelength conversion laser light source according to one aspect of the aforementioned embodiments comprises a solid-state laser medium configured to generate fundamental light; a wavelength conversion element configured to convert the fundamental light into second harmonic light which has a higher frequency than the fundamental light; and a conductive material in contact with the wavelength conversion element, wherein the wavelength conversion element includes a polarization inverted structure formed with a polarization inversion region, and a first lateral surface which perpendicularly intersects with the polarization inversion region, and the conductive material is in contact with the first lateral surface.

According to the aforementioned configuration, the solid-state laser medium generates fundamental light, which is converted by the wavelength conversion element into the second harmonic light with a higher frequency than the fundamental light. The wavelength conversion element includes the polarization inverted structure formed with the polarization inversion region, and the first lateral surface which perpendicularly intersects with the polarization inversion region. Since the conductive material is in contact with the first lateral surface, output of the wavelength conversion laser light source is maintained for a long period of time.

In the aforementioned configuration, preferably, the polarization inverted structure is exposed on the first lateral surface, and the conductive material is in direct contact with the polarization inverted structure exposed on the first lateral surface.

According to the aforementioned configuration, since the conductive material is in direct contact with the polarization inverted structure exposed on the first lateral surface, output of the wavelength conversion laser light source is maintained for a long period of time.

In the aforementioned configuration, preferably, optical contact between the wavelength conversion element and the solid-state laser medium is created to form the first optical element, the solid-state laser medium includes the second lateral surface which is continuous with the first lateral surface, and the second lateral surface is in contact with the conductive material.

According to the aforementioned configuration, optical contact between the wavelength conversion element and the solid-state laser medium is created to form the first optical element. The solid-state laser medium includes the second lateral surface which is continuous with the first lateral surface. Since the second lateral surface is in contact with the conductive material, the conductive material emits heat from the solid-state laser medium. Accordingly, output of the wavelength conversion laser light source is maintained for a long period of time.

In the aforementioned configuration, preferably, the wavelength conversion laser light source further comprises a second optical element configured to maintain a lateral mode of a laser beam emitted from the solid-state laser medium, wherein the first and second optical elements are in optical contact, the second optical element includes an emitting portion from which the laser beam is emitted, and the emitting portion is formed in a spherical convex lens shape.

According to the aforementioned configuration, the first and second optical elements are in optical contact. The second optical element includes an emitting portion from which the laser beam is emitted. The emitting portion is formed in a spherical convex lens shape, so that the emitting portion maintains the lateral mode of the laser beam emitted from the solid-state laser medium.

In the aforementioned configuration, preferably, the second optical element is bonded to an end surface of the solid-state laser medium.

According to the aforementioned configuration, the second optical element bonded to the end surface of the solid-state laser medium enhances the wavelength conversion efficiency.

In the aforementioned configuration, preferably, the first lateral surface parallel to a polarization direction of the wavelength conversion element includes first and second short-circuiting surfaces which intersect with a crystal axis of the wavelength conversion element, and the first and second short-circuiting surfaces are electrically short-circuited.

According to the aforementioned configuration, the first lateral surface parallel to a polarization direction of the wavelength conversion element includes the first and second short-circuiting surfaces which intersect with a crystal axis of the wavelength conversion element. Since the first and second short-circuiting surfaces are electrically short-circuited, charge generated in the wavelength conversion element may be appropriately cancelled. Accordingly, output of the wavelength conversion laser light source is maintained for a long period of time.

In the aforementioned configuration, preferably, resistivity of the conductive material is no more than $10 \times 10^{-5}$ Ω·m.

According to the aforementioned configuration, since the resistivity of the conductive material is no more than $10 \times 10^{-5}$ Ω·cm, output of the wavelength conversion laser light source is maintained for a long period of time.

In the aforementioned configuration, preferably, the solid-state laser medium includes a bonding surface in optical contact with the wavelength conversion element, and an opposite surface which is opposite to the bonding surface, and an area of the bonding surface is greater than an area of the opposite surface.

According to the aforementioned configuration, the solid-state laser medium includes a bonding surface in optical contact with the wavelength conversion element, and an opposite surface which is opposite to the bonding surface. Since the area of the bonding surface is greater than the area of the opposite surface, the bonding strength between the solid-state laser medium and the wavelength conversion element is increased. In addition, since the thermal radiation in the periphery of the opposite surface is facilitated, output of the wavelength conversion laser light source is maintained for a long period of time.

In the aforementioned configuration, preferably, the wavelength conversion laser light source further comprises a sealing member configured to seal a bonding portion between the solid-state laser medium and the wavelength conversion element, wherein the solid-state laser medium includes a first principal plane which is at least partially subjected to mirror polishing, the wavelength conversion element includes a second principal plane which is at least partially subjected to mirror polishing, the bonding portion includes an optical contact surface in which the first and second principal planes are in optical contact by means of hydrogen bonding, the optical contact surface allows transmission of the laser beam, a concavity or a notch which is adjacent to a periphery of the optical contact surface is formed on at least one of the solid-state laser medium and the wavelength conversion element, and the sealing member disposed in the concavity or the notch covers the periphery of the optical contact surface.

According to the aforementioned configuration, the sealing member seals the bonding portion between the solid-state laser medium and the wavelength conversion element. The solid-state laser medium includes the first principal plane which is at least partially subjected to mirror polishing. The wavelength conversion element includes the second principal plane which is at least partially subjected to mirror polishing. The bonding portion includes the optical contact surface in which the first and second principal planes are in optical contact by means of hydrogen bonding. The optical contact surface allows transmission of the laser beam. The concavity or the notch adjacent to the periphery of the optical contact surface is formed on at least one of the solid-state laser medium and the wavelength conversion element. Since the concavity or the notch does not unnecessarily increase the area of the optical contact surface, the optical contact between the first and second principal planes may be relatively easily created. Since the sealing member disposed in the concavity or the notch covers the periphery of the optical contact surface, it becomes less likely that the optical contact surface contacts with the ambient air. Accordingly, bonding strength of the first and second principal planes is appropriately maintained for a long period of time.

The optical element according to another aspect of the aforementioned embodiments comprises a solid-state laser medium configured to generate fundamental light; and a wavelength conversion element configured to convert the fundamental light into second harmonic light which has a higher frequency than the fundamental light, wherein the solid-state laser medium includes a bonding surface in optical contact with the wavelength conversion element, and an opposite surface which is opposite to the bonding surface, and an area S1 of the bonding surface is greater than an area S2 of the opposite surface.

According to the aforementioned configuration, the solid-state laser medium generates fundamental light. The wavelength conversion element converts the fundamental light into second harmonic light which has a higher frequency than the fundamental light. The solid-state laser medium includes a bonding surface in optical contact with the wavelength conversion element, and an opposite surface which is opposite to the bonding surface. Since the area S1 of the bonding surface is greater than the area S2 of the opposite surface, bonding strength between the solid-state laser medium and the wavelength conversion element is increased. In addition, since thermal radiation in the periphery of the opposite surface is facilitated, output from the optical element is maintained for a long period of time.

In the aforementioned configuration, preferably, a relationship between the area S1 of the bonding surface and the area S2 of the opposite surface is represented by an inequality of $0.75 \times S1 > S2$.

According to the aforementioned configuration, since the relationship between the area S1 of the bonding surface and the area S2 of the opposite surface is represented by the inequality of $0.75 \times S1 > S2$, thermal radiation in the periphery of the opposite surface is appropriately facilitated.

In the aforementioned configuration, preferably, the optical element further comprises a sealing member configured to cover a periphery of the bonding surface, wherein the sealing member prevents moisture from permeating into the bonding surface.

According to the aforementioned configuration, since the sealing member which covers the periphery of the bonding surface prevents the bonding surface from coming in contact with ambient air, bonding between the solid-state laser medium and the wavelength conversion element is appropriately maintained.

In the aforementioned configuration, preferably, the solid-state laser medium and the wavelength conversion element include a perpendicular plane to the bonding surface, a protrusion along the periphery of the bonding surface is formed on the perpendicular plane, and the protrusion is parallel to a c-axis direction of the solid-state laser medium.

According to the aforementioned configuration, the solid-state laser medium and the wavelength conversion element include the perpendicular plane to the bonding surface. The protrusion along the periphery of the bonding surface is formed on the perpendicular plane. Since the protrusion is parallel to a c-axis direction of the solid-state laser medium, a user may ascertain the c-axis direction of the solid-state laser medium based on the protrusion.

The wavelength conversion laser light source according to yet another aspect of the aforementioned embodiments comprises an excitation light source configured to emit light; the aforementioned optical element; and a condensing optical element configured to condense the light to the optical element, wherein a protrusion extending in a polarizing direction of the light is formed on the optical element.

According to the aforementioned configuration, the condensing optical element condenses light from the excitation light source to the aforementioned optical element. Since the protrusion extending in the polarizing direction of the light is formed on the optical element, a user may ascertain the polarizing direction of light based on the protrusion.

The wavelength conversion laser light source according to yet another aspect of the aforementioned embodiments comprises an excitation light source configured to emit light; the aforementioned optical element; and a condensing optical element configured to condense the light to the optical element, wherein the optical element includes an emitting portion configured to emit a laser beam, and concentration of laser active substances added to the solid-state laser medium decreases from the excitation light source toward the emitting portion.

According to the aforementioned configuration, the condensing optical element condenses light from the excitation light source to the aforementioned optical element. The optical element includes the emitting portion configured to emit a laser beam. Since the concentration of the laser active substances added to the solid-state laser medium decreases from the excitation light source toward the emitting portion, the solid-state laser medium may stably absorb light from the excitation light source even if there is wavelength variation of the light from the excitation light source.

In the aforementioned configuration, preferably, the wave length conversion laser light source has an output of 500 mW or more and a maximum operating temperature of 40° C. or higher.

According to the aforementioned configuration, a relatively high output is achieved under a relatively broad operating temperature range.

The optical element according to yet another aspect of the aforementioned embodiments comprises a first optical member including a first principal plane which is at least partially subjected to mirror polishing; a second optical member including a second principal plane which is in optical contact with the first principal plane by means of hydrogen bonding to form an optical contact surface, which allows transmission of a laser beam; and a sealing member configured to seal the optical contact surface, wherein the second principal plane is at least partially subjected to mirror polishing, a concavity or a notch which is adjacent to a periphery of the optical contact surface is formed on at least one of the first optical member and the second optical member which is formed from a different material from the first optical member, and the sealing member disposed in the concavity or the notch covers the periphery of the optical contact surface.

According to the aforementioned configuration, the solid-state laser medium includes the first principal plane which is at least partially subjected to mirror polishing. The wavelength conversion element includes the second principal plane which is at least partially subjected to mirror polishing. The bonding portion includes the optical contact surface in which the first and second principal planes are in optical contact by means of hydrogen bonding. The optical contact surface allows the transmission of a laser beam. The concavity or the notch adjacent to the periphery of the optical contact surface is formed on at least one of the solid-state laser medium and the wavelength conversion element. Since the concavity or the notch does not unnecessarily increase the area of the optical contact surface, the optical contact between the first and second principal planes may be relatively easily created. Since the sealing member disposed in the concavity or the notch covers the periphery of the optical contact surface, it becomes less likely that the optical contact surface contacts with the ambient air. Accordingly, bonding strength between the first and second principal planes is appropriately kept for a long period of time.

In the aforementioned configuration, preferably, the first optical member and the second optical member bonded with the first optical member form at least one flat plane, and the concavity or the notch is formed in a region from the periphery of the optical contact surface to the flat plane.

According to the aforementioned configuration, since the first optical member and the second optical member bonded with the first optical member form at least one flat plane, the optical element may be mounted relatively easily. In addition, since the concavity or the notch is formed in the region from the periphery of the optical contact surface to the flat plane, it becomes likely that the sealing member appropriately prevents the optical contact surface from contacting with the ambient air. Accordingly, bonding strength of the first and second principal planes is appropriately maintained for a long period of time.

In the aforementioned configuration, preferably, the sealing member adjacent to the periphery of the optical contact surface prevents the optical contact surface from coming in contact with ambient air.

According to the aforementioned configuration, the sealing member adjacent to the periphery of the optical contact surface may prevent the optical contact surface from coming in contact with ambient air.

In the aforementioned configuration, preferably, the concavity or the notch has a depth dimension for separating the first optical member from the second optical member by a dimension of 1 micron or more and 500 microns or less.

According to the aforementioned configuration, the sealing member may prevent the optical contact surface from coming in contact with the ambient air and moisture.

The wavelength conversion laser light source according to yet another aspect of the aforementioned embodiments comprises an excitation light source configured to emit light; and the aforementioned optical element, wherein the optical contact surface of the optical element functions as an optical window configured to control a laser oscillation lateral mode of the light which propagates through the optical element.

According to the aforementioned configuration, the wavelength conversion laser light source comprises an excitation light source configured to emit light, and the aforementioned optical element. The optical contact surface of the optical element functions as an optical window configured to control a laser oscillation lateral mode of the light which propagates through the optical element. Accordingly, the laser oscillation lateral mode may be controlled by means of a relatively simple wavelength laser light source.

The wavelength conversion laser light source according to yet another aspect of the aforementioned embodiments comprises an excitation light source configured to emit light; and the aforementioned optical element, wherein at least one of the first and second optical members is tapered along a propagation direction of the light, and a perpendicular cross section of the optical member to the propagation direction functions as an optical window configured to control a laser oscillation lateral mode of the light which propagates through the optical element.

According to the aforementioned configuration, the wavelength conversion laser light source comprises the excitation light source configured to emit light, and the aforementioned optical element. At least one of the first and second optical members is tapered along a propagation direction of the light. The perpendicular cross section of the optical member to the propagation direction functions as an optical window configured to control a laser oscillation lateral mode of the light which propagates through the optical element. Accordingly, the laser oscillation lateral mode may be controlled by means of a relatively simple wavelength laser light source.

The image display device according to yet another aspect of the aforementioned embodiments comprises a laser light source configured to emit light; a laser driver configured to supply current to the laser light source; a modulator configured to modulate the light to form an image; a reflective mirror configured to reflect the light emitted from the modulator; and a controller configured to drive the modulator, wherein the laser light source includes the aforementioned wavelength conversion laser light source.

According to the aforementioned configuration, the laser light source emits light if current is supplied by the laser driver. The image modulator modulates the light from the laser light source. The reflective mirror reflects the light output from the modulator. The controller drives the image modulator to control an image, which is displayed on the image display device. Since the laser light source includes the aforementioned wavelength conversion laser light source, a high output is achieved for a long period of time.

In the aforementioned configuration, preferably, the wavelength conversion element is formed from a material selected from a group consisting of MgO-doped lithium niobate, MgO-doped lithium tantalate, MgO-doped lithium niobate of a fixed ratio composition, and doped lithium tantalate and potassium titanyl phosphate of a fixed ratio composition.

According to the aforementioned configuration, a wavelength conversion element with superior wavelength conversion efficiency is formed.

In the aforementioned configuration, preferably, the sealing member is formed from an ultraviolet curable resin material.

According to the aforementioned configuration, the optical contact surface may be simply and appropriately sealed with the sealing member.

In the aforementioned configuration, preferably, the sealing member is formed from a material selected from a group consisting of sodium silicate ($Na_2SiO_3$) or silicic acid ($H_2SiO_3$), which is gelled sodium silicate.

According to the aforementioned configuration, the optical contact surface may be simply and appropriately sealed with the sealing member.

In the aforementioned configuration, preferably, the sealing member is formed from a dielectric thin film.

According to the aforementioned configuration, the optical contact surface may be simply and appropriately sealed with the sealing member.

In the aforementioned configuration, preferably, the first optical member is a laser crystal selected from a group consisting of $YVO_4$, Nd (neodymium)-doped $YVO_4$, $GdVO_4$, and Nd-doped $GdVO_4$, and the second optical member is a dielectric crystal having one of the electro-optic effect, the nonlinear optical effect and the acousto-optical effect.

In the aforementioned configuration, the electro-optic effect, the nonlinear optical effect or the acousto-optical effect is obtained.

INDUSTRIAL APPLICABILITY

In accordance with the methodologies of the aforementioned embodiments, it becomes less likely that the lateral mode deteriorates green light output in an optical contact-type wavelength-converted light source. Consequently, it is possible to provide a compact laser light source device configured to achieve a high output having a peak output value of 1000 mW or more.

The invention claimed is:

1. A wavelength conversion laser light source, comprising:
a solid-state laser medium configured to generate fundamental light;
a wavelength conversion element configured to convert the fundamental light into second harmonic light which has a higher frequency than the fundamental light;
a conductive material in contact with the wavelength conversion element; and
a sealing member configured to seal a bonding portion between the solid-state laser medium and the wavelength conversion element,
wherein the wavelength conversion element includes a polarization inverted structure formed with a polarization inversion region, and at least one first lateral surface which perpendicularly intersects with the polarization inversion region,
wherein the conductive material is in contact with the at least one first lateral surface,
wherein the solid-state laser medium includes a first principal plane which is at least partially subjected to mirror polishing,
wherein the wavelength conversion element includes a second principal plane which is at least partially subjected to mirror polishing,
wherein the bonding portion includes an optical contact surface in which the first and second principal planes are in optical contact by means of hydrogen bonding,
wherein the optical contact surface allows transmission of the laser beam,
wherein a concavity or a notch which is adjacent to a periphery of the optical contact surface is formed on at least one of the solid-state laser medium and the wavelength conversion element, and
wherein the sealing member disposed in the concavity or the notch covers the periphery of the optical contact surface.

2. A wavelength conversion laser light source, comprising:
an excitation light source configured to emit light;
an optical element including
a solid-state laser medium configured to generate fundamental light,
a wavelength conversion element configured to convert the fundamental light into second harmonic light which has a higher frequency than the fundamental light, and
an emitting portion configured to emit a laser beam; and
a condensing optical element configured to condense the light to the optical element,
wherein the solid-state laser medium includes a bonding surface in optical contact with the wavelength conversion element, and an opposite surface which is opposite to the bonding surface,
wherein an area S1 of the bonding surface is greater than an area S2 of the opposite surface, and
wherein concentration of laser active substances added to the solid-state laser medium decreases from the excitation light source toward the emitting portion.

3. An image display device, comprising:
a laser light source configured to emit light;
a laser driver configured to supply current to the laser light source;
a modulator configured to modulate the light to form an image;
a reflective mirror configured to reflect the light emitted from the modulator; and
a controller configured to drive the modulator,
wherein the laser light source includes the wavelength conversion laser light source according to claim 1.

* * * * *